(12) United States Patent
Heim et al.

(10) Patent No.: US 7,939,818 B2
(45) Date of Patent: May 10, 2011

(54) DIKETOPYRROLOPYRROLE POLYMERS

(75) Inventors: Ingo Heim, Frechen (DE); Bernd Tieke, Brühl (DE); Roman Lenz, Liestal (CH); Beat Schmidhalter, Bubendorf (CH); Aravinda Raman Rabindranath, Köln (DE); Mathias Düggeli, Basel (CH)

(73) Assignee: BASF SE, Ludwigshafen (DE)

( * ) Notice: Subject to any disclaimer, the term of this patent is extended or adjusted under 35 U.S.C. 154(b) by 805 days.

(21) Appl. No.: 10/576,914

(22) PCT Filed: Oct. 18, 2004

(86) PCT No.: PCT/EP2004/052565
§ 371 (c)(1),
(2), (4) Date: Apr. 19, 2007

(87) PCT Pub. No.: WO2005/049695
PCT Pub. Date: Jun. 2, 2005

(65) Prior Publication Data
US 2007/0228359 A1    Oct. 4, 2007

(30) Foreign Application Priority Data
Oct. 28, 2003    (EP) ..................... 03103982

(51) Int. Cl.
*H01L 51/00*    (2006.01)
*C08G 73/00*    (2006.01)

(52) U.S. Cl. ........... 257/40; 257/E51.028; 257/E51.036; 528/367; 428/690

(58) Field of Classification Search ............. 252/62.3 Q; 257/40, E51.026–E51.037; 428/690; 438/99; 528/367
See application file for complete search history.

(56) References Cited

U.S. PATENT DOCUMENTS
6,451,459 B1 *  9/2002  Tieke et al. .................. 428/690

FOREIGN PATENT DOCUMENTS
EP      1 078 970      2/2001

OTHER PUBLICATIONS

Beyerlein, T. and Tieke, B. "New Photoluminescent Conjugated Polymers with 1,4-dioxo-3,6-diphenylpyrrolo[3,4-c]pyrrole (DPP) and 1,4-phenylene units in the Main Chain." Macromol. Rapid Commun., vol. 21 (2000): pp. 182-189.*
Chan, W.-K., et al. "Rational Designs of Multifunctional Polymers." J. Am. Chem. Soc., vol. 115 (1993): pp. 11735-11743.*
Yu, L., et al. "Conjugated Photorefractive Polymer." Appl. Phys. Lett., vol. 64 (1994): pp. 2489-2491.*
Beyerlein, T., et al. "Red Electroluminescence From a 1,4-Diketopyrrolo[3,4-c]pyrrole (DPP)-Based Conjugated Polymer." Synth. Met., vol. 130 (2002): pp. 115-119.*
Chan et al.; Journal of the American Chemical Society, vol. 115, No. 25 (Jun. 1993) pp. 11735-11743.
Luping et al.; American Institute of Physics, vol. 64, No. 19 (May 9, 1994, pp. 2489-2491.
Bao et al; Journal of the American Chemical Society, vol. 117, 50. (Jul. 1995) pp. 12426-12435.
Horn et al., European Polymer Journal, Pergamon Press Ltd. vol. 38, No. 11, (Nov. 2002) pp. 2197-2205.

* cited by examiner

*Primary Examiner* — Matthew W Such
(74) *Attorney, Agent, or Firm* — Shiela A. Loggins; Qi Zhuo

(57) ABSTRACT

The present invention relates to polymers comprising a repeating unit of the formula (I) their use in electronic devices. The polymers according to the invention have excellent solubility in organic solvents and excellent film-forming properties. In addition, high charge carrier mobilities and high temperature stability of the emission color are observed, if the polymers according to the invention are used in polymer light emitting diodes (PLEDs).

17 Claims, No Drawings

DIKETOPYRROLOPYRROLE POLYMERS

The present invention relates to polymers comprising a repeating unit of the formula (I) and their use in electronic devices. The polymers according to the invention have excellent solubility in organic solvents and excellent film-forming properties. In addition, high charge carrier mobilities and high temperature stability of the emission color can be observed, if the polymers according to the invention are used in polymer light emitting diodes (PLEDs).

M. Smet et al., Tetrahedron Lett. 42 (2001) 6527-6530 describe the preparation of rod-like diketopyrrolopyrrole oligomers by a stepwise sequence of Suzuki couplings using brominated 1,4-dioxo-3,6-diphenylpyrrolo[3,4-c]pyrrole (DPP) derivatives and 1,4-dibromo-2,5-di-n-hexylbenzene as the monomers.

M. Horn et. al, Eur. Polymer J. 38 (2002) 2197-2205 describe the synthesis and characterisation of thermomesogenic polysiloxanes with 2,5-dihydropyrrolo[3,4-c]pyrrole units in the main chain.

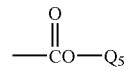

in which $Q_5$ is $C_4$-$C_{18}$alkyl or $C_5$-$C_{10}$cycloalkyl.

Though it is mentioned that compounds Ia can be used for the preparation of photo- and electroconductive polymers, no corresponding examples are given. Further, no teaching is given of how to prepare EL devices comprising DPP-based polymers and of how to select the appropriate DPP-monomers resp. DPP-polymers.

Macromol. Chem. Phys. 200 (1999) 106-112 describes fluorescent DPP-polymers obtainable by the copolymerization of bifunctional monomeric DPP-derivatives, wherein the functional groups are attached to the N-atoms of the DPP-molecule, with diisocyanates or di-ols or di-acids.

J. Am. Chem. Soc. 117 (1995) 12426-12435 relates to the exploration of the palladium catalyzed Stille coupling reaction for the synthesis of functional polymers. In Scheme 7 the synthesis of the following polymer is presented:

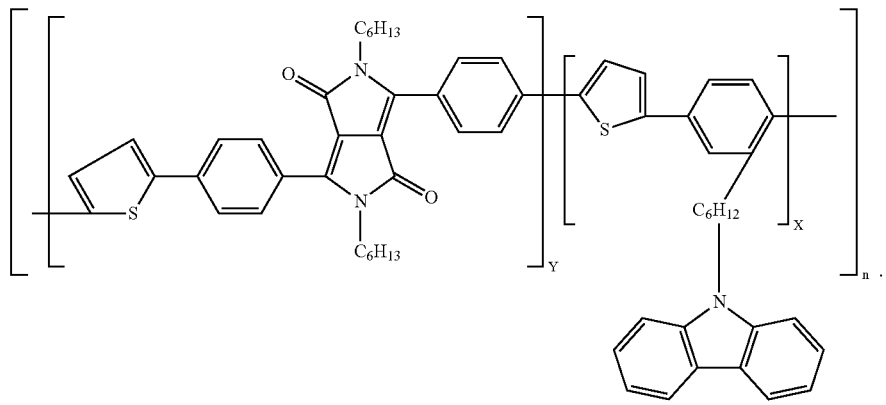

Polymer 13: y = 0,05, x = 0,95

EP-A-787,730 describes a polyacrylate and a polyurethane obtained by the polymerization of a DPP of formula Ia

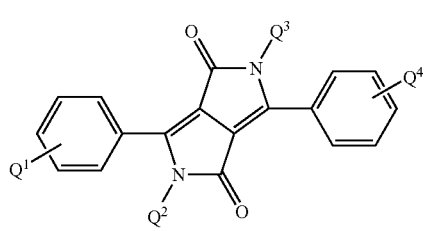

wherein $Q_1$ and $Q_4$ independently of each other stand for a polymerizable reactive group, and $Q_2$ and $Q_3$ independently of each other stand for hydrogen, $C_{12}$-$C_{24}$alkyl, $C_6$-$C_{24}$alkyl which is interrupted one or more times by O or S, or are a group of the formula No teaching is given whether the described polymers can be used in EL devices.

J. Am. Chem. Soc. 115 (1993) 11735-11743 describes DPP-polymers demonstrating photorefractivity, i.e. exhibiting photoconductivity and second order non-linear-optical activity. In this device, photoconductive properties are determined by irradiating the device with a laser beam and then measuring the current resulting from this irradiation, no measurements were carried out with regard to electroluminescence.

Further, no teaching is given of how to select other DPP-polymers.

In Appl. Phys. Lett. 64 (1994) 2489-2491 further studies, i.e. two-beam coupling experiments, using polymers disclosed in J. Am. Chem. Soc. 115 (1993) 11735-11743 are performed to study photorefractivity. The two-beam coupling experiments demonstrated asymmetric energy exchange under zero field, i.e. photorefractivity of the polymers disclosed in J. Am. Chem. Soc. 115 (1993) 11735-11743.

U.S. Pat. No. 6,451,459 (cf. B. Tieke et al., Synth. Met. 130 (2002) 115-119; Macromol. Rapid Commun. 21 (4) (2000) 182-189) describes diketopyrrolopyrrole based polymers and copolymers of formula I, wherein $Ar^1$ and $Ar^2$ are a group of formula and $R^1$ and $R^2$ independently from each other stand for H, $C_1$-$C_{18}$alkyl, —C(O)O—$C_1$-$C_{18}$alkyl, perfluoro-$C_1$-$C_{12}$alkyl, unsubstituted $C_6$-$C_{12}$aryl or one to three times with $C_1$-$C_{12}$alkyl, $C_1$-$C_{12}$alkoxy, or halogen substituted $C_6$-$C_{12}$aryl, $C_1$-$C_{12}$alkyl-$C_6$-$C_{12}$aryl, or $C_6$-$C_{12}$aryl-$C_1$-$C_{12}$alkyl, wherein the co-monomer(s) is selected from the group consisting of

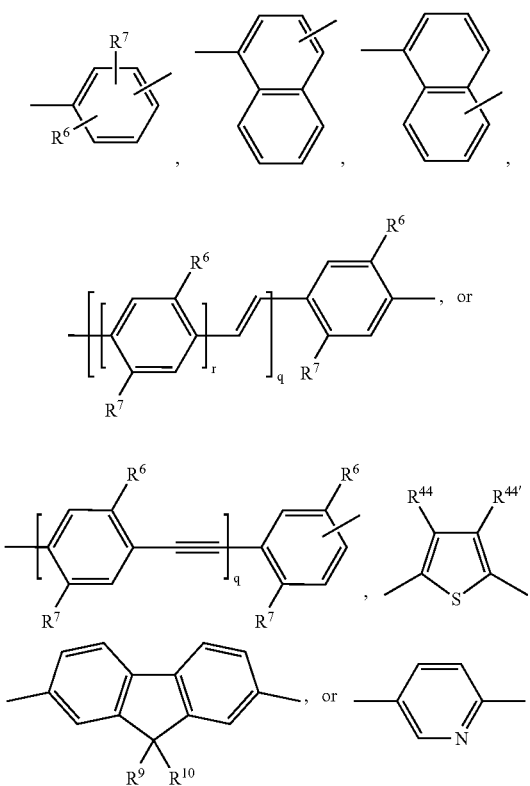

wherein q and r being numbers from 1 to 10, and $R^6$, $R^7$, $R^9$, $R^{10}$ and $R^{44}$ independently from each other stand for H, $C_1$-$C_{18}$alkyl, —C(O)O—$C_1$-$C_{18}$alkyl, perfluoro-$C_1$-$C_{12}$alkyl, unsubstituted $C_6$-$C_{12}$aryl or one to three times with $C_1$-$C_{12}$alkyl, $C_1$-$C_{12}$alkoxy, or halogen substituted $C_6$-$C_{12}$aryl, $C_1$-$C_{12}$alkyl-$C_6$-$C_{12}$aryl, or $C_6$-$C_{12}$aryl-$C_1$-$C_{12}$alkyl, $R^{44'}$ stands for $C_1$-$C_{12}$alkyl, $C_1$-$C_{12}$alkoxy, unsubstituted $C_6$-$C_{12}$aryl or one to three times with $C_1$-$C_{12}$alkyl, $C_1$-$C_{12}$alkoxy, or halogen substituted $C_6$-$C_{12}$aryl, or perfluoro-$C_1$-$C_{12}$alkyl.

The object of the present invention is to provide novel polymeric electroluminescent materials containing diketopyrrolopyrrole moieties, which are suitable, on use in illumination or display devices, for improving the property profile of these devices.

The object has been surprisingly achieved by conjugated polymers comprising a repeating unit of the formula

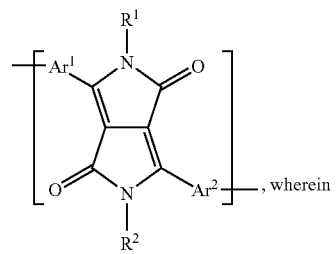, wherein $Ar^1$ and $Ar^2$ are independently of each other a $C_6$-$C_{30}$aryl group or a $C_2$-$C_{26}$heteroaryl group, which can optionally be substituted, $R^1$ and $R^2$ may be the same or different and are selected from a $C_1$-$C_{25}$alkyl group, which can optionally be interrupted by one or more oxygen atoms, an allyl group, which can be substituted one to three times with $C_1$-$C_8$alkyl, or $C_1$-$C_8$alkoxy, a cycloalkyl group, which can be substituted one to three times with $C_1$-$C_4$-alkyl, or a cycloalkyl group, which can be condensed one or two times by phenyl, which can be substituted one to three times with $C_1$-$C_4$-alkyl, halogen, nitro or cyano, an alkenyl group, a cycloalkenyl group, an alkynyl group, a haloalkyl group, a haloalkenyl group, a haloalkynyl group, a ketone or aldehyde group, an ester group, a carbamoyl group, a ketone group, a silyl group, a siloxanyl group, $Ar^3$ or —$CR^3R^4$—$(CH_2)_g$—$Ar^3$, wherein $R^3$ and $R^4$ independently from each other stand for hydrogen, fluorine, cyano or $C_1$-$C_4$alkyl, which can be substituted by fluorine, chlorine or bromine, or phenyl, which can be substituted one to three times with $C_1$-$C_4$alkyl, $Ar^3$ stands for aryl or heteroaryl, in particular phenyl or 1- or 2-naphthyl which can be substituted one to three times with $C_1$-$C_8$alkyl and/or $C_1$-$C_8$alkoxy, and g stands for 0, 1, 2, 3 or 4.

The polymers according to the invention have excellent solubility in organic solvents and excellent film-forming properties. Furthermore, high charge carrier mobilities, low turn-on voltage and high temperature stability of the emission color can be observed, if the polymers according to the invention are used in polymer light emitting diodes (PLEDs).

In one embodiment of the present invention $Ar^1$ and $Ar^2$ are independently of each other

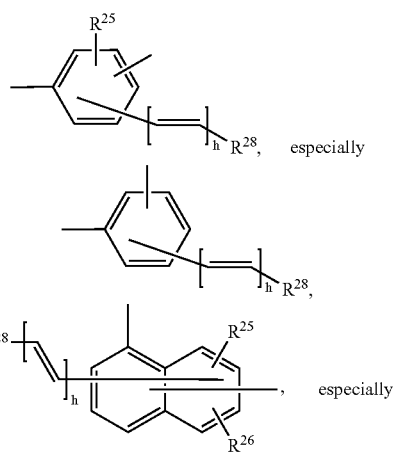

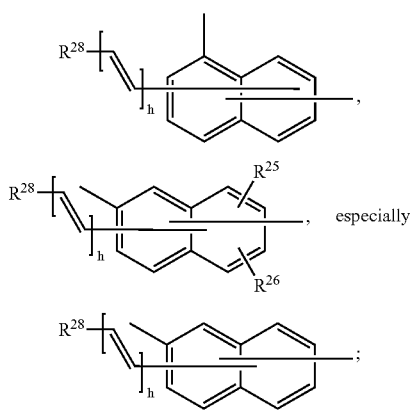

in particular

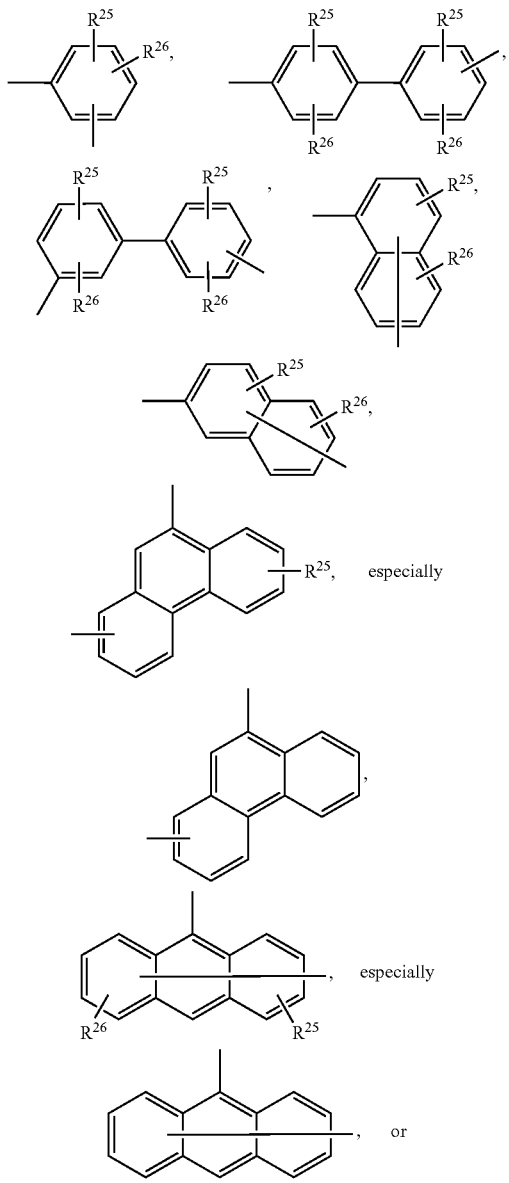

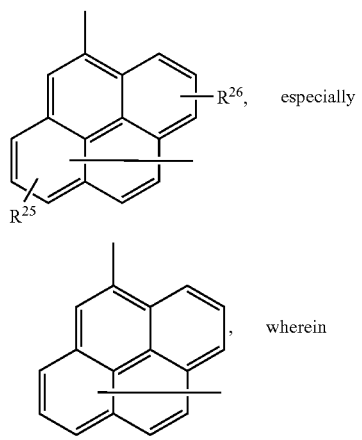

$R^{25}$, $R^{26}$ and $R^{27}$ independently from each other stands for hydrogen, $C_1$-$C_{25}$alkyl, $C_1$-$C_{25}$alkoxy, —$CR^{11}R^{12}$—$(CH_2)_g$—$Ar^6$, cyano, $NO_2$, halogen, —$OR^{29}$, —$NR^{29}R^{30}$, —$S(O)_pR^{31}$, $C_2$-$C_8$heteroaryl, such as thiophenyl, or $C_6$-$C_{14}$aryl, such as phenyl, which can be substituted one to three times with $C_1$-$C_8$alkyl, or $C_1$-$C_8$alkoxy, wherein $R^{29}$ and $R^{30}$ independently of each other stand for H, $C_1$-$C_{25}$-alkyl, $C_5$-$C_{12}$-cycloalkyl, —$CR^{11}R^{12}$—$(CH_2)_g$-Ph, $C_6$-$C_{24}$aryl, or a saturated or unsaturated heterocyclic group comprising five to seven ring atoms, wherein the ring consists of carbon atoms and one to three hetero atoms selected from the group consisting of nitrogen, oxygen and sulfur, $R^{31}$ stands for $C_1$-$C_{25}$alkyl, or $C_6$-$C_{14}$aryl, $R^{28}$ stands for $C_6$-$C_{30}$arylene, especially

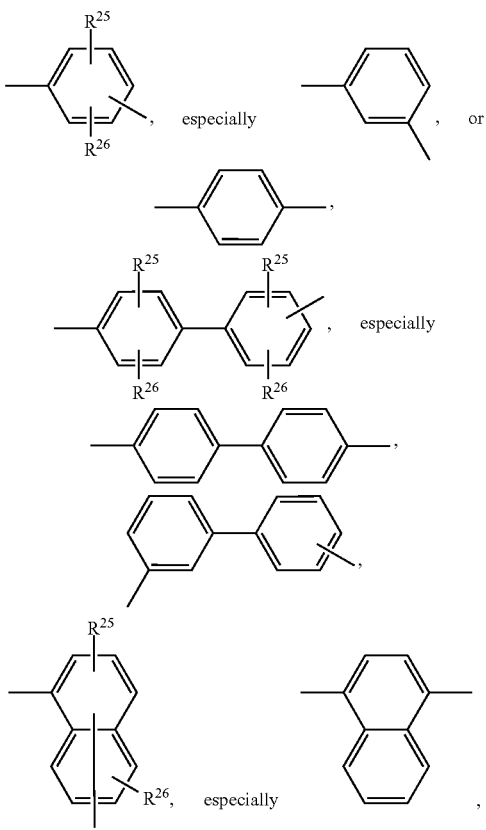

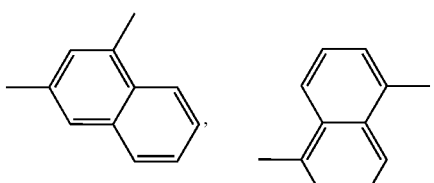 or 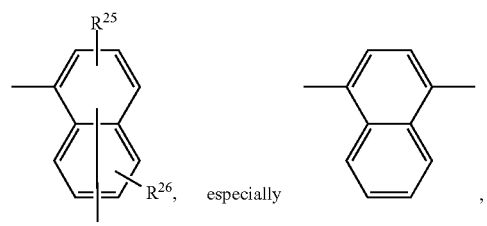

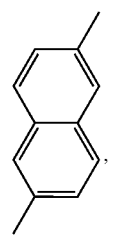, p stands for 0, 1, 2 or 3, g and h stands for 0, 1, 2, 3 or 4, $Ar^6$ stands for phenyl or 1- or 2-naphthyl which can be substituted one to three times with $C_1$-$C_8$alkyl, $C_1$-$C_8$alkoxy, halogen, nitro, cyano, phenyl, which can be substituted with $C_1$-$C_8$alkyl or $C_1$-$C_8$alkoxy one to three times, —$NR^{23}R^{24}$, wherein $R^{23}$ and $R^{24}$ represent hydrogen, $C_1$-$C_{25}$-alkyl, $C_5$-$C_{12}$-cycloalkyl or $C_6$-$C_{24}$-aryl, in particular phenyl or 1- or 2-naphthyl which can be substituted one to three times with $C_1$-$C_8$alkyl, $C_1$-$C_8$alkoxy, halogen or cyano, or phenyl, which can be substituted with $C_1$-$C_8$alkyl or $C_1$-$C_8$alkoxy one to three times, and $R^{11}$ and $R^{12}$ independently from each other stand for hydrogen, fluorine, cyano or $C_1$-$C_4$alkyl, which can be substituted by fluorine, or phenyl which can be substituted one to three times with $C_1$-$C_4$alkyl.

$R^{28}$ stands for $C_6$-$C_{30}$arylene, especially

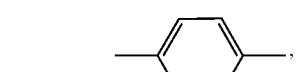, especially 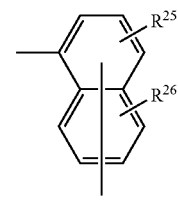, or

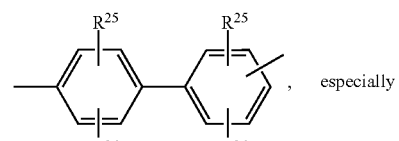,

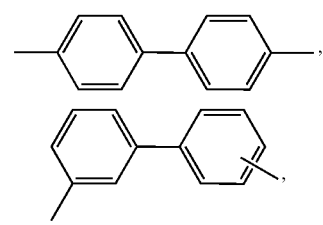, especially

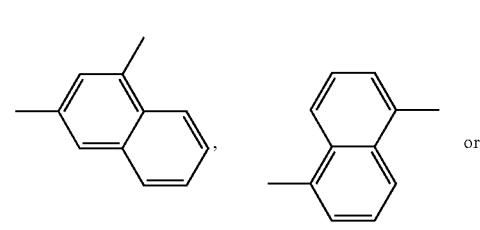, especially 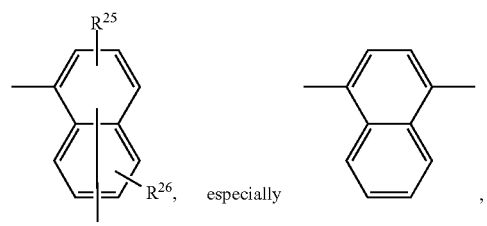,

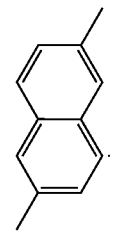.

A group of formula

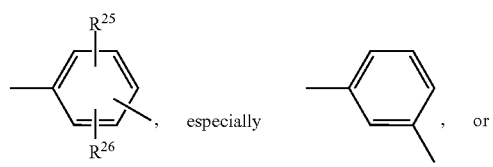

shall represent groups of formula

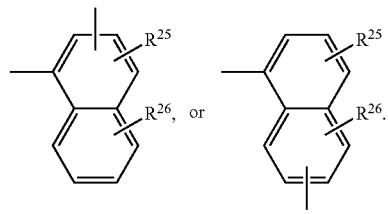

Accordingly, a group of formula

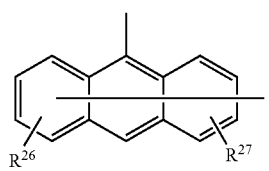

shall represent groups of formula

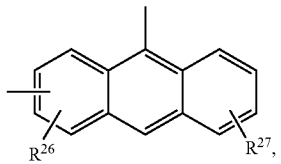

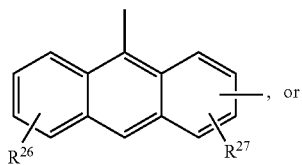

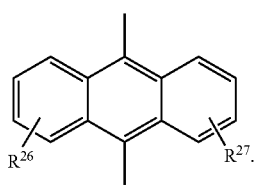

If Ar¹ and Ar² are an arylene group, they are preferably a group of formula

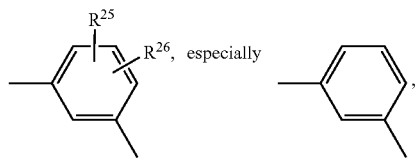

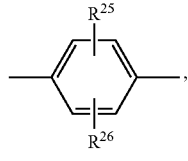

in particular

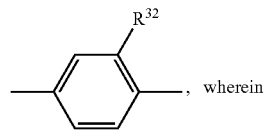

$R^{32}$ is H, Cl, CH$_3$, or OCH$_3$,

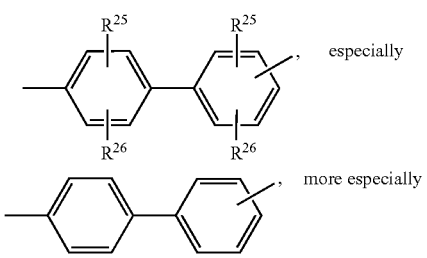

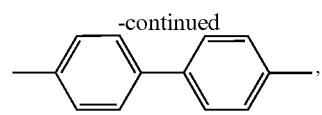

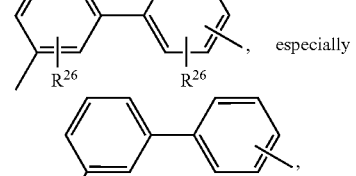

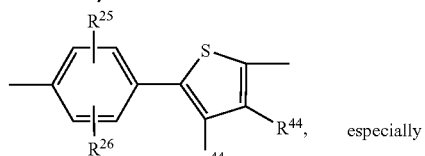

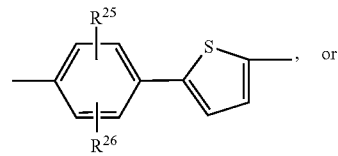

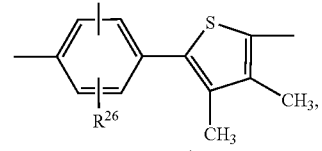

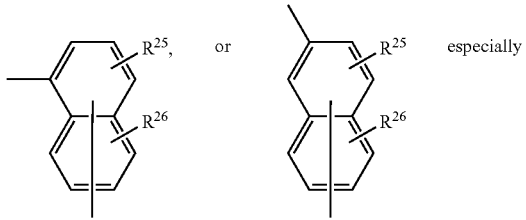

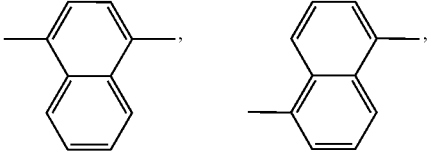

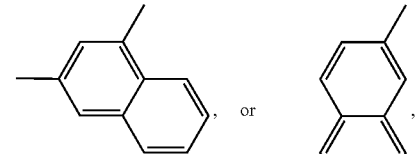

wherein $R^{44}$ is H, or C$_1$-C$_{25}$alkyl, $R^{25}$ and $R^{26}$ are as defined above and are especially independently from each other hydrogen, C$_1$-C$_{25}$alkyl, C$_1$-C$_{25}$alkoxy, cyano, NO$_2$, halogen, —OR$^{29}$, —NR$^{29}$R$^{30}$ —S(O)$_p$R$^{31}$, or phenyl, which can be substituted one to three times with C$_1$-C$_8$alkyl or C$_1$-C$_8$alkoxy, wherein R$^{29}$ and R$^{30}$ independently of each other stand for H, phenyl, or C$_1$-C$_{25}$-alkyl, R$^{31}$ stands for C$_1$-C$_{25}$alkyl, or C$_6$-C$_{14}$aryl, and p is 0, 1, or 2, wherein among the above-mentioned groups

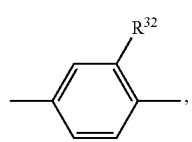

wherein $R^{32}$ is Cl, $CH_3$, or $OCH_3$,

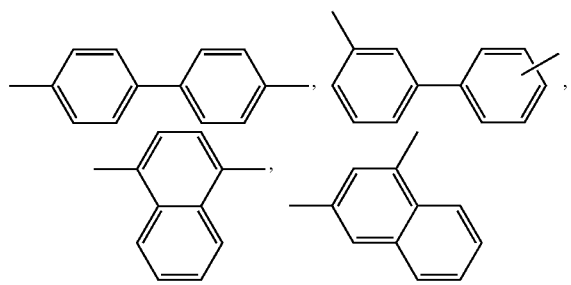

are most preferred.

Alternatively, $Ar^1$ and $Ar^2$ independently from each other stand for

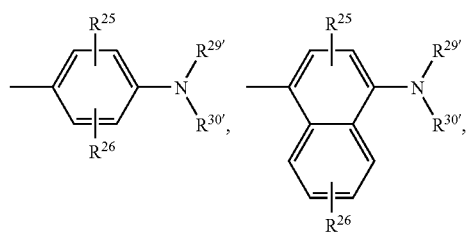

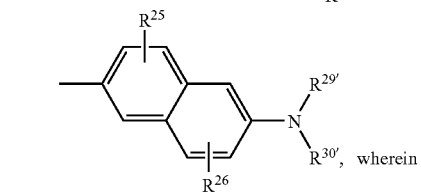

$R^{29'}$ stands for H, $C_1$-$C_{25}$-alkyl, $C_5$-$C_{12}$-cycloalkyl, —$CR^{11}R^{12}$—$(CH_2)_g$-Ph, $C_6$-$C_{24}$aryl, $R^{30'}$ stands for $C_6$-$C_{30}$arylene, especially

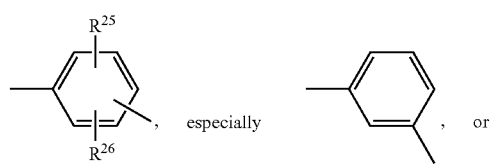

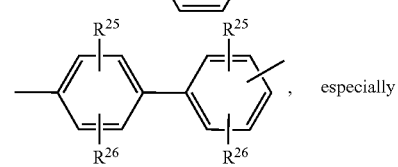

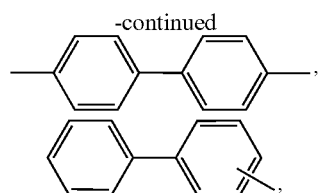

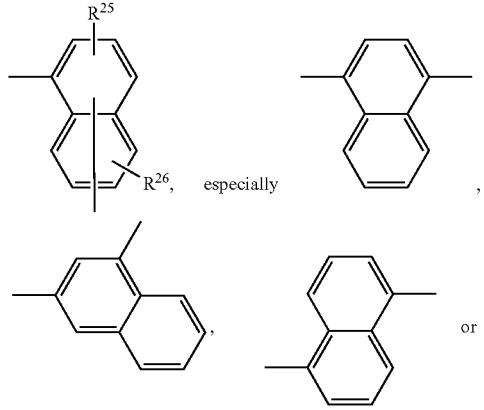

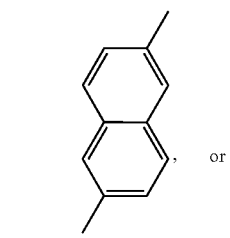

$R^{29'}$ and $R^{30'}$ together with the nitrogen to which they are bonded form a group of formula

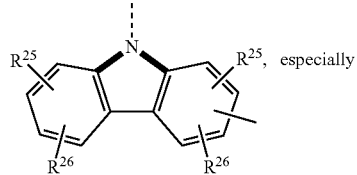

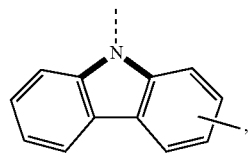

and g, $R^{11}$, $R^{12}$, $R^{25}$ and $R^{26}$ are as defined on page 5, especially on page 7.

In another embodiment of the present invention $Ar^1$ and $Ar^2$ are a $C_2$-$C_{26}$heteroaryl group, such as, for example,

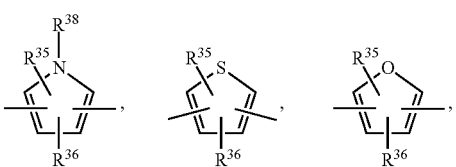

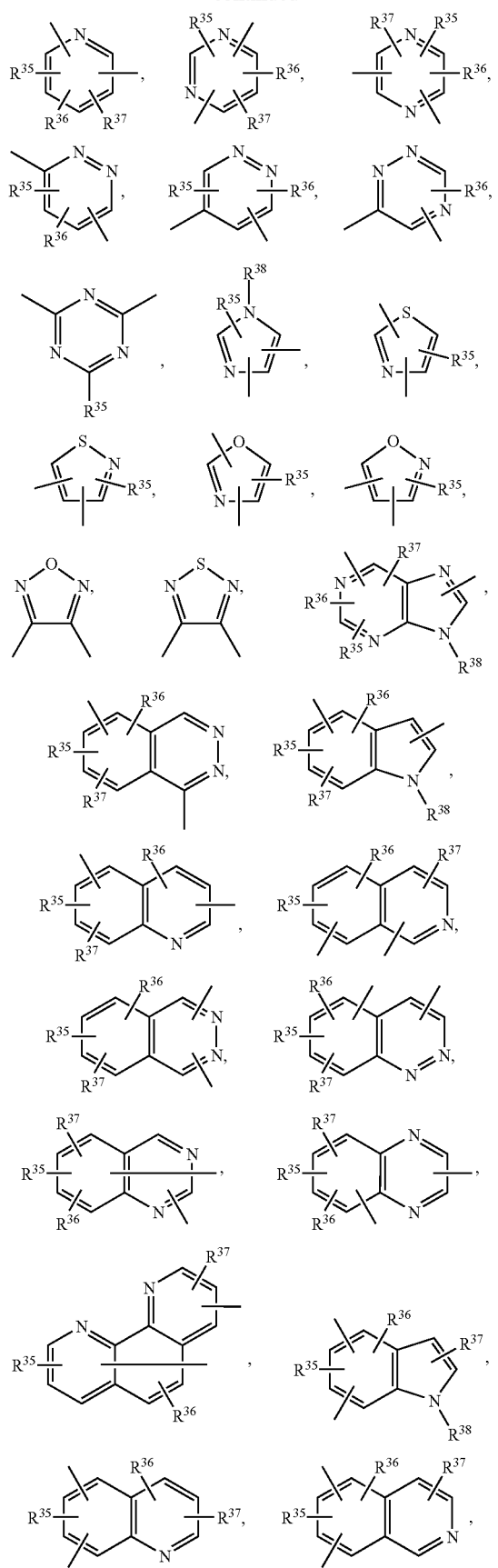
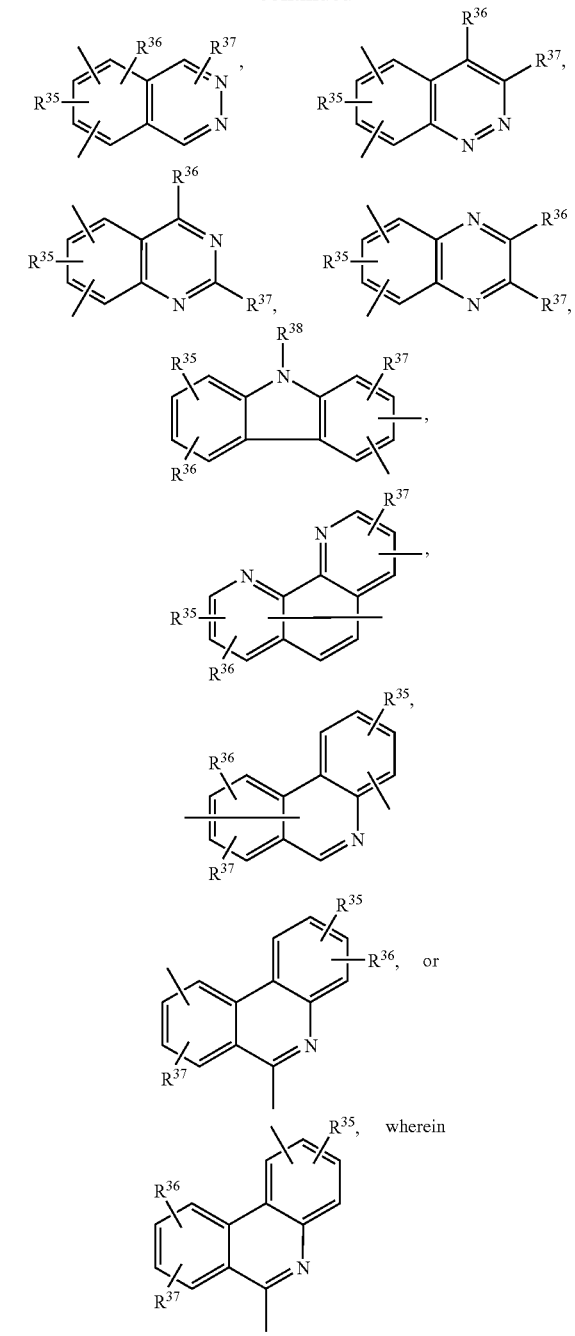

$R^{35}$, $R^{36}$, and $R^{37}$ may be the same or different and are selected from a hydrogen atom, a $C_1$-$C_{25}$ alkyl group, which may optionally be interrupted by one or more oxygen atoms, a cycloalkyl group, an aralkyl group, an alkenyl group, a cycloalkenyl group, an alkynyl group, a hydroxyl group, a mercapto group, an alkoxy group, an alkylthio group, an aryl ether group, an aryl thioether group, an aryl group, a heterocyclic group, a halogen atom, a haloalkyl group, a haloalkenyl group, a haloalkynyl group, a cyano group, an aldehyde group, a carboxyl group, an ester group, a carbamoyl group, an amino group, a nitro group, a silyl group, a siloxanyl group, a substituted or unsubstituted vinyl group, an alkylamino group, an dialkylamino group, an alkylarylamino group, an arylamino group and a diarylamino group, or at least two adjacent substituents $R^5$ to $R^7$ form an aromatic or aliphatic fused ring system, and $R^{38}$ is a hydrogen atom, a $C_1$-$C_{25}$alkyl group, a cycloalkyl group, an aralkyl group, an aryl group, or a heterocyclic group.

In said embodiment $Ar^1$ and $Ar^2$ are preferably selected from groups of formula

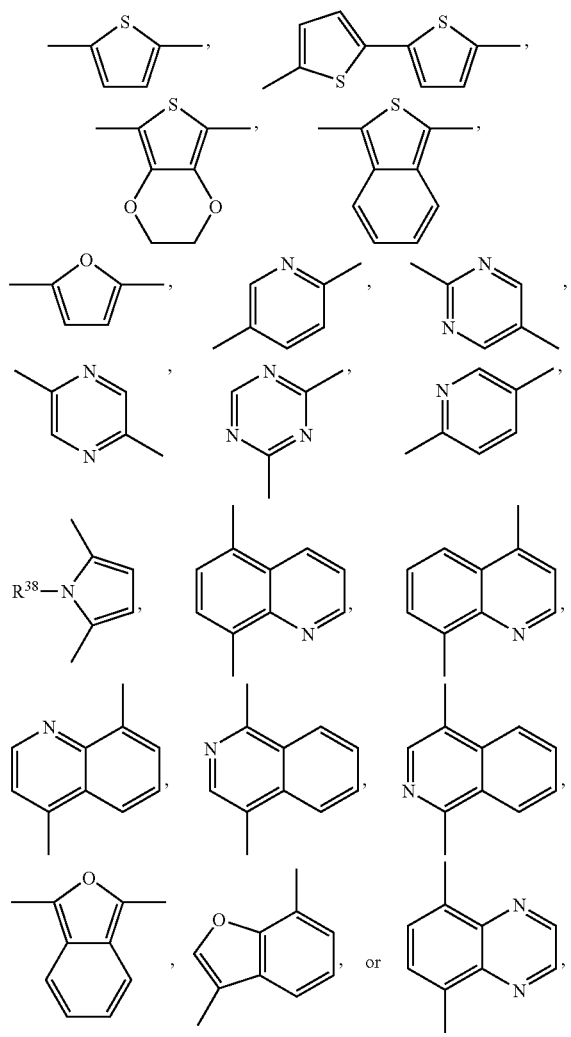

wherein $R^{38}$ stands for hydrogen, $C_6$-$C_{10}$aryl, $C_7$-$C_{12}$alkylaryl, $C_7$-$C_{12}$aralkyl, or $C_1$-$C_8$alkyl.

$R^1$ and $R^2$ are preferably selected from $C_1$-$C_{25}$alkyl, which can optionally be interrupted by one or more oxygen atoms, $C_5$-$C_{12}$-cycloalkyl, especially cyclohexyl, which can be substituted one to three times with $C_1$-$C_8$alkyl and/or $C_1$-$C_8$alkoxy, or $C_5$-$C_{12}$-cycloalkyl, especially cyclohexyl, which can be condensed one or two times by phenyl, which can be substituted one to three times with $C_1$-$C_4$-alkyl, halogen, nitro or cyano, phenyl or 1- or 2-naphthyl which can be substituted one to three times with $C_1$-$C_8$alkyl and/or $C_1$-$C_8$alkoxy, or —$CR^3R^4$—$(CH_2)_g$—$Ar^3$ wherein $R^3$ and $R^4$ stand for hydrogen, $Ar^3$ stands for phenyl or 1- or 2-naphthyl, which can be substituted one to three times with $C_1$-$C_8$alkyl and/or $C_1$-$C_8$alkoxy, and g stands for 0 or 1. An alkyl group which is interrupted one or more times by —O— is understood to be a straight-chain or branched $C_2$-$C_{25}$alkyl radical, preferably $C_2$-$C_{14}$alkyl group, which may be interrupted one or more times by —O—, for example one, two or three times by —O—, resulting in structural units such as, for example, —$(CH_2)_2$OCH$_3$, —$(CH_2CH_2O)_2CH_2CH_3$, —CH$_2$—O—CH$_3$, —CH$_2$CH$_2$—O—CH$_2$CH$_3$, —CH$_2$CH$_2$CH$_2$—O—CH(CH$_3$)$_2$, —[CH$_2$CH$_2$O]$_{y1}$—CH$_3$ wherein Y1=1-3, —CH$_2$—CH(CH$_3$)—O—CH$_2$—CH$_2$CH$_3$ and —CH$_2$—CH(CH$_3$)—O—CH$_2$—CH$_3$.

Most preferred $R^1$ and $R^2$ are a $C_1$-$C_{25}$alkyl group, especially a $C_4$-$C_{12}$alkyl group, such as n-butyl, sec.-butyl, isobutyl, tert.-butyl, n-pentyl, 2-pentyl, 3-pentyl, 2,2-dimethylpropyl, n-hexyl, n-heptyl, n-octyl, 1,1,3,3-tetramethylbutyl and 2-ethylhexyl, n-nonyl, n-decyl, n-undecyl, or n-dodecyl.

The polymers of formula I can contain in addition to the repeating unit (recurring unit) of formula I one or more repeating units $Ar^3$ and/or T. $Ar^3$ is selected from the following groups:

group II: units, which increase the hole-injection or hole-transport properties of the polymers;

group III: units, which increase the electron-injection or electron-transport properties of the polymers;

group IV: units, which are combinations of units of group II and III;

group V:

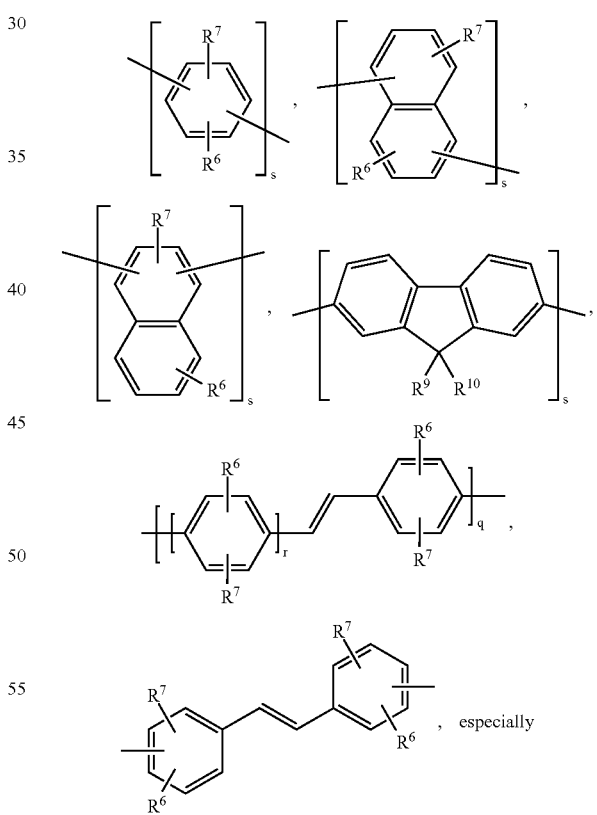

, especially

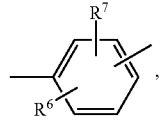

(Va)

r is an integer from 1 to 10, especially 1, 2 or 3,
q is an integer from 1 to 10, especially 1, 2 or 3,
s is an integer from 1 to 10, especially 1, 2 or 3,
$R^6$ and $R^7$ are independently of each other H, halogen, —CN, $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, $C_7$-$C_{25}$aralkyl, —C(=O)—$R^{17}$, —C(=O)O$R^{17}$, or —C(=O)N$R^{17}R^{16}$, $R^9$ and $R^{10}$ are independently of each other H, $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, or $C_7$-$C_{25}$aralkyl, or $R^9$ and $R^{10}$ together form a group of formula =$CR^{100}R^{101}$, wherein $R^{100}$ and $R^{101}$ are independently of each other H, $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by G, or $C_2$-$C_{20}$heteroaryl, or $C_2$-$C_{20}$heteroaryl which is substituted by G, or $R^9$ and $R^{10}$ together form a five or six membered ring, which optionally can be substituted by $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, $C_7$-$C_{25}$aralkyl, or —C(=O)—$R^{17}$, and $R^{16}$ and $R^{17}$ are independently of each other H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—, D is —CO—, —COO—, —S—, —SO—, —$SO_2$—, —O—, —$NR^{65}$—, —$SiR^{70}R^{71}$—, —$POR^{72}$—, —$CR^{63}$=$CR^{64}$—, or —C≡C—, and E is —$OR^{69}$, —$SR^{69}$, —$NR^{65}R^{66}$, —$COR^{68}$, —$COOR^{67}$, —$CONR^{65}R^{66}$, —CN, —$OCOOR^{67}$, or halogen, G is E, or $C_1$-$C_{18}$alkyl, $R^{63}$, $R^{64}$, $R^{65}$ and $R^{66}$ are independently of each other H; $C_6$-$C_{18}$aryl; $C_6$-$C_{18}$aryl which is substituted by $C_1$-$C_{18}$alkyl, $C_1$-$C_{18}$alkoxy; $C_1$-$C_{18}$alkyl; or $C_1$-$C_{18}$alkyl which is interrupted by —O—; or $R^{65}$ and $R^{66}$ together form a five or six membered ring, in particular

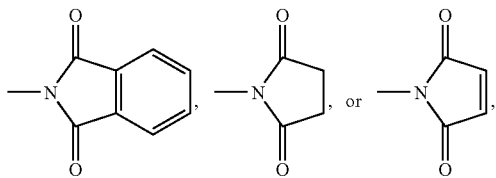

$R^{67}$ and $R^{68}$ are independently of each other H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—, $R^{69}$ is H; $C_6$-$C_{18}$aryl; $C_6$-$C_{18}$aryl, which is substituted by $C_1$-$C_{18}$alkyl, $C_1$-$C_{18}$alkoxy; $C_1$-$C_{18}$alkyl; or $C_1$-$C_{18}$alkyl which is interrupted by —O—, $R^{70}$ and $R^{71}$ are independently of each other $C_1$-$C_{18}$alkyl, $C_6$-$C_{18}$aryl, or $C_6$-$C_{18}$aryl, which is substituted by $C_1$-$C_{18}$alkyl, and $R^{72}$ is $C_1$-$C_{18}$alkyl, $C_6$-$C_{18}$aryl, or $C_6$-$C_{18}$aryl, which is substituted by $C_1$-$C_{18}$alkyl.

The repeating units T are selected from the following group VI:

$X^1$ is a hydrogen atom, or a cyano group, $R^{41}$ can be the same or different at each occurrence and is Cl, F, CN, N($R^{45}$)$_2$, a $C_1$-$C_{25}$alkyl group, a $C_4$-$C_{18}$cycloalkyl group, a $C_1$-$C_{25}$alkoxy group, in which one or more carbon atoms which are not in neighborhood to each other could be replaced by —$NR^{45}$—, —O—, —S—, —C(=O)—O—, or —O—C(=O)—O—, and/or wherein one or more hydrogen atoms can be replaced by F, a $C_6$-$C_{24}$aryl group, or a $C_6$-$C_{24}$aryloxy group, wherein one or more carbon atoms can be replaced by O, S, or N, and/or which can be substituted by one or more non-aromatic groups $R^{41}$, or two or more groups $R^{41}$ form a ring system;

$R^{45}$ is H, a $C_1$-$C_{25}$alkyl group, a $C_4$-$C_{18}$cycloalkyl group, a $C_1$-$C_{25}$alkoxy group, in which one or more carbon atoms which are not in neighborhood to each other could be replaced by —$NR^{45}$—, —O—, —S—, —C(=O)—O—, or, —O—C(=O)—O—, and/or wherein one or more hydrogen atoms can be replaced by F, a $C_6$-$C_{24}$aryl group, or a $C_6$-$C_{24}$aryloxy group, wherein one or more carbon atoms can be replaced by O, S, or N, and/or which can be substituted by one or more non-aromatic groups $R^{41}$, n can be the same or different at each occurrence and is 0, 1, 2, or 3, especially 0, 1, or 2, very especially 0 or 1, and u is 1, 2, 3, or 4;

$A^1$ is a $C_6$-$C_{24}$aryl group, a $C_2$-$C_{30}$heteroaryl group, especially phenyl, naphthyl, anthryl, biphenylyl, 2-fluorenyl, phenanthryl, or perylenyl, which can be substituted by one or more non-aromatic groups $R^{41}$.

Among the above units of group V the units of formula Va, Vc, Ve, Vf, Vk and Vn are more preferred.

If the polymer is a copolymer comprising repeating units of formula I and of group V and $Ar^1$ and $Ar^2$ are a group of formula

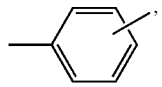, the repeating unit of group V is preferably a repeating unit of formula Vb to Vd, Vg to Vj, Vl, or Vm.

Preferred units of group II, which increase the hole-injection or hole-transport properties of the polymers, are:

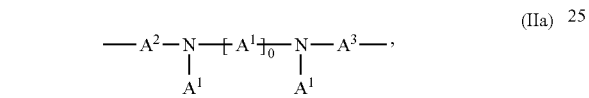 (IIa)

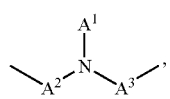 (IIb)

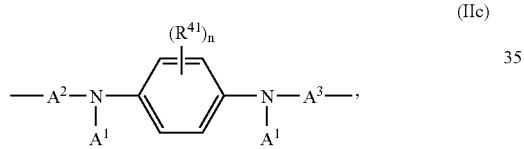 (IIc)

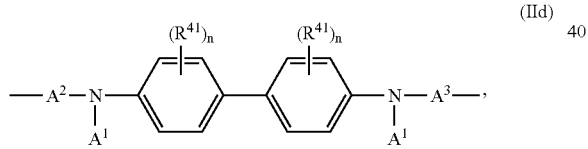 (IId)

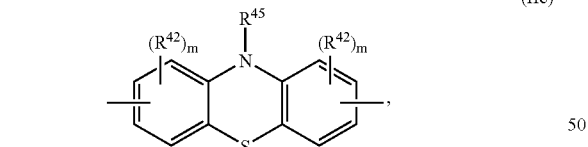 (IIe)

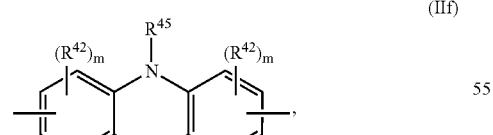 (IIf)

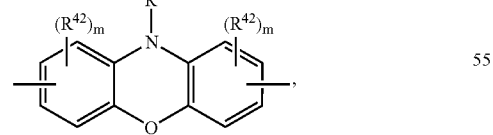 (IIg)

-continued

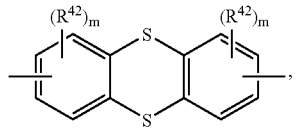 (IIh)

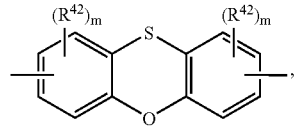 (IIi)

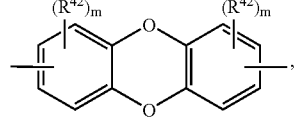 (IIj)

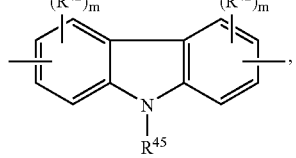 (IIk)

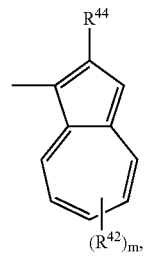 (IIl)

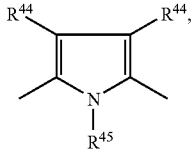 (IIm)

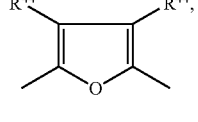 (IIn)

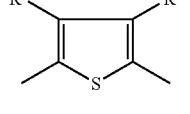 (IIo)

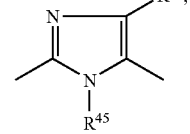 (IIp)

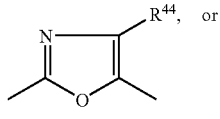 (IIq)

(IIr)

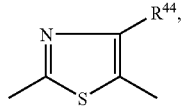

(IIs)

, wherein $R^{41}$ can be the same or different at each occurrence and is Cl, F, CN, $N(R^{45})_2$, a $C_1$-$C_{25}$alkyl group, a $C_4$-$C_{18}$cycloalkyl group, a $C_1$-$C_{25}$alkoxy group, in which one or more carbon atoms which are not in neighborhood to each other could be replaced by —$NR^{45}$—, —O—, —S—, —C(=O)—O—, or —O—C(=O)—O—, and/or wherein one or more hydrogen atoms can be replaced by F, a $C_6$-$C_{24}$aryl group, or a $C_6$-$C_{24}$aryloxy group, wherein one or more carbon atoms can be replaced by O, S, or N, and/or which can be substituted by one or more non-aromatic groups $R^{41}$, or two or more groups $R^{41}$ form a ring system;

$R^{42}$ can be the same or different at each occurrence and is CN, a $C_1$-$C_{25}$alkyl group, a $C_4$-$C_{18}$cycloalkyl group, a $C_1$-$C_{25}$alkoxy group, in which one or more carbon atoms which are not in neighborhood to each other could be replaced by —$NR^{45}$—, —O—, —S—, —C(=O)—O—, or —O—C(=O)—O—, and/or wherein one or more hydrogen atoms can be replaced by F, a $C_6$-$C_{24}$aryl group, or a $C_6$-$C_{24}$aryloxy group, wherein one or more carbon atoms can be replaced by O, S, or N, and/or which can be substituted by one or more non-aromatic groups $R^{41}$, or two or more groups $R^{41}$ form a ring system;

$R^{44}$ can be the same or different at each occurrence and are a hydrogen atom, a $C_1$-$C_{25}$alkyl group, a $C_4$-$C_{18}$cycloalkyl group, a $C_1$-$C_{25}$alkoxy group, in which one or more carbon atoms which are not in neighborhood to each other could be replaced by —$NR^{45}$—, —O—, —S—, —C(=O)—O—, or, —O—C(=O)—O—, and/or wherein one or more hydrogen atoms can be replaced by F, a $C_6$-$C_{24}$aryl group, or a $C_6$-$C_{24}$aryloxy group, wherein one or more carbon atoms can be replaced by O, S, or N, and/or which can be substituted by one or more non-aromatic groups $R^{41}$, or CN, or two or more groups $R^{44}$, which are in neighborhood to each other, form a ring;

$R^{45}$ is H, a $C_1$-$C_{25}$alkyl group, a $C_4$-$C_{18}$cycloalkyl group, a $C_1$-$C_{25}$alkoxy group, in which one or more carbon atoms which are not in neighborhood to each other could be replaced by —$NR^{45}$—, —O—, —S—, —C(=O)—O—, or, —O—C(=O)—O—, and/or wherein one or more hydrogen atoms can be replaced by F, a $C_6$-$C_{24}$aryl group, or a $C_6$-$C_{24}$aryloxy group, wherein one or more carbon atoms can be replaced by O, S, or N, and/or which can be substituted by one or more non-aromatic groups $R^{41}$;

m can be the same or different at each occurrence and is 0, 1, 2, or 3, especially 0, 1, or 2, very especially 0 or 1;

n can be the same or different at each occurrence and is 0, 1, 2, or 3, especially 0, 1, or 2, very especially 0 or 1;

o is 1, 2, or 3, especially 1, or 2, and u is 1, 2, 3, or 4;

$A^1$ is a $C_6$-$C_{24}$aryl group, a $C_2$-$C_{30}$heteroaryl group, which can be substituted by one or more non-aromatic groups $R^{41}$, or $NO_2$, especially phenyl, naphthyl, anthryl, biphenylyl, 2-fluorenyl, phenanthryl, or perylenyl, which can be substituted by one or more non-aromatic groups $R^{41}$, $A^2$ and $A^3$ are independently of each other a $C_6$-$C_{30}$arylene group, or a $C_2$-$C_{24}$heteroarylene group, which can optionally be substituted, especially

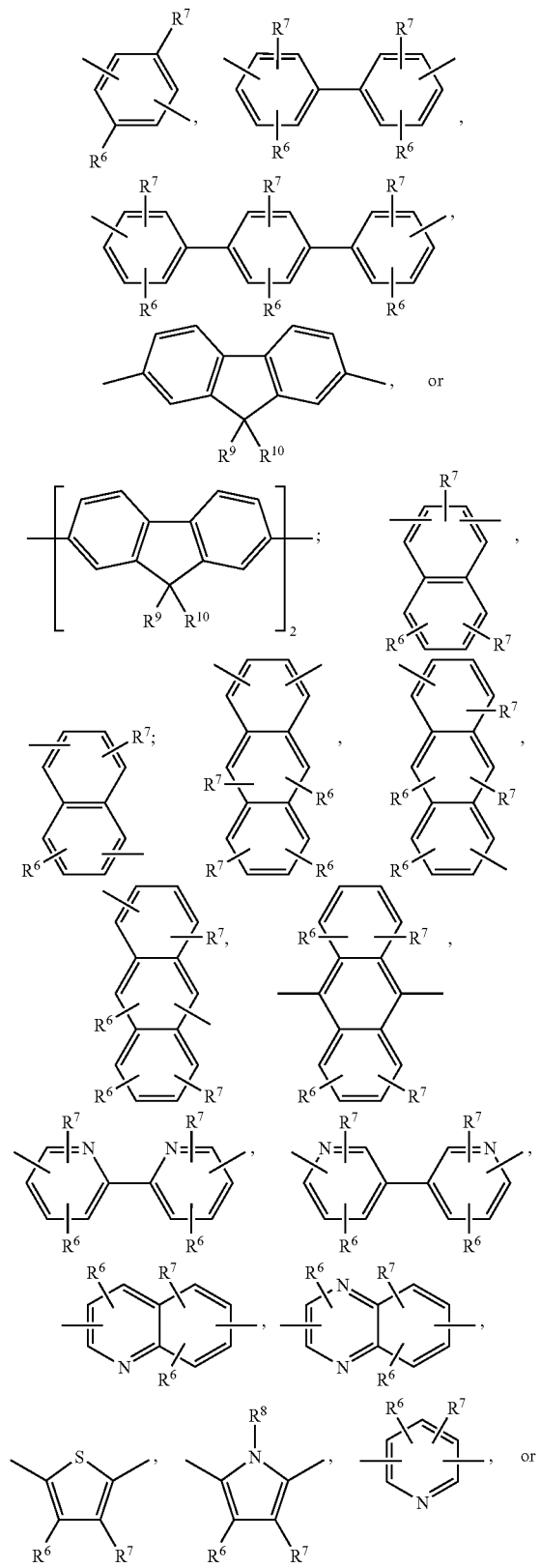

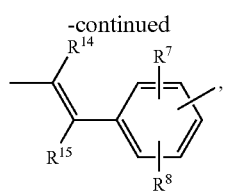

wherein $R^6$, $R^7$,
$R^9$ and $R^{10}$ are as defined above,
$R^8$ is H, $C_1$-$C_{18}$alkyl, $C_1$-$C_{18}$alkyl which is substituted by E and/or interrupted by D, $C_6$-$C_{24}$ aryl, or $C_7$-$C_{25}$aralkyl,
$R^{14}$ and $R^{15}$ are independently of each other H, $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by G, or $C_2$-$C_{20}$heteroaryl, $C_2$-$C_{20}$heteroaryl which is substituted by G, wherein E, G and D are as defined above. Among the above units of group II the units of formula IIa, IIb, IIf, IIg, IIk, IIm, IIn, IIo and IIp are more preferred.

$A^1$ is preferably a phenyl group, which is substituted by $C_1$-$C_4$alkyl, or $NO_2$, in particular

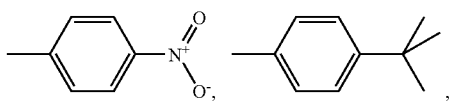

or an anthryl group, in particular an anthr-2-yl group.

If the polymer is a copolymer comprising repeating units of formula I and of group II and $Ar^1$ and $Ar^2$ are a group of formula

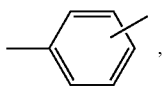

the repeating unit of group II is preferably a repeating unit of formula IIa to IIn or IIp to IIr.

Preferably, $R^6$ and $R^7$ are independently of each other H, $C_1$-$C_{12}$alkyl, such as methyl, ethyl, n-propyl, iso-propyl, n-butyl, isobutyl, sec-butyl, t-butyl, 2-methylbutyl, n-pentyl, isopentyl, n-hexyl, 2ethylhexyl, or n-heptyl, $C_1$-$C_{12}$alkyl which is substituted by E and/or interrupted by D, such as —$CH_2OCH_3$, —$CH_2OCH_2CH_3$, —$CH_2OCH_2CH_2OCH_3$, or —$CH_2OCH_2CH_2OCH_2CH_3$, $C_6$-$C_{14}$aryl, such as phenyl, naphthyl, or biphenylyl, $C_5$-$C_{12}$cycloalkyl, such as cyclohexyl, $C_6$-$C_{14}$aryl which is substituted by G, such as —$C_6H_4OCH_3$, —$C_6H_4OCH_2CH_3$, —$C_6H_3(OCH_3)_2$, or —$C_6H_3(OCH_2CH_3)_2$, —$C_6H_4CH_3$, —$C_6H_3(CH_3)_2$, —$C_6H_2(CH_3)_3$, —$C_6H_4tBu$.

$R^8$ is preferably H, $C_1$-$C_{12}$alkyl, such as methyl, ethyl, n-propyl, iso-propyl, n-butyl, isobutyl, sec-butyl, t-butyl, 2-methylbutyl, n-pentyl, isopentyl, n-hexyl, 2-ethylhexyl, n-heptyl, or $C_6$-$C_{14}$aryl, such as phenyl, naphthyl, or biphenylyl.

Preferably, $R^9$ and $R^{10}$ are independently of each other H, $C_1$-$C_{12}$alkyl, such as methyl, ethyl, n-propyl, iso-propyl, n-butyl, sec-butyl, hexyl, octyl, or 2-ethyl-hexyl, $C_1$-$C_{12}$alkyl which is substituted by E and/or interrupted by D, such as —$CH_2(OCH_2CH_2)_wOCH_3$, w=1, 2, 3, or 4, $C_6$-$C_{14}$aryl, such as phenyl, naphthyl, or biphenylyl, $C_6$-$C_{14}$aryl which is substituted by G, such as —$C_6H_4OCH_3$, —$C_6H_4OCH_2CH_3$, —$C_6H_3(OCH_3)_2$, —$C_6H_3(OCH_2CH_3)_2$, —$C_6H_4CH_3$, —$C_6H_3(CH_3)_2$, —$C_6H_2(CH_3)_3$, or —$C_6H_4tBu$, or $R^9$ and $R^{10}$ together form a 4 to 8 membered ring, especially a 5 or 6 membered ring, such as cyclohexyl, or cyclopentyl, which can optionally be substituted by $C_1$-$C_8$alkyl.

Preferably, $R^{14}$ and $R^{15}$ are independently of each other H, $C_1$-$C_{12}$alkyl, such as methyl, ethyl, n-propyl, iso-propyl, n-butyl, isobutyl, or sec-butyl, or $C_6$-$C_{14}$aryl, such as phenyl, naphthyl, or biphenylyl.

D is preferably —CO—, —COO—, —S—, —SO—, —$SO_2$—, —O—, —$NR^{65}$—, wherein $R^{65}$ is $C_1$-$C_{12}$alkyl, such as methyl, ethyl, n-propyl, iso-propyl, n-butyl, isobutyl, or sec-butyl, or $C_6$-$C_{14}$aryl, such as phenyl, naphthyl, or biphenylyl.

E is preferably —$OR^{69}$; —$SR^{69}$; —$NR^{65}R^{65}$; —$COR^{68}$; —$COOR^{67}$; —$CONR^{65}R^{65}$; or —CN; wherein $R^{65}$, $R^{67}$, $R^{68}$ and $R^{69}$ are independently of each other $C_1$-$C_{12}$alkyl, such as methyl, ethyl, n-propyl, iso-propyl, n-butyl, isobutyl, sec-butyl, hexyl, octyl, or 2-ethyl-hexyl, or $C_6$-$C_{14}$ aryl, such as phenyl, naphthyl, or biphenylyl.

G has the same preferences as E, or is $C_1$-$C_{18}$alkyl, especially $C_1$-$C_{12}$alkyl, such as methyl, ethyl, n-propyl, iso-propyl, n-butyl, isobutyl, sec-butyl, hexyl, octyl, or 2-ethyl-hexyl.

Preferred units of group III, which increase the electron-injection or electron-transport properties of the polymers, are:

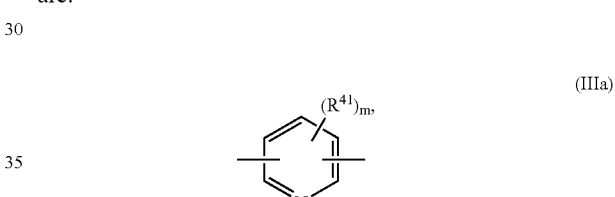

(IIIa)

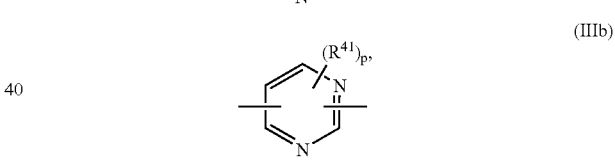

(IIIb)

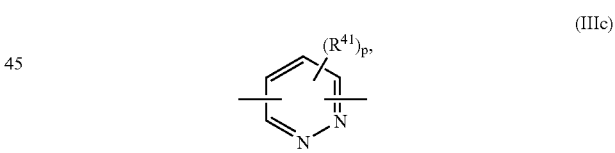

(IIIc)

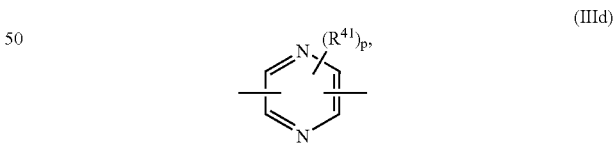

(IIId)

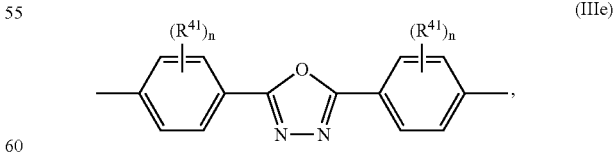

(IIIe)

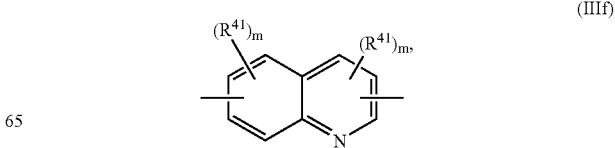

(IIIf)

wherein R⁴¹ and m and n are as defined above and p is 0, 1, or 2, especially 0 or 1. Among the above units of group III the units of formula IIIa, IIIe, IIIj, and IIIk are more preferred.

If the polymer is a copolymer comprising repeating units of formula I and of group III and Ar¹ and Ar² are a group of formula the repeating unit of group III is preferably a repeating unit of formula IIIb to IIIk.

Preferred units of group IV, which are combinations of units of formula II and III, are:

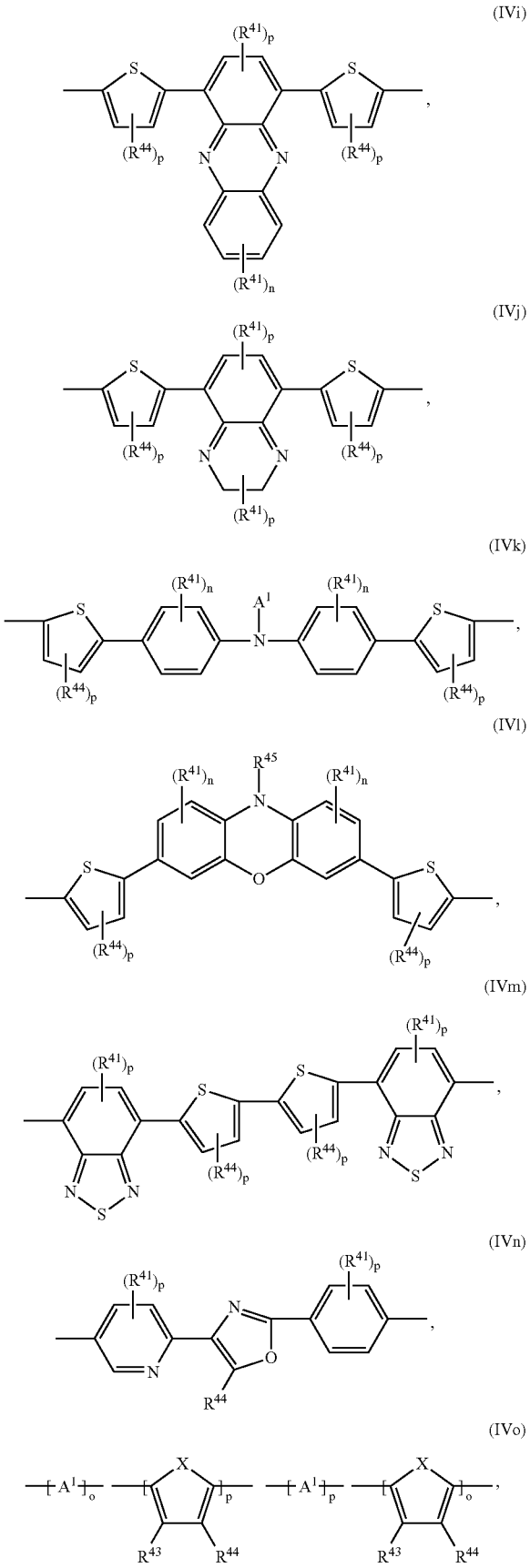

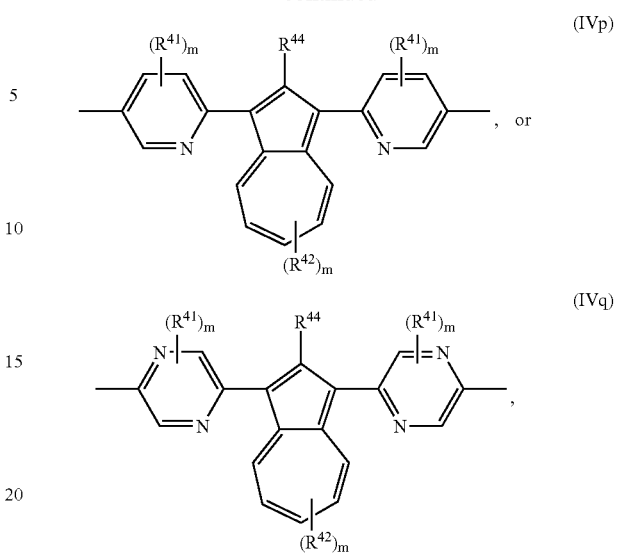

wherein X is O, S, or NR$^{45}$,

R$^{43}$ is a hydrogen atom, a C$_1$-C$_{25}$alkyl group, a C$_4$-C$_{18}$cycloalkyl group, a C$_1$-C$_{25}$alkoxy group, in which one or more carbon atoms which are not in neighborhood to each other could be replaced by —NR$^{45}$—, —O—, —S—, —C(=O)—O—, or, —O—C(=O)—O—, and/or wherein one or more hydrogen atoms can be replaced by F, a C$_6$-C$_{24}$aryl group, or a C$_6$-C$_{24}$aryloxy group, wherein one or more carbon atoms can be replaced by O, S, or N, and/or which can be substituted by one or more non-aromatic groups R$^{41}$, or CN, or two or more groups R$^{43}$ and/or R$^{44}$, which are in neighborhood to each other, form a ring;

o is 1, 2, or 3, especially 1, or 2, and A$^1$, R$^{41}$, R$^{42}$, R$^{44}$, R$^{45}$, m, n and p are as defined above. Among the above units of group IV the units of formula IVb, IVc and IVn are more preferred.

The presence of repeating units of formula II to V can lead to the following advantages:

If structures of group II, e.g. repeating units of formula IIa to IIr are present, improved hole-injection and/or hole-transport properties of the polymers can be observed. If used in PLEDs, the PLEDs show higher current density and electroluminescence at a given voltage. This property is of high importance in mobile applications, such as, for example, displays for mobile phones and PDAs, as the working voltage is limited.

If structures of group III, e.g. repeating units of formula IIIa to IIIk are present, improved electron-injection or electron-transport properties of the polymers are observed. If used in PLEDs, the PLEDs show higher current density and electroluminescence at a given voltage. This property is of high importance in mobile applications, such as, for example, displays for mobile phones and PDAs, as the working voltage is limited.

The presence of structures of group IV, e.g. repeating units of formula IVa to IVp, enables the variation of the of the electronic band gap and, hence, a variation of the color properties.

If Ar$^1$ and Ar$^2$ in formula I are a group of formula

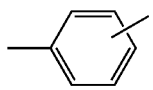

and R$^1$ and R$^2$ independently from each other stand for H, C$_1$-C$_{18}$alkyl, —C(O)O—C$_1$-C$_{18}$alkyl, perfluoro-C$_1$-C$_{12}$alkyl, unsubstituted C$_6$-C$_{12}$aryl or one to three times with C$_1$-C$_{12}$alkyl, C$_1$-C$_{12}$alkoxy, or halogen substituted C$_6$-C$_{12}$aryl, C$_1$-C$_{12}$alkyl-C$_6$-C$_{12}$aryl, or C$_6$-C$_{12}$aryl-C$_1$-C$_{12}$alkyl, co-polymers, wherein the co-monomer(s) is selected from the group consisting of

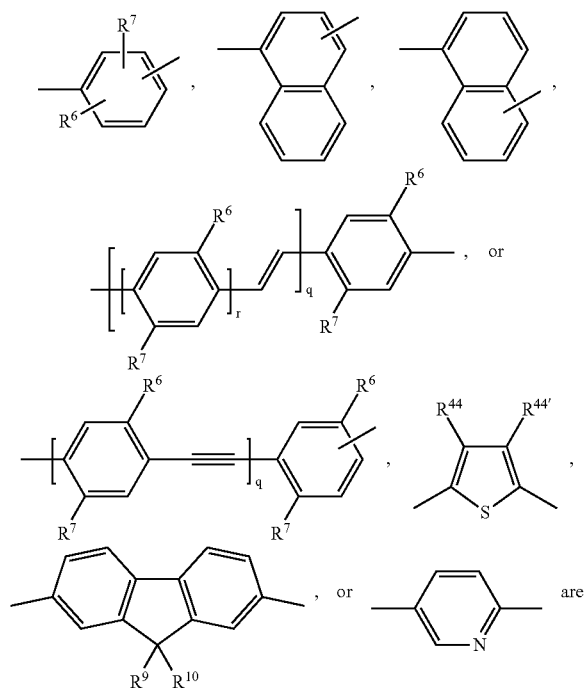

excluded, wherein q and r being numbers from 1 to 10, wherein

R$^6$, R$^7$, R$^9$, R$^{10}$ and R$^{44}$ independently from each other stand for H, C$_1$-C$_{18}$alkyl, —C(O)O—C$_1$-C$_{18}$alkyl, perfluoro-C$_1$-C$_{12}$alkyl, unsubstituted C$_6$-C$_{12}$aryl or one to three times with C$_1$-C$_{12}$alkyl, C$_1$-C$_{12}$alkoxy, or halogen substituted C$_6$-C$_{12}$aryl, C$_1$-C$_{12}$alkyl-C$_6$-C$_{12}$aryl, or C$_6$-C$_{12}$aryl-C$_1$-C$_{12}$alkyl, R$^{44'}$ stands for C$_1$-C$_{12}$alkyl, C$_1$-C$_{12}$alkoxy, unsubstituted C$_6$-C$_{12}$aryl or one to three times with C$_1$-C$_{12}$alkyl, C$_1$-C$_{12}$alkoxy, or halogen substituted C$_6$-C$_{12}$aryl, or perfluoro-C$_1$-C$_{12}$alkyl.

The preparation of monomers from which the units of group II, III, IV and V are derived, is, for example, described in WO03/020790.

In one embodiment, the polymers according to the invention consist only of one or more type of repeating units of formula I. In a preferred embodiment, the polymers according to the invention consist of precisely one type of repeating unit of formula I (homopolymers).

According to the present invention the term "polymer" comprises polymers as well as oligomers, wherein a polymer is a molecule of high relative molecular mass, the structure of which essentially comprises the repetition of units derived, actually or conceptually, from molecules of low relative molecular mass and an oligomer is a molecule of intermediate molecular mass, the structure of which essentially comprises a small plurality of units derived, actually or conceptually, from molecules of lower relative molecular mass. A molecule is regarded as having a high relative molecular mass if it has properties which do not vary significantly with the removal of one or a few of the units. A molecule is regarded as having an intermediate molecular mass if it has properties which do vary significantly with the removal of one or a few of the units.

According to the present invention a homopolymer is a polymer derived from one species of (real, implicit, or hypothetical) monomer. Many polymers are made by the mutual reaction of complementary monomers. These monomers can readily be visualized as reacting to give an "implicit monomer", the homopolymerization of which would give the actual product, which can be regarded as a homopolymer. Some polymers are obtained by chemical modification of other polymers, such that the structure of the macromolecules that constitute the resulting polymer can be thought of having been formed by the homopolymerization of a hypothetical monomer.

Accordingly a copolymer is a polymer derived from more than one species of monomer, e.g. bipolymer, terpolymer, quaterpolymer, etc.

The oligomers of this invention have a weight average molecular weight of <2,000 Daltons. The polymers of this invention preferably have a weight average molecular weight of 2,000 Daltons or greater, more preferably 2,000 to 100,000 Daltons and most preferably 2,000 to 50,000 Daltons. Molecular weights are determined according to gel permeation chromatography using polystyrene standards.

In one aspect of the present invention polymers are preferred, which besides the repeating units of formula I at the same time have at least one additional repeating unit Ar$^3$, or T, which is selected from groups II to VI. In said aspect, the polymers according to the invention comprise from 1 to 99 mol % of repeating units of formula I and preferably from 5 to 95 mol % of repeating units of groups II to VI, more preferably from 10 to 90 mol % of repeating units of groups II to VI, most preferably from 25 to 75 mol % of repeating units of groups II to VI. In said aspect of the present invention polymers are preferred, which besides the repeating units of formula I at the same time have at least two additional repeating units, which are selected from at least two different groups II to VI. Most preferred is the simultaneous presence of repeating units of group III and VI, IV and VI, or II and III and VI.

Accordingly, in one preferred embodiment the present invention relates to polymers, wherein the polymer comprises a repeating unit of formula

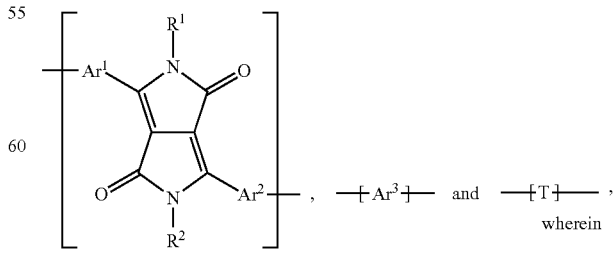

R$^1$ and R$^2$ are independently of each other a C$_1$-C$_{25}$alkyl group, especially a C$_4$-C$_{12}$alkyl group, which can be interrupted by one or more oxygen atoms, and $Ar^1$ and $Ar^2$ are independently of each other a group of formula

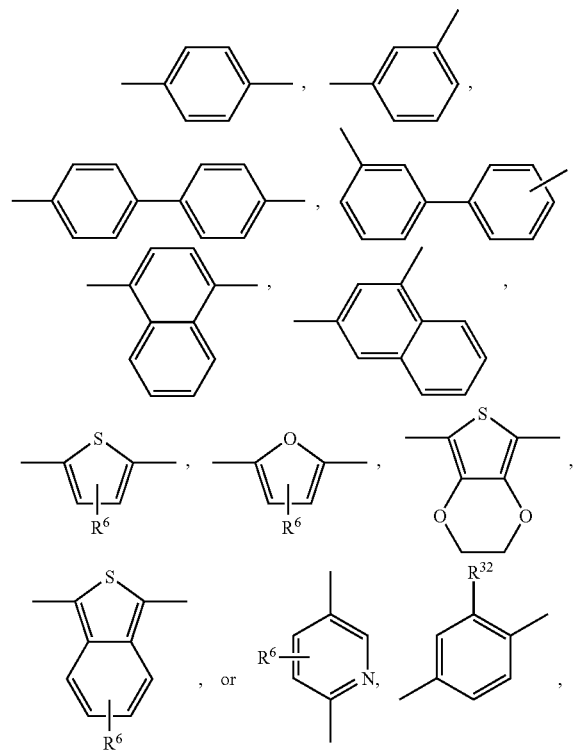

wherein $R^6$ is hydrogen, $C_1$-$C_{18}$alkyl, or $C_1$-$C_{18}$alkoxy, and $R^{32}$ is methyl, Cl, or OMe. In said embodiment T is preferably a repeating unit of formula VIa or VIb and $Ar^3$ is preferably selected from repeating units of formula:

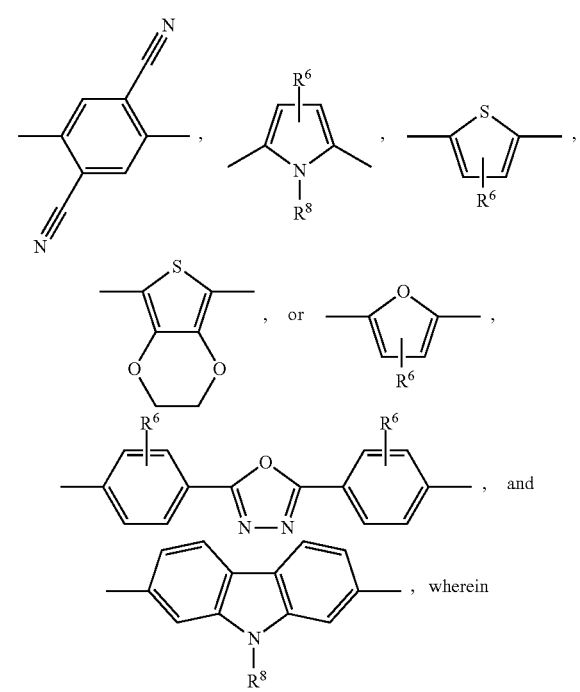

$R^6$ is hydrogen, $C_1$-$C_{18}$alkyl, or $C_1$-$C_{18}$alkoxy, and $R^8$ is H, $C_1$-$C_{18}$alkyl, or $C_1$-$C_{18}$alkyl which is substituted by E and/or interrupted by D, especially $C_1$-$C_{18}$alkyl which is interrupted by —O—, wherein D and E are as defined above.

In said aspect of the present invention terpolymers comprising a repeating unit of formula

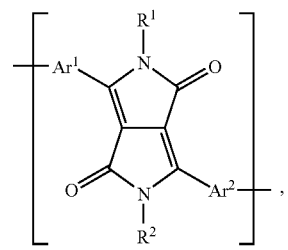

a repeating unit of formula

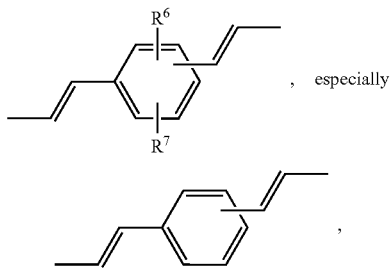

, especially

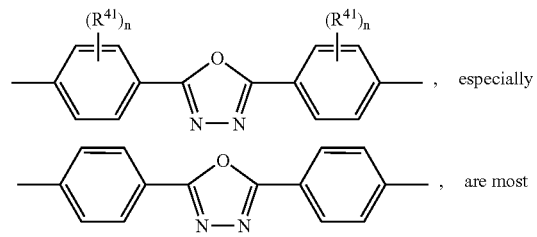

, and a repeating unit of formula

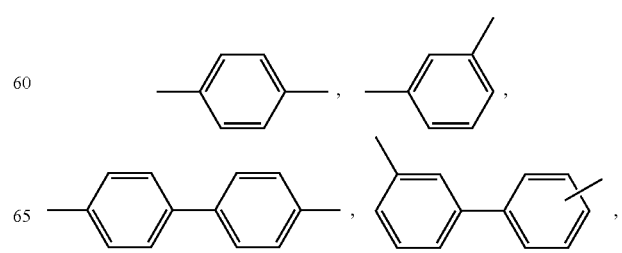

, especially

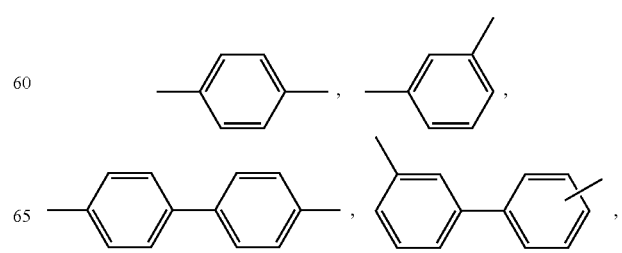

, are most preferred, wherein $R^1$ and $R^2$ are independently of each other a $C_1$-$C_{25}$alkyl group, especially a $C_4$-$C_{12}$alkyl group, which can be interrupted by one or more oxygen atoms, and $Ar^1$ and $Ar^2$ are independently of each other a group of formula -continued

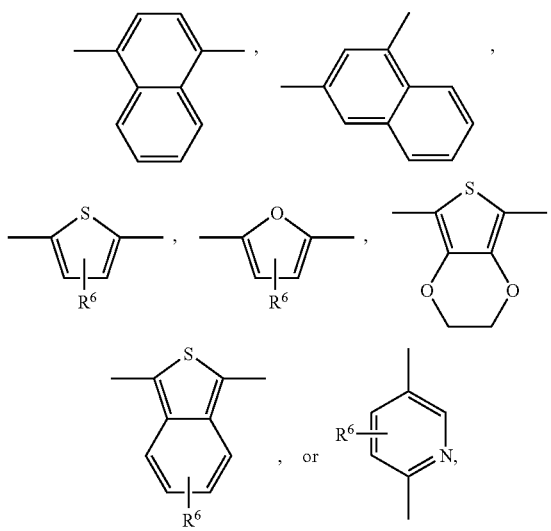

$R^6$ and $R^7$ are as defined above and are preferably H, halogen, CN, $C_1$-$C_{12}$alkyl, $C_1$-$C_{12}$alkoxy, or $C_6$-$C_{14}$aryl, more preferably H, $C_1$-$C_{12}$alkyl, or $C_1$-$C_{18}$alkoxy, $R^{41}$ is Cl, F, CN, $N(R^{45})_2$, $C_1$-$C_{18}$alkyl, $C_1$-$C_{18}$alkoxy, or $C_6$-$C_{14}$aryl, n is 0, 1, or 2 and $R^{45}$ is as defined above.

In another preferred embodiment the present invention relates to polymers, wherein the polymer comprises repeating units of formula

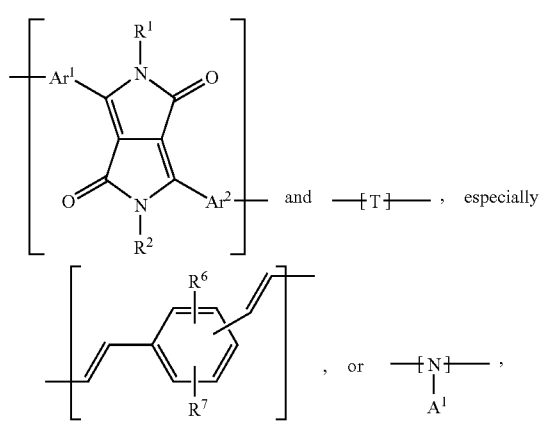

and —[T]—, especially

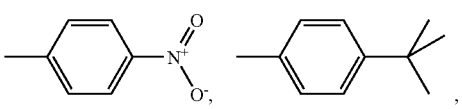

, or —[N]—,
       $A^1$ more preferably

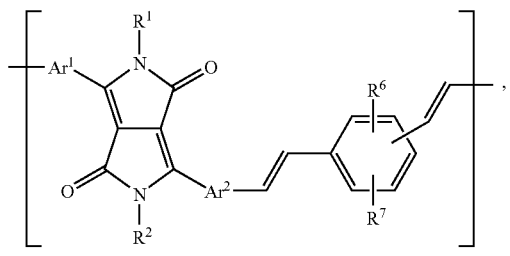

most preferably

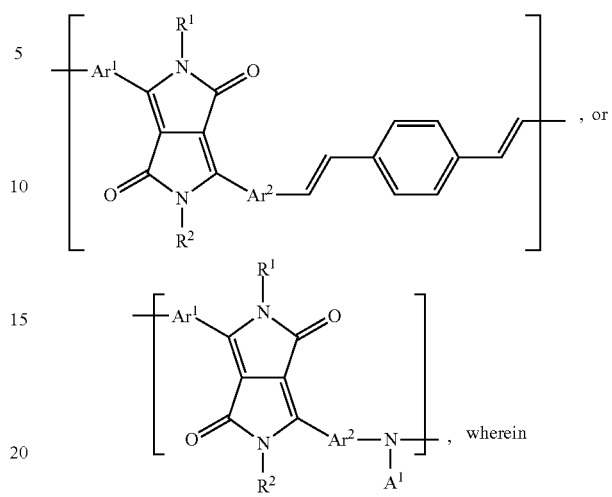

, wherein $R^1$ and $R^2$ are independently of each other a $C_1$-$C_{25}$alkyl group, especially a $C_4$-$C_{12}$alkyl group, which can be interrupted by one or more oxygen atoms, $R^6$ and $R^7$ are as defined above and are especially H, halogen, CN, $C_1$-$C_{12}$alkyl, $C_1$-$C_{12}$alkoxy, or $C_6$-$C_{14}$aryl, $A^1$ is a $C_6$-$C_{24}$aryl group, a $C_2$-$C_{30}$heteroaryl group, which can be substituted by one or more non-aromatic groups $R^{41}$, or $NO_2$, preferably a phenyl group, which is substituted by $C_1$-$C_4$alkyl, or $NO_2$, in particular

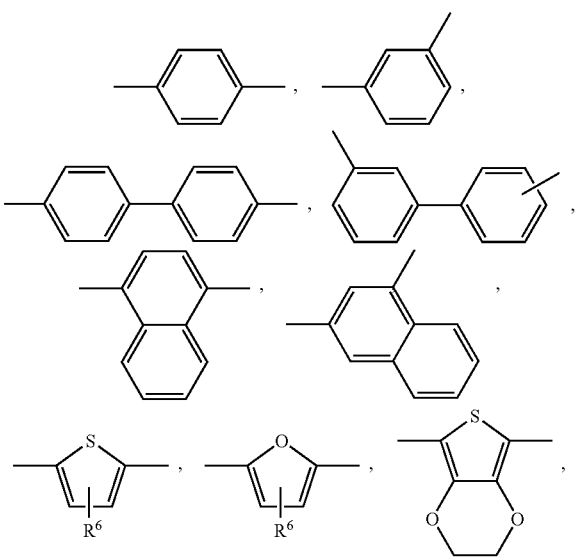

or an anthryl group, in particular an anthr-2-yl group, and $Ar^1$ and $Ar^2$ are independently of each other a group of formula

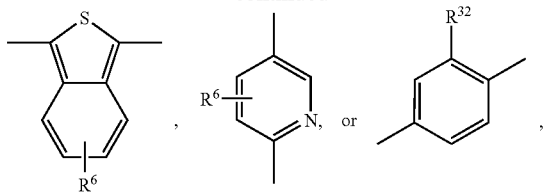 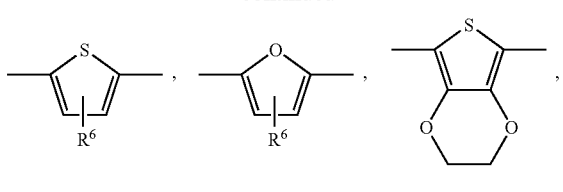

wherein $R^6$ is hydrogen, $C_1$-$C_{18}$alkyl, or $C_1$-$C_{18}$alkoxy, and $R^{32}$ is methyl, Cl, or In another preferred embodiment the polymer comprises a repeating unit of formula

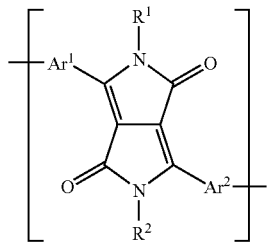

(I)

and a repeating unit

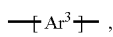, wherein $R^1$ and $R^2$ are independently of each other a $C_1$-$C_{25}$alkyl group, especially a $C_4$-$C_{12}$alkyl group, which can be interrupted by one or more oxygen atoms, and $Ar^1$ and $Ar^2$ are independently of each other a group of formula

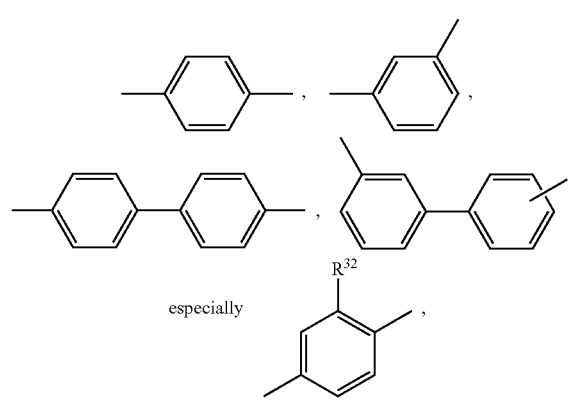

wherein $R^{32}$ is methyl, Cl, or OMe,

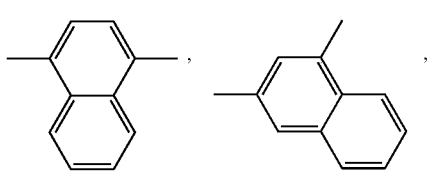

and —$Ar^3$— is a group of formula

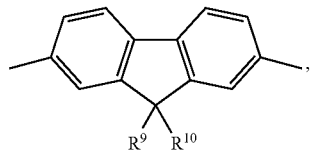

wherein $R^6$ is hydrogen, $C_1$-$C_{18}$alkyl, or $C_1$-$C_{18}$alkoxy, $R^9$ and $R^{10}$ are independently of each other H, $C_1$-$C_{18}$alkyl, which can optionally be interrupted by O, or $C_1$-$C_{18}$alkoxy, which can optionally be interrupted by O, $R^9$ and $R^{10}$ together form a group of formula =$CR^{100}R^{101}$, wherein $R^{100}$ and $R^{101}$ are independently of each other H, $C_1$-$C_{18}$alkyl, or $R^9$ $R^{10}$ together form a five or six membered ring, which optionally can be substituted by $C_1$-$C_{18}$alkyl.

In a particularly preferred embodiment the polymers are "homopolymers" which consist precisely of repeating units of formula

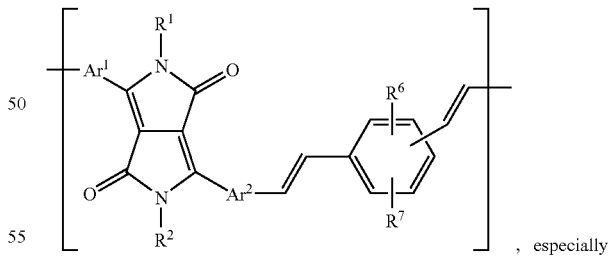, especially

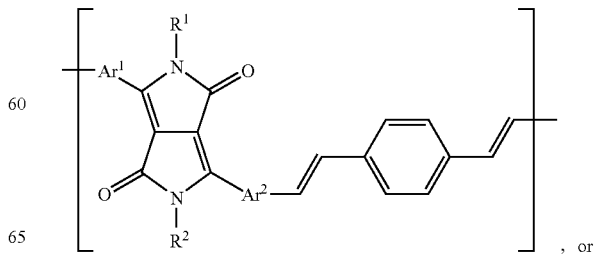, or

-continued

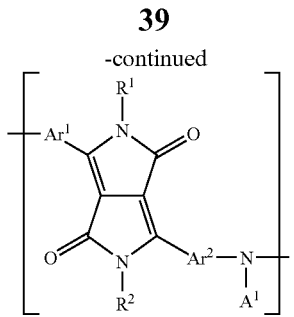

wherein $R^1$, $R^2$, $Ar^1$, $Ar^2$, $R^6$, $R^7$ and $A^1$ are as defined above.

The present invention is illustrated in more detail on the basis of an especially preferred embodiment below, but should not be limited thereto.

In said embodiment the polymer is a polymer of formula (VII)

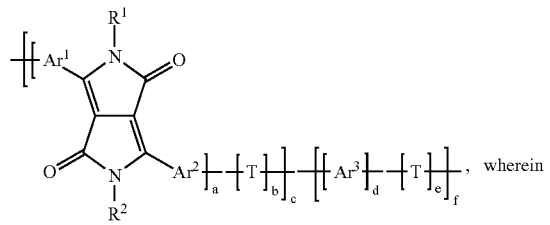 wherein $R^1$, $R^2$, $Ar^1$, $Ar^2$, T and $Ar^3$ are as defined above, a is 1, b is 0, or 1, c is 0.005 to 1, d is 0, or 1, e is 0, or 1, wherein e is not 1, if d is 0, f is 0.995 to 0, wherein the sum of c and f is 1.

$Ar^1$ and $Ar^2$ are preferably independently of each other a group of formula

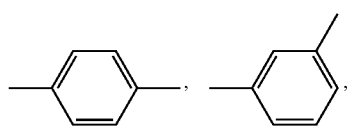

in particular a group of formula

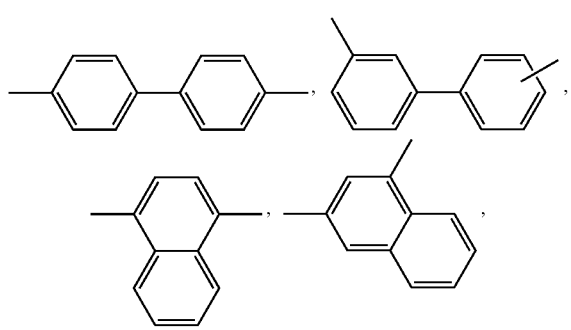

-continued

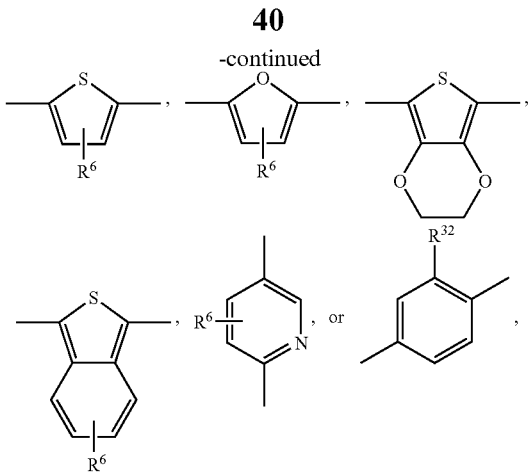

wherein $R^6$ is hydrogen, $C_1$-$C_{18}$alkyl, or $C_1$-$C_{18}$alkoxy, and $R^{32}$ is methyl, Cl, or OMe.

$R^1$ and $R^2$ are preferably independently of each other a $C_1$-$C_{25}$alkyl group, especially a $C_4$-$C_{12}$alkyl group, which can be interrupted by one or more oxygen atoms.

T is preferably a repeating unit of formula VIa, VIb or VIf and $Ar^3$ is preferably selected from repeating units of formula:

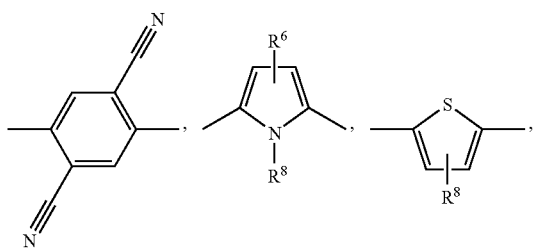

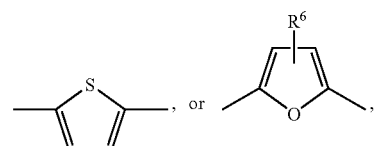

, and

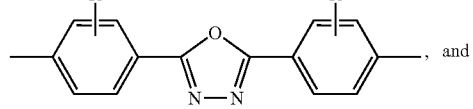, wherein $R^6$ is hydrogen, $C_1$-$C_{18}$alkyl, or $C_1$-$C_{18}$alkoxy, $R^8$ is H, $C_1$-$C_{18}$alkyl, or $C_1$-$C_{18}$alkyl which is substituted by E and/or interrupted by D, especially $C_1$-$C_{18}$alkyl which is interrupted by —O—, wherein D and E are as defined above.

Homopolymers of formula VII, wherein a=1, c=1, b=0, d=0, e=0, f=0, are, for example, obtained by nickel coupling reactions, especially the Yamamoto reaction:

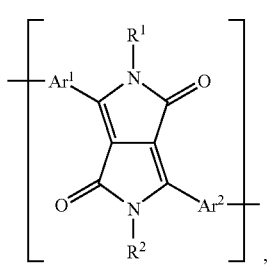

(VIIa)

wherein $R^1$, $R^2$, $Ar^1$ and $Ar^2$ are as defined above.

Copolymers of formula VII, involving repeating units of formula I and —$Ar^3$— (a=1, c=0.995 to 0.005, b=0, d=1, e=0, f=0.005 to 0.995), can also be obtained by nickel coupling reactions:

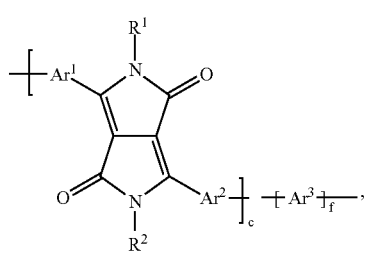

(VIIb)

wherein $R^1$, $R^2$, $Ar^1$, $Ar^2$ and $Ar^3$ are as defined above.

Polymerization processes involving only dihalo-functional reactants may be carried out using nickel coupling reactions. One such coupling reaction was described by Colon et al. in J. Pol. Sci., Part A, Polymer Chemistry Edition 28 (1990) 367, and by Colon et al. in J. Org. Chem. 51 (1986) 2627. The reaction is typically conducted in a polar aprotic solvent (e.g., dimethylacetamide) with a catalytic amount of nickel salt, a substantial amount of triphenylphosphine and a large excess of zinc dust. A variant of this process is described by Ioyda et al. in Bull. Chem. Soc. Jpn, 63 (1990) 80 wherein an organo-soluble iodide was used as an accelerator.

Another nickel-coupling reaction was disclosed by Yamamoto in Progress in Polymer Science 17 (1992) 1153 wherein a mixture of dihaloaromatic compounds were treated with an excess amount of nickel (1,5-cyclooctadiene) complex in an inert solvent. All nickel-coupling reactions when applied to reactant mixtures of two or more aromatic dihalides yield essentially random copolymers. Such polymerization reactions may be terminated by the addition of small amounts of water to the polymerization reaction mixture, which will replace the terminal halogen groups with hydrogen groups. Alternatively, a monofunctional aryl halide may be used as a chain-terminator in such reactions, which will result in the formation of a terminal aryl group.

Nickel-coupling polymerizations yield essentially homopolymers or random copolymers comprising DPP group-containing units and units derived from other co-monomers.

Homopolymers of formula VII, wherein a=1, c=1, b=0, d=1, e=0, f=1, can be obtained, for example, by the Suzuki reaction:

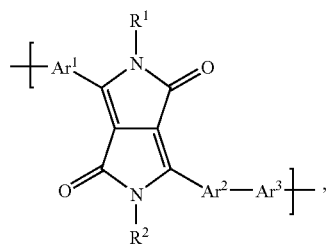

(VIIc)

wherein $R^1$, $R^2$, $Ar^1$, $Ar^2$ and $Ar^3$ are as defined above.

The condensation reaction of an aromatic boronate and a halogenide, especially a bromide, commonly referred to as the "Suzuki reaction", is tolerant of the presence of a variety of organic functional groups as reported by N. Miyaua and A. Suzuki in Chemical Reviews, Vol. 95, pp. 457-2483 (1995). This reaction can be applied to preparing high molecular weight polymers and copolymers.

To prepare polymers corresponding to formula VIIc, a dihalogenide, such as a dibromide or dichloride, especially a dibromide corresponding to formula

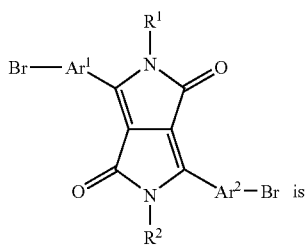

reacted with an equimolar amount of a diboronic acid or diboronate corresponding to formula $$X^{11}\!-\!\!\left[Ar^3\right]\!-\!X^{11},$$

wherein $X^{11}$ is independently in each occurrence —$B(OH)_2$, —$B(OY^1)_2$ or

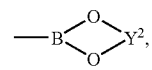

wherein $Y^1$ is independently in each occurrence a $C_1$-$C_{10}$alkyl group and $Y^2$ is independently in each occurrence a $C_2$-$C_{10}$alkylene group, such as —$CY^3Y^4$—$CY^5Y^6$—, or —$CY^7Y^8$—$CY^9Y^{10}$—$CY^{11}Y^{12}$—, wherein $Y^3$, $Y^4$, $Y^5$, $Y^6$, $Y^7$, $Y^8$, $Y^9$, $Y^{10}$, $Y^{11}$ and $Y^{12}$ are independently of each other hydrogen, or a $C_1$-$C_{10}$alkyl group, especially —$C(CH_3)_2C(CH_3)_2$—, or —$C(CH_3)_2CH_2C(CH_3)_2$—, under the catalytic action of Pd and triphenylphosphine. The reaction is typically conducted at about 70° C. to 180° C. in an aromatic hydrocarbon solvent such as toluene. Other solvents such as dimethylformamide and tetrahydrofuran can also be used alone, or in mixtures with an aromatic hydrocarbon. An aqueous base, preferably sodium carbonate or bicarbonate, is used as the HBr scavenger. Depending on the reactivities of the reactants, a polymerization reaction may take 2 to 100 hours. Organic bases, such as, for example, tetraalkylammonium hydroxide, and phase transfer catalysts, such as, for example TBAB, can promote the activity of the boron (see, for example, Leadbeater & Marco; Angew. Chem. Int. Ed. Eng. 42 (2003) 1407 and references cited therein). Other variations of reaction conditions are given by T. I. Wallow and B. M. Novak in J. Org. Chem. 59 (1994) 5034-5037; and M. Remmers, M. Schulze, and G. Wegner in Macromol. Rapid Commun. 17 (1996) 239-252.

If desired, a monofunctional aryl halide or aryl boronate may be used as a chain-terminator in such reactions, which will result in the formation of a terminal aryl group.

It is possible to control the sequencing of the monomeric units in the resulting copolymer by controlling the order and composition of monomer feeds in the Suzuki reaction.

Homopolymers of formula VII, wherein a=1, c=1, b=1, d=0, e=0, f=0, can be obtained, for example by the Heck reaction:

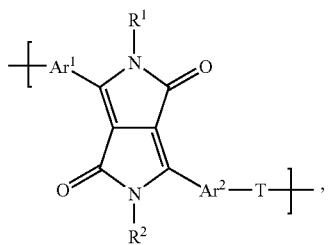
(VIId)

wherein $R^1$, $R^2$, $Ar^1$, $Ar^2$ and T are as defined above.

Polyphenylenethenylene derivatives and polyphenylenethynylene derivatives can be obtained by polymerization of divinyl or diethinyl compounds with dihalogen DPP compounds by the Heck reaction (R. F. Heck, Palladium Reagents in Organic Synthesis, Academic Press, New York 1985, pp. 179; L. S. Hegedus, Organometalics in Synthesis, Ed. M. Schlosser, Wiley, Chichester, UK 1994, pp. 383; Z. Bao, Y. Chen, R. Cai, L. Yu, Macromolecules 26 (1993) pp. 5281; W.-K. Chan, L. Yu, Macromolecules 28 (1995) pp. 6410; A. Hilberer, H.-J. Brouwer, B.-J. van der Scheer, J. Wildeman, G. Hadziioannou, Macromolecules 1995, 28, 4525):

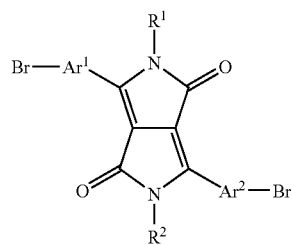

+

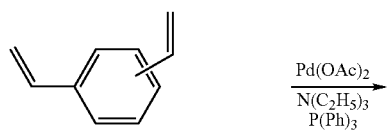

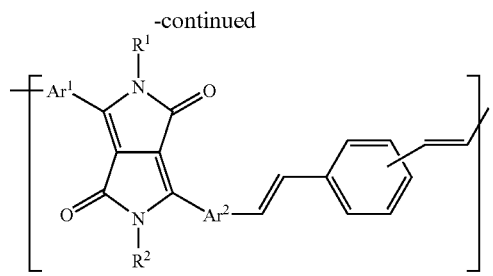

+

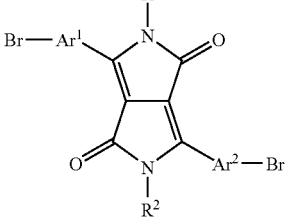

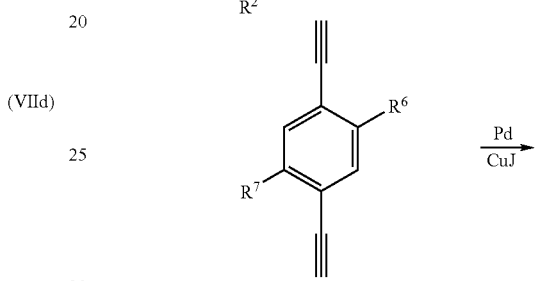

(Random) copolymers of formula VII, wherein a is 1, b is 1, c is 0.005 to 0.995, d is 1, e is 1, f is 0.995 to 0.005, wherein the sum of c and f is 1, can also be obtained by the Heck reaction:

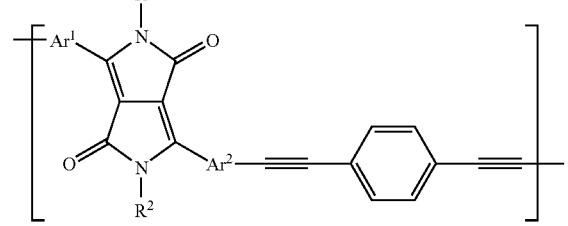

(VIIe)

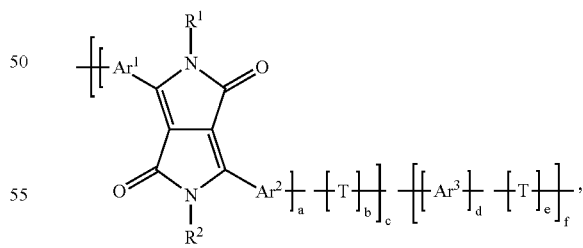

wherein $R^1$, $R^2$, $R^6$, $R^7$, $Ar^1$, $Ar^2$, $Ar^3$ and T are as defined above.

Halogen derivatives of the DPPs can be polymerized oxidatively (for example using $FeCl_3$, see, inter alia, P. Kovacic et al., Chem. Ber. 87 (1987) 357 to 379; M. Wenda et al., Macromolecules 25 (1992) 5125) or electrochemically (see, inter alia, N. Saito et al., Polym. Bull. 30 (1993) 285).

In the Knoevenagel reaction, a bis-cyanomethyl-substituted aromatic compound is reacted with a dialdehyde DPP with addition of a base (see, for example, H. Hörhold et al., Plaste und Kautschuk 17, 1970, 84).

The polymers containing groups of formulas (I) may be prepared by any suitable process, but are preferably prepared by the processes described below.

The polymers of the present invention can optionally comprise end moieties $E^1$, wherein $E^1$ is an aryl moiety which may optionally be substituted with a reactive group capable of undergoing chain extension or crosslinking, or a tri($C_1$-$C_{18}$) alkylsiloxy group. As used herein, a reactive group capable of undergoing chain extension or crosslinking refers to any group which is capable of reacting with another of the same group or another group so as to form a link to prepare polymers. Preferably, such reactive group is a hydroxy, glycidyl ether, acrylate ester, methacrylate ester, ethenyl, ethynyl, maleimide, naphthimide, trifluorovinyl ether moiety or a cyclobutene moiety fused to the aromatic ring of $E^1$.

The polymers of the present invention, where $E^1$ are reactive groups as defined above, are capable of crosslinking to form solvent resistant, heat-resistant films at 100° C. or more, more preferably at 150° C. or more. Preferably, such crosslinking occurs at 350° C. or less, more preferably 300° C. or less and most preferably 250° C. or less. The crosslinkable polymers of the invention are stable at 100° C. or more and more preferably 150° C. or more. "Stable" as used herein means that such polymers do not undergo crosslinking or polymerization reactions at or below the stated temperatures. If a crosslinkable material is desired, $E^1$ is preferably a vinylphenyl, an ethynylphenyl, or 4-(or 3-)benzocyclobutenyl radical. In another embodiment, $E^1$ is selected from a group of phenolic derivatives of the formula —$C_6H_4$—O—Y, wherein Y is —H, —CN,

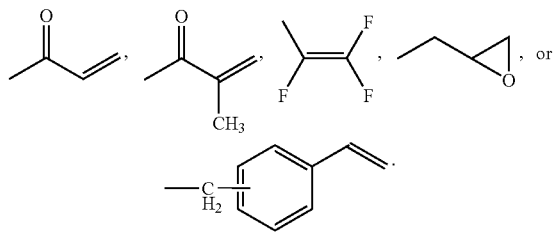

If desired, the cross-linkable groups can be present in other parts of the polymer chain. For example, one of the substituents of the co-monomer T may be a crosslinkable group $E^1$.

The end-capping agent $E^1$-X ($E^1$ is as defined above and X is either Cl or Br) is incorporated into the polymers of the present invention under the condition in which the resulting polymers are substantially capped by the reactive group $E^1$. The reactions useful for this purpose are the nickel-coupling, Heck reactions and Suzuki reactions described above. The average degree of polymerization is controlled by the mole ratio of monomers to end-capping agent.

The polymers according to the invention can be worked up by known methods which are familiar to the person skilled in the art, as described, for example, in D. Braun, H. Cherdron, H. Ritter, Praktikum der makromolekularen Stoffe, $1^{st}$ Edn., Wiley VCH, Weinheim 1999, p. 68-79 or R. J. Young, P. A. Lovell, Introduction to Polymers, Chapman & Hall, London 1991. For example, the reaction mixture can be filtered, diluted with aqueous acid, extracted and the crude product obtained after drying and stripping-off of the solvent can be further purified by reprecipitation from suitable solvents with addition of precipitants. Polymer-analogous reactions can subsequently be carried out for further functionalization of the polymer. Thus, for example, terminal halogen atoms can be removed reductively by reduction with, for example, $LiAlH_4$ (see, for example, J. March, Advanced Organic Chemistry, $3^{rd}$ Edn. McGraw-Hill, p. 510).

Another aspect of this invention is related to polymer blends containing 1 to 99 percent of at least one DPP containing polymers of this invention. The remainder 1 to 99 percent of the blend is composed of one or more polymeric materials selected from among chain growth polymers such as polystyrene, polybutadiene, poly(methyl methacrylate), and poly(ethylene oxide); step-growth polymers such as phenoxy resins, polycarbonates, polyamides, polyesters, polyurethanes, and polyimides; and crosslinked polymers such as crosslinked epoxy resins, crosslinked phenolic resins, crosslinked acrylate resins, and crosslinked urethane resins. Examples of these polymers may be found in Preparative Methods of Polymer Chemistry, W. R. Sorenson and T. W. Campbell, Second Edition, Interscience Publishers (1968). Also may be used in the blends are conjugated polymers such as poly(phenylene vinylene), substituted poly(phenylene vinylene)s, substituted polyphenylenes and polythiophenes. Examples of these conjugated polymers are given by Greenham and Friend in Solid State Physics, Vol. 49, pp. 1-149 (1995).

Halogen is fluorine, chlorine, bromine and iodine.

$C_1$-$C_{25}$alkyl is typically linear or branched, where possible. Examples are methyl, ethyl, n-propyl, isopropyl, n-butyl, sec.-butyl, isobutyl, tert.-butyl, n-pentyl, 2-pentyl, 3-pentyl, 2,2-dimethylpropyl, 1,1,3,3-tetramethylpentyl, n-hexyl, 1-methylhexyl, 1,1,3,3,5,5-hexamethylhexyl, n-heptyl, isoheptyl, 1,1,3,3-tetramethylbutyl, 1-methylheptyl, 3-methylheptyl, n-octyl, 1,1,3,3-tetramethylbutyl and 2-ethylhexyl, n-nonyl, decyl, undecyl, dodecyl, tridecyl, tetradecyl, pentadecyl, hexadecyl, heptadecyl, octadecyl, eicosyl, heneicosyl, docosyl, tetracosyl or pentacosyl. $C_1$-$C_8$alkyl is typically methyl, ethyl, n-propyl, isopropyl, n-butyl, sec.-butyl, isobutyl, tert.-butyl, n-pentyl, 2-pentyl, 3-pentyl, 2,2-dimethylpropyl, n-hexyl, n-heptyl, n-octyl, 1,1,3,3-tetramethylbutyl and 2-ethylhexyl. $C_1$-$C_4$alkyl is typically methyl, ethyl, n-propyl, isopropyl, n-butyl, sec.-butyl, isobutyl, tert.-butyl.

$C_1$-$C_{25}$alkoxy groups are straight-chain or branched alkoxy groups, e.g. methoxy, ethoxy, n-propoxy, isopropoxy, n-butoxy, sec-butoxy, tert-butoxy, amyloxy, isoamyloxy or tert-amyloxy, heptyloxy, octyloxy, isooctyloxy, nonyloxy, decyloxy, undecyloxy, dodecyloxy, tetradecyloxy, pentadecyloxy, hexadecyloxy, heptadecyloxy and octadecyloxy. Examples of $C_1$-$C_8$alkoxy are methoxy, ethoxy, n-propoxy, isopropoxy, n-butoxy, sec.-butoxy, isobutoxy, tert.-butoxy, n-pentoxy, 2-pentoxy, 3-pentoxy, 2,2-dimethylpropoxy, n-hexoxy, n-heptoxy, n-octoxy, 1,1,3,3-tetramethylbutoxy and 2-ethylhexoxy, preferably $C_1$-$C_4$alkoxy such as typically methoxy, ethoxy, n-propoxy, isopropoxy, n-butoxy, sec.-butoxy, isobutoxy, tert.-butoxy. The term "alkylthio group" means the same groups as the alkoxy groups, except that the oxygen atom of the ether linkage is replaced by a sulfur atom.

$C_2$-$C_{25}$alkenyl groups are straight-chain or branched alkenyl groups, such as e.g. vinyl, allyl, methallyl, isopropenyl, 2-butenyl, 3-butenyl, isobutenyl, n-penta-2,4-dienyl, 3-methyl-but-2-enyl, n-oct-2-enyl, n-dodec-2-enyl, isododecenyl, n-dodec-2-enyl or n-octadec-4-enyl.

$C_{2-24}$alkynyl is straight-chain or branched and preferably $C_{2-8}$alkynyl, which may be unsubstituted or substituted, such as, for example, ethynyl, 1-propyn-3-yl, 1-butyn-4-yl, 1-pentyn-5-yl, 2-methyl-3-butyn-2-yl, 1,4-pentadiyn-3-yl, 1,3-pentadiyn-5-yl, 1-hexyn-6-yl, cis-3-methyl-2-penten-4-yn- 1-yl, trans-3-methyl-2-penten-4-yn-1-yl, 1,3-hexadiyn-5-yl, 1-octyn-8-yl, 1-nonyn-9-yl, 1-decyn-10-yl, or 1-tetracosyn-24-yl.

The terms "haloalkyl, haloalkenyl and haloalkynyl" mean groups given by partially or wholly substituting the above-mentioned alkyl group, alkenyl group and alkynyl group with halogen, such as trifluoromethyl etc. The "aldehyde group, ketone group, ester group, carbamoyl group and amino group" include those substituted by an alkyl group, a cycloalkyl group, an aryl group, an aralkyl group or a heterocyclic group, wherein the alkyl group, the cycloalkyl group, the aryl group, the aralkyl group and the heterocyclic group may be unsubstituted or substituted. The term "silyl group" means a group of formula —$SiR^{62}R^{63}R^{64}$, wherein $R^{62}$, $R^{63}$ and $R^{64}$ are independently of each other a $C_1$-$C_8$alkyl group, in particular a $C_1$-$C_4$ alkyl group, a $C_6$-$C_{24}$aryl group or a $C_7$-$C_{12}$aralkyl group, such as a trimethylsilyl group. The term "siloxanyl group" means a group of formula —O—$SiR^{62}R^{63}R^{64}$, wherein $R^{62}$, $R^{63}$ and $R^{64}$ are as defined above, such as a trimethylsiloxanyl group.

The term "cycloalkyl group" is typically $C_5$-$C_{12}$cycloalkyl, such as cyclopentyl, cyclohexyl, cycloheptyl, cyclooctyl, cyclononyl, cyclodecyl, cycloundecyl, cyclododecyl, preferably cyclopentyl, cyclohexyl, cycloheptyl, or cyclooctyl, which may be unsubstituted or substituted. The term "cycloalkenyl group" means an unsaturated alicyclic hydrocarbon group containing one or more double bonds, such as cyclopentenyl, cyclopentadienyl, cyclohexenyl and the like, which may be unsubstituted or substituted. The cycloalkyl group, in particular a cyclohexyl group, can be condensed one or two times by phenyl which can be substituted one to three times with $C_1$-$C_4$-alkyl, halogen and cyano. Examples of such condensed cyclohexyl groups are:

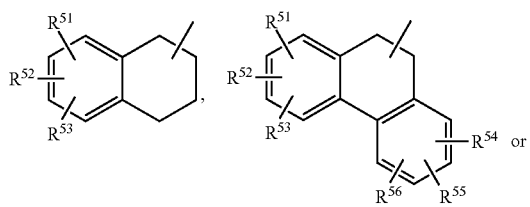

in particular

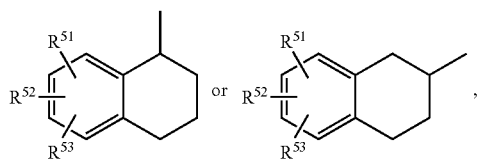

wherein $R^{51}$, $R^{52}$, $R^{53}$, $R^{54}$, $R^{55}$ and $R^{56}$ are independently of each other $C_1$-$C_8$-alkyl, $C_1$-$C_8$-alkoxy, halogen and cyano, in particular hydrogen.

Aryl is usually $C_6$-$C_{30}$aryl, preferably $C_6$-$C_{24}$aryl, which optionally can be substituted, such as, for example, phenyl, 4-methylphenyl, 4-methoxyphenyl, naphthyl, especially 1-naphthyl, or 2-naphthyl, biphenylyl, terphenylyl, pyrenyl, 2- or 9-fluorenyl, phenanthryl, anthryl, tetracyl, pentacyl, hexacyl, or quaderphenylyl, which may be unsubstituted or substituted.

The term "aralkyl group" is typically $C_7$-$C_{24}$aralkyl, such as benzyl, 2-benzyl-2-propyl, β-phenyl-ethyl, α,α-dimethylbenzyl, ω-phenyl-butyl, ω,ω-dimethyl-ω-phenyl-butyl, ω-phenyl-dodecyl, ω-phenyl-octadecyl, ω-phenyl-eicosyl or ω-phenyl-docosyl, preferably $C_7$-$C_{18}$aralkyl such as benzyl, 2-benzyl-2-propyl, β-phenyl-ethyl, α,α-dimethylbenzyl, ω-phenyl-butyl, ω,ω-dimethyl-ω-phenyl-butyl, ω-phenyl-dodecyl or ω-phenyl-octadecyl, and particularly preferred $C_7$-$C_{12}$aralkyl such as benzyl, 2-benzyl-2-propyl, β-phenyl-ethyl, α,α-dimethylbenzyl, ω-phenyl-butyl, or ω,ω-dimethyl-ω-phenyl-butyl, in which both the aliphatic hydrocarbon group and aromatic hydrocarbon group may be unsubstituted or substituted.

The term "aryl ether group" is typically a $C_{6-24}$aryloxy group, that is to say O—$C_{6-24}$aryl, such as, for example, phenoxy or 4-methoxyphenyl. The term "aryl thioether group" is typically a $C_{6-24}$arylthio group, that is to say S—$C_{6-24}$aryl, such as, for example, phenylthio or 4-methoxyphenylthio. The term "carbamoyl group" is typically a $C_{1-18}$carbamoyl radical, preferably $C_{1-8}$carbamoyl radical, which may be unsubstituted or substituted, such as, for example, carbamoyl, methylcarbamoyl, ethylcarbamoyl, nbutylcarbamoyl, tert-butylcarbamoyl, dimethylcarbamoyloxy, morpholinocarbamoyl or pyrrolidinocarbamoyl.

The terms "aryl" and "alkyl" in alkylamino groups, dialkylamino groups, alkylarylamino groups, arylamino groups and diaryl groups are typically $C_1$-$C_{25}$alkyl and $C_6$-$C_{24}$aryl, respectively.

Alkylaryl refers to alkyl-substituted aryl radicals, especially $C_7$-$C_{12}$alkylaryl. Examples are tolyl, such as 3-methyl-, or 4-methylphenyl, or xylyl, such as 3,4-dimethylphenyl, or 3,5-dimethylphenyl.

Heteroaryl is typically $C_2$-$C_{26}$heteroaryl, i.e. a ring with five to seven ring atoms or a condensed ring system, wherein nitrogen, oxygen or sulfur are the possible hetero atoms, and is typically an unsaturated heterocyclic group with five to 30 atoms having at least six conjugated π-electrons such as thienyl, benzo[b]thienyl, dibenzo[b,d]thienyl, thianthrenyl, furyl, furfuryl, 2H-pyranyl, benzofuranyl, isobenzofuranyl, dibenzofuranyl, phenoxythienyl, pyrrolyl, imidazolyl, pyrazolyl, pyridyl, bipyridyl, triazinyl, pyrimidinyl, pyrazinyl, pyridazinyl, indolizinyl, isoindolyl, indolyl, indazolyl, purinyl, quinolizinyl, chinolyl, isochinolyl, phthalazinyl, naphthyridinyl, chinoxalinyl, chinazolinyl, cinnolinyl, pteridinyl, carbazolyl, carbolinyl, benzotriazolyl, benzoxazolyl, phenanthridinyl, acridinyl, pyrimidinyl, phenanthrolinyl, phenazinyl, isothiazolyl, phenothiazinyl, isoxazolyl, furazanyl or phenoxazinyl, which can be unsubstituted or substituted.

Examples of a five or six membered ring formed by, for example, $R^{16}$ and $R^{17}$, or $R^{65}$ and $R^{66}$, respectively are heterocycloalkanes or heterocycloalkenes having from 3 to 5 carbon atoms which can have one additional hetero atom selected from nitrogen, oxygen and sulfur, for example

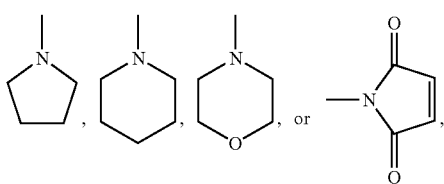

which can be part of a bicyclic system, for example

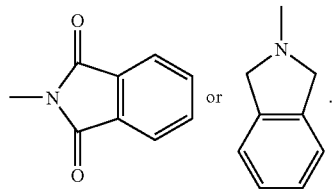

Possible substituents of the above-mentioned groups are $C_1$-$C_8$alkyl, a hydroxyl group, a mercapto group, $C_1$-$C_8$alkoxy, $C_1$-$C_8$alkylthio, halogen, halo-$C_1$-$C_8$alkyl, a cyano group, an aldehyde group, a ketone group, a carboxyl group, an ester group, a carbamoyl group, an amino group, a nitro group or a silyl group.

If a substituent, such as, for example $R^6$ and $R^7$ occurs more than one time in a group, it can be different in each occurrence.

As described above, the aforementioned groups may be substituted by E and/or, if desired, interrupted by D. Interruptions are of course possible only in the case of groups containing at least 2 carbon atoms connected to one another by single bonds; $C_6$-$C_{18}$aryl is not interrupted; interrupted arylalkyl or alkylaryl contains the unit D in the alkyl moiety. $C_1$-$C_{18}$alkyl substituted by one or more E and/or interrupted by one or more units D is, for example, $(CH_2CH_2O)_{1-9}$—$R^x$, where $R^x$ is H or $C_1$-$C_{10}$alkyl or $C_2$-$C_{10}$alkanoyl (e.g. CO—CH($C_2H_5$)$C_4H_9$), $CH_2$—CH(O$R^y$)—$CH_2$—O—$R^y$, where $R^y$ is $C_1$-$C_{18}$alkyl, $C_5$-$C_{12}$cycloalkyl, phenyl, $C_7$-$C_{15}$phenylalkyl, and $R^{y\prime}$ embraces the same definitions as $R^y$ or is H;
$C_1$-$C_8$alkylene-COO—$R^z$, e.g. $CH_2COOR_z$, $CH(CH_3)$COO$R^z$, $C(CH_3)_2$COO$R^z$, where $R^z$ is H, $C_1$-$C_{18}$alkyl, $(CH_2CH_2O)_{1-9}$—$R^x$, and $R^x$ embraces the definitions indicated above; $CH_2CH_2$—O—CO—CH=$CH_2$; $CH_2CH(OH)$ $CH_2$—O—CO—$C(CH_3)$=$CH_2$.

Preferred arylene radicals are 1,4-phenylene, 2,5-tolylene, 1,4-naphthylene, 1,9 antracylene, 2,7-phenantrylene and 2,7-dihydrophenantrylene.

Preferred heteroarylene radicals are 2,5-pyrazinylene, 3,6-pyridazinylene, 2,5-pyridinylene, 2,5-pyrimidinylene, 1,3,4-thiadiazol-2,5-ylene, 1,3-thiazol-2,4-ylene, 1,3-thiazol-2,5-ylene, 2,4-thiophenylene, 2,5-thiophenylene, 1,3-oxazol-2,4-ylene, 1,3-oxazol-2,5-ylene and 1,3,4-oxadiazol-2,5-ylene, 2,5-indenylene and 2,6-indenylene.

Another aspect of the invention is the films formed from the polymers of the invention. Such films can be used in polymeric light-emitting diodes (PLEDs). Preferably, such films are used as emitting layers. These films may also be used as protective coatings for electronic devices and as fluorescent coatings. The thickness of the coating or film is dependent upon the ultimate use. Generally, such thickness can be from 0.01 to 200 microns. In that embodiment wherein the coating is used as a fluorescent coating, the coating or film thickness is from 50 to 200 microns. In that embodiment where the coatings are used as electronic protective layers, the thickness of the coating can be from 5 to 20 microns. In that embodiment where the coatings are used in a polymeric light-emitting diode, the thickness of the layer formed is 0.01 to 0.5 microns. The polymers of the invention form good pinhole- and defect-free films. Such films can be prepared by means well known in the art including spin-coating, spray-coating, dip-coating and roller-coating. Such coatings are prepared by a process comprising applying a composition to a substrate and exposing the applied composition to conditions such that a film is formed. The conditions which form a film depend upon the application technique and the reactive end groups of the aryl moiety. In a preferred embodiment, the composition applied to the substrate comprises the DPP polymers dissolved in a common organic solvent. Preferably, the solution contains from 0.1 to 10 weight percent of the polymers. This composition is applied to the appropriate substrate by the desired method and the solvent is allowed to evaporate. Residual solvent may be removed by vacuum and/or by heat. After removal of the solvent, the coating is then exposed to the necessary conditions to cure the film, if needed, to prepare a film having high solvent and heat resistance. The films are preferably substantially uniform in thickness and substantially free of pinholes. In another embodiment, the polymers may be partially cured. This is known as B-staging.

A further embodiment of the present invention is directed to an electronic device or a component therefore, comprising a substrate and a polymer according to the present invention.

In such a device the polymers according to the present invention are used as electroluminescent material. For the purposes of the present invention, the term "electroluminescent material" is taken to mean materials which can be used as or in an active layer in an electroluminescent device. The term "active layer" means that the layer is capable of emitting light (light-emitting layer) on application of an electric field and/or that it improves the injection and/or transport of the positive and/or negative charges (charge injection or charge transport layer). The invention therefore also relates to the use of the polymers according to the invention as electroluminescent material. The invention furthermore relates to an electroluminescent material which comprises the polymers according to the invention. Electroluminescent devices are used, for example, as self-illuminating display elements, such as control lamps, alphanumeric displays, signs and in opto-electronic couplers.

A device according to the present invention may be prepared in accordance with the disclosure of WO99/48160, the contents of which are incorporated by reference. Polymers according to the present invention may be present in the device as the sole light emitting polymer or as a component in a blend further comprising hole and/or electron transporting polymers. Alternatively, the device may comprise distinct layers of a polymer of the present invention, a hole transporting polymer and/or an electron transporting polymer.

In one embodiment the electronic device comprises an electroluminescent device, which comprises
(a) a charge injecting layer for injecting positive charge carriers,
(b) a charge injecting layer for injecting negative charge carriers,
(c) a light-emissive layer located between the layers (a) and (b) comprising a polymer according to the present invention.

The layer (a) may be a positive charge carrier transport layer which is located between the light emissive layer (c) and an anode electrode layer, or may be an anode electrode layer. The layer (b) may be a negative charge carrier transport layer which is located between the light emissive layer (c) and an cathode electrode layer, or may be an cathode electrode layer. Optionally, an organic charge transport layer can be located between the light emissive layer (c) and one of the charge carrier injecting layers (a) and (b).

The EL device emits light between 400 nm and 800 nm, preferably between 500 nm and 700 nm, and more preferably between 550 nm and 700 nm.

It will be appreciated that the light emissive layer may be formed from a blend or mixture of materials including one or more polymers according to the present invention, and optionally further different polymers. The further different polymers may be so-called hole transport polymers (i.e. to improve the efficiency of hole transport to the light-emissive material) or electron-transport polymers (i.e. to improve the efficiency of electron transport to the light-emissive material). Preferably, the blend or mixture would comprise at least 0.1% by weight of a polymer according to the present invention, preferably from 0.2 to 50%, more preferably from 0.5 to 30% by weight.

An organic EL device typically consists of an organic film sandwiched between an anode and a cathode such that when a positive bias is applied to the device, holes are injected into the organic film from the anode, and electrons are injected into the organic film from the cathode. The combination of a hole and an electron may give rise to an exciton, which may undergo radiative decay to the ground state by liberating a photon. In practice the anode is commonly an mixed oxide of tin and indium for its conductivity and transparency. The mixed oxide (ITO) is deposited on a transparent substrate such as glass or plastic so that the light emitted by the organic film may be observed. The organic film may be the composite of several individual layers each designed for a distinct function. Since holes are injected from the anode, the layer next to the anode needs to have the functionality of transporting holes. Similarly, the layer next to the cathode needs to have the functionality of transporting electrons. In many instances, the hole-(electron) transporting layer also acts as the emitting layer. In some instances one layer can perform the combined functions of hole and electron transport and light emission. The individual layers of the organic film may be all polymeric in nature or combinations of films of polymers and films of small molecules deposited by thermal evaporation. It is preferred that the total thickness of the organic film be less than 1000 nanometers (nm). It is more preferred that the total thickness be less than 500 nm. It is most preferred that the total thickness be less than 300 nm. It is preferred that the thickness of the active (light emitting) layer be less than 400 nanometers (nm). It is more preferred that the thickness is in the range of from 40 to 160 nm.

The ITO-glass, which serves as the substrate and the anode, may be used for coating after the usual cleaning with detergent, organic solvents and UV-ozone treatment. It may also be first coated with a thin layer of a conducting substance to facilitate hole injection. Such substances include copper phthalocyanine, polyaniline (PANI) and poly(3,4-ethylenedioxy-thiophene) (PEDOT); the last two in their (doped) conductive forms, doped, for example, with $FeCl_3$ or $Na_2S_2O_8$. They contain poly(styrenesulfonic acid) (PSS) as counter-ion to ensure water solubility. It is preferred that the thickness of this layer be 200 nm or less; it is more preferred that the thickness be 100 nm or less.

In the cases where a hole-transporting layer is used, the polymeric arylamines described in U.S. Pat. No. 5,728,801, may be used. Other known hole-conducting polymers, such as polyvinylcarbazole, may also be used. The resistance of this layer to erosion by the solution of the copolymer film which is to be applied next is obviously critical to the successful fabrication of multi-layer devices. The thickness of this layer may be 500 nm or less, preferably 300 nm or less, most preferably 150 nm or less.

In the case where an electron-transporting layer is used, it may be applied either by thermal evaporation of low molecular weight materials or by solution coating of a polymer with a solvent that would not cause significant damage to the underlying film.

Examples of low molecular weight materials include the metal complexes of 8-hydroxyquinoline (as described by Burrows et al. in Appl. Phys. Lett. 64 (1994) 2718-2720), metallic complexes of 10-hydroxybenzoquinoline (as described by Hamada et al. in Chem. Lett. (1993) 906-906), 1,3,4-oxadiazoles (as described by Hamada et al. in Optoelectronics-Devices and Technologies 7 (1992) 83-93), 1,3,4-triazoles (as described by Kido et al. in Chem. Lett. (1996) 47-48), and dicarboximides of perylene (as described by Yoshida et al. in Appl. Phys. Lett. 69 (1996) 734-736).

Polymeric electron-transporting materials are exemplified by 1,3,4-oxadiazole-containing polymers (as described by Li et al. in J. Chem. Soc. (1995) 2211-2212, by Yang and Pei in J. Appl. Phys. 77 (1995) 4807-4809), 1,3,4-triazole-containing polymers (as described by Strukelj et al. in Science 267 (1995) 1969-1972), quinoxaline-containing polymers (as described by Yamamoto et al. in Jpn. J. Appl. Phys. 33 (1994) L250-L253, O'Brien et al. in Synth. Met. 76 (1996) 105-108), and cyano-PPV (as described by Weaver et al. in Thin Solid Films 273 (1996) 39-47). The thickness of this layer may be 500 nm or less, preferably 300 nm or less, most preferably 150 nm or less.

The cathode material may be deposited either by thermal evaporation or by sputtering. The thickness of the cathode may be from 1 nm to 10,000 nm, preferably 5 nm to 5,000 nm.

In a preferred embodiment, the electroluminescent device comprises at least one hole-transporting polymer film and a light-emitting polymer film comprised of the polymer of the invention, arranged between an anode material and a cathode material such that under an applied voltage, holes are injected from the anode material into the hole-transporting polymer film and electrons are injected from the cathode material into the light-emitting polymer films when the device is forward biased, resulting in light emission from the light-emitting layer.

In another preferred embodiment, layers of hole-transporting polymers are arranged so that the layer closest to the anode has the lower oxidation potential, with the adjacent layers having progressively higher oxidation potentials. By these methods, electroluminescent devices having relatively high light output per unit voltage may be prepared.

The term "hole-transporting polymer film" as used herein refers to a layer of a film of a polymer which when disposed between two electrodes to which a field is applied and holes are injected from the anode, permits adequate transport of holes into the emitting polymer. Hole-transporting polymers typically are comprised of triarylamine moieties. The term "light-emitting polymer film" as used herein refers to a layer of a film of a polymer whose excited states can relax to the ground state by emitting photons, preferably corresponding to wavelengths in the visible range. The term "anode material" as used herein refers to a semi-transparent, or transparent, conducting film with a work function between 4.5 electron volts (eV) and 5.5 eV. Examples are gold, silver, copper, aluminum, indium, iron, zinc, tin, chromium, titanium, vanadium, cobalt, nickel, lead, manganese, tungsten and the like, metallic alloys such as magnesium/copper, magnesium/silver, magnesium/aluminum, aluminum/indium and the like, semiconductors such as Si, Ge, GaAs and the like, metallic oxides such as indium-tin-oxide ("ITO"), ZnO and the like, metallic compounds such as CuI and the like, and furthermore, electroconducting polymers such polyacetylene, polyaniline, polythiophene, polypyrrole, polyparaphenylene and the like. Oxides and mixed oxides of indium and tin, and gold are preferred. Most preferred is ITO, especially ITO on glass, or on a plastics material, such as polyester, for example polyethylene terephthalate (PET), as substrate.

The term "cathode material" as used herein refers to a conducting film with a work function between 2.5 eV and 4.5 eV. Examples are alkali metals, earth alkaline metals, group 13 elements, silver, and copper as well as alloys or mixtures thereof such as sodium, lithium, potassium, calcium, lithium fluoride (LiF), sodium-potassium alloy, magnesium, magnesium-silver alloy, magnesium-copper alloy, magnesium-aluminum alloy, magnesium-indium alloy, aluminum, aluminum-aluminum oxide alloy, aluminum-lithium alloy, indium, calcium, and materials exemplified in EP-A 499,011, such as electroconducting polymers e.g. polypyrrole, polythiophene, polyaniline, polyacetylene etc. Preferably lithium, calcium, magnesium, indium, silver, aluminum, or blends and alloys of the above are used. In the case of using a metal or a metallic alloy as a material for an electrode, the electrode can be formed also by the vacuum deposition method. In the case of using a metal or a metallic alloy as a material forming an electrode, the electrode can be formed, furthermore, by the chemical plating method (see for example, Handbook of Electrochemistry, pp 383-387, Mazuren, 1985). In the case of using an electroconducting polymer, an electrode can be made by forming it into a film by means of anodic oxidation polymerization method onto a substrate, which is previously provided with an electroconducting coating.

As methods for forming said thin films, there are, for example, the vacuum deposition method, the spin-coating method, the casting method, the Langmuir-Blodgett ("LB") method, the ink jet printing method and the like. Among these methods, the vacuum deposition method, the spin-coating method, the ink jet printing method and the casting method are particularly preferred in view of ease of operation and cost.

In the case of forming the layers by using the spin-coating method, the casting method and ink jet printing method, the coating can be carried out using a solution prepared by dissolving the composition in a concentration of from 0.0001 to 90% by weight in an appropriate organic solvent such as benzene, toluene, xylene, tetrahydrofurane, methyltetrahydrofurane, N,N-dimethylformamide, acetone, acetonitrile, anisole, dichloromethane, dimethylsulfoxide and the like.

The organic EL device of the present invention has significant industrial values since it can be adapted for a flat panel display of an on-wall television set, a flat light-emitting device, a light source for a copying machine or a printer, a light source for a liquid crystal display or counter, a display signboard and a signal light. The polymers and compositions of the present invention can be used in the fields of an organic EL device, a photovoltaic device, an electrophotographic photoreceptor, a photoelectric converter, a solar cell, an image sensor, and the like.

Accordingly, the present invention relates also to PLEDs, organic integrated circuits (O-ICs), organic field effect transistors (OFETs), organic thin film transistors (OTFTs), organic solar cells (O-SCs), or organic laser diodes comprising one or more of the polymers according to the present invention.

The following examples are included for illustrative purposes only and do not limit the scope of the claims. Unless otherwise stated, all parts and percentages are by weight.

EXAMPLES

Example 1

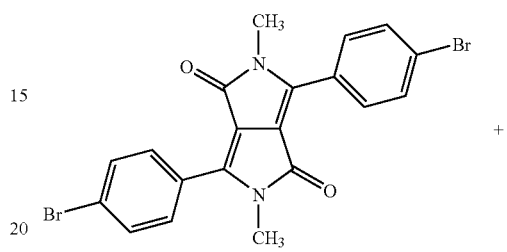

+

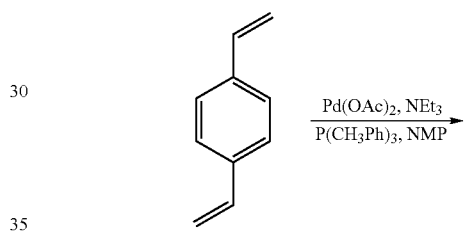

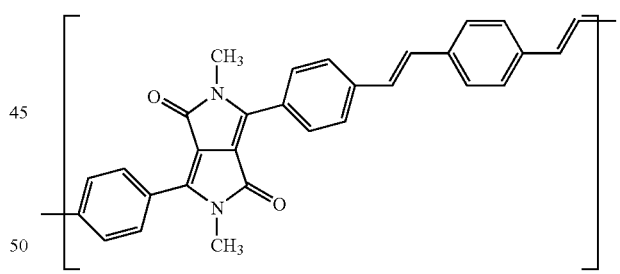

0.010 g (0.04 mmol) Palladium(II)acetate and 0.067 g (0.22 mmol) tris(o-tolyl)phosphine in 10 ml N-methyl-2-pyrrolidone (NMP) are added to 0.143 g (1.10 mmol) 1,4-divinylbenzene and 0.520 g (1.10 mmol) 1,4-dioxo-2,5-di-n-hexyl-3,6-bis(bromophenyl)pyrrolo[3,4-c]pyrrole (prepared according to the method(s) described in EP-A-1087005, EP-A-1087006, or EP-A-133156) under a nitrogen atmosphere and stirred at room temperature for 30 minutes. After addition of 0.4 ml (2.89 mmol) triethylamine the reaction mixture is heated at 100° C. for 24 hours. The suspension is slurried in 100 ml methanol. The precipitate is filtered off and washed with methanol (3×100 ml). Low molecular weight impurities can be separated from the crude polymer by soxhlet-extraction in methanol.

Yield: 0.439 g
$M_w$: 41000
UV/Vis-absorption in $CHCl_3$: 499 nm
Fluorescence in $CHCl_3$: 565 nm Example 2

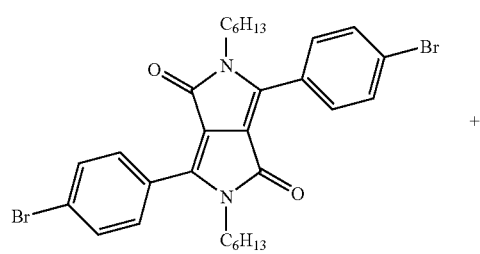

+

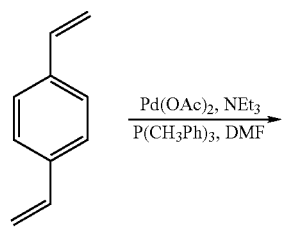

$\xrightarrow{Pd(OAc)_2, NEt_3}{P(CH_3Ph)_3, DMF}$

-continued

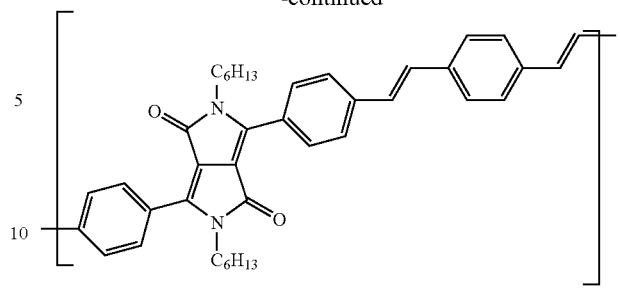

0.024 g (0.11 mmol) Palladium(II)acetate and 0.165 g (0.54 mmol) tris(o-tolyl)phosphine in 20 ml dimethylformamide (DMF) are added to 0.353 g (2.71 mmol) 1,4-divinylbenzene and 1.666 g (2.71 mmol) 1,4-dioxo-2,5-di-n-hexyl-3,6-bis(bromophenyl)pyrrolo[3,4-c]pyrrole under a nitrogen atmosphere and stirred at room temperature for 30 minutes. After addition of 0.9 ml (6.78 mmol) triethylamine the reaction mixture is heated at 100° C. for 42 hours. After 10 ml DMF have been removed in vacuum, the formed polymer is precipitated by adding 200 ml Methanol. The precipitate is dissolved in 110 ml chloroform and added dropwise to 800 ml methanol. The precipitated polymer is filtered off and dried under high vacuum.

Yield: 1.322 g
$M_w$: 31000
UV/Vis absorption in $CHCl_3$: 529 nm
Fluorescence in $CHCl_3$: 579 nm Example 3

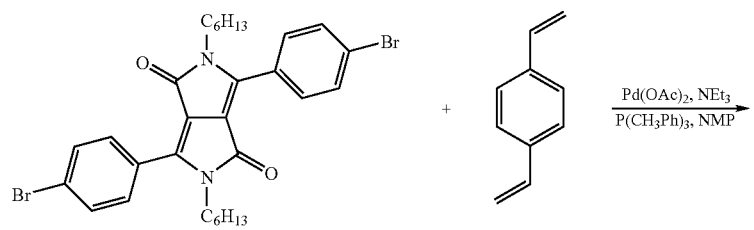

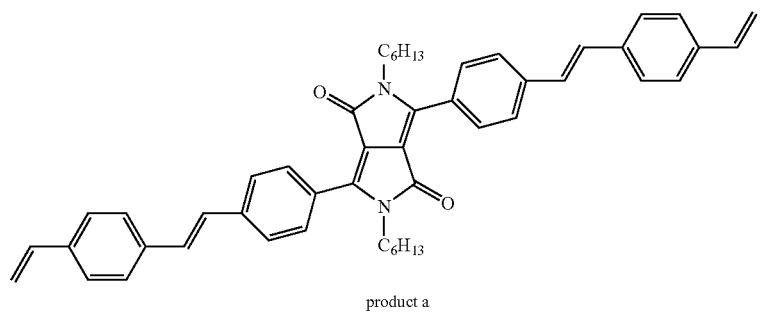

product a

+

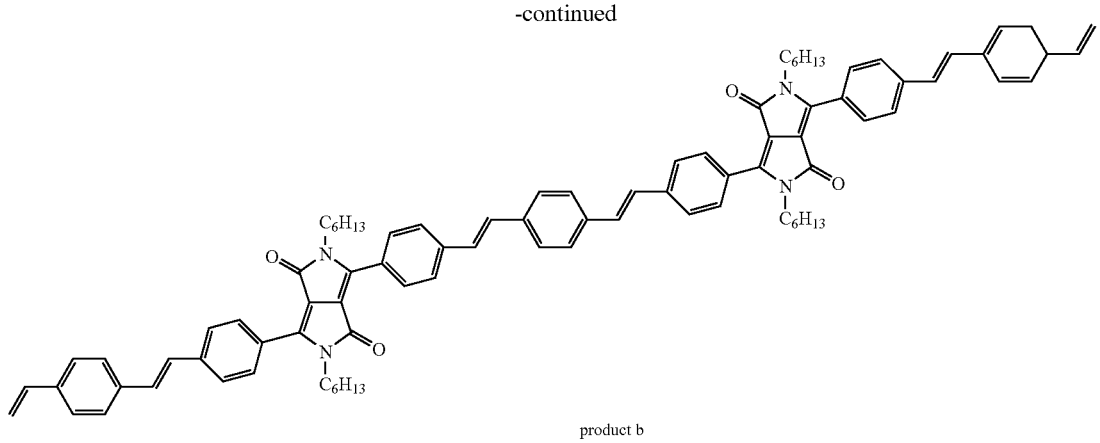

product b

A solution of 0.230 g (0.37 mmol) 1,4-dioxo-2,5-di-n-hexyl-3,6-bis(bromphenyl)pyrrolo[3,4-c]pyrrole, 0.003 g (0.02 mmol) palladium(II)acetate, 0.1 ml (0.93 mmol) triethylamine and 0.023 g (0.08 mmol) tris(o-tolyl)phosphine in 15 ml NMP are added to 0.487 g (3.74 mmol) 1,4-divinylbenzene in 5 ml NMP within 90 minutes under a nitrogen atmosphere and under vigorous stirring. Then, the reaction mixture is stirred 14 hours at room temperature and 6 hours at 80° C. 100 ml methanol are added to the mixture. The formed precipitate (product b) is filtered off and washed with 150 ml methanol. After 24 hours a low molecular weight product a precipitates in the methanol wash solution.

Yield: 0.075 g (product a); $M_w$: 860

0.076 g (product b); $M_w$: 1300

UV/Vis absorption in $CHCl_3$: 510 nm (product a)

515 nm (product b)

Fluorescence in $CHCl_3$: 569 nm (product a)

574 nm (product b)

Example 4

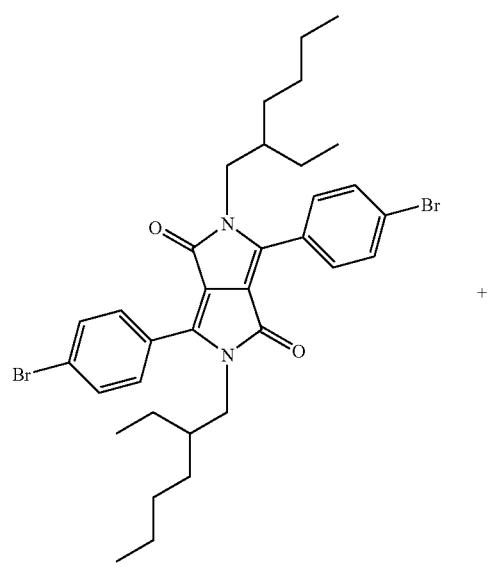

+

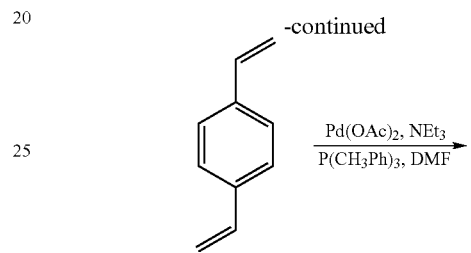

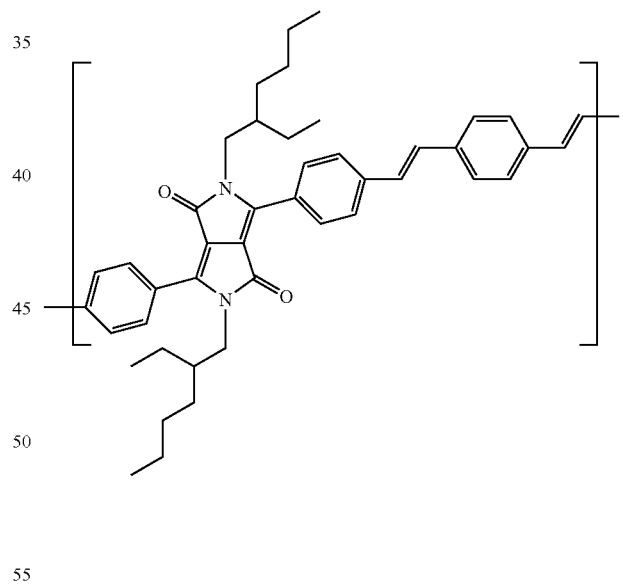

0.011 g (0.05 mmol) palladium(II)acetat and 0.078 g (0.26 mmol) tris(o-tolyl)phosphine in 10 ml dimethylformamide (DMF) are added to 0.166 g (1.28 mmol) 1,4-divinylbenzene and 0.855 g (1.28 mmol) 1,4-dioxo-2,5-di-2-ethylhexyl-3,6-bis(bromphenyl)pyrrolo[3,4-c]pyrrole under a nitrogen atmosphere and stirred at room temperature for 30 minutes. After addition of 0.45 ml (3.19 mmol) triethylamin the reaction mixture is heated to 100° C. for 51 hours. The formed polymer is precipitated by adding 100 ml methanol and filtered off. The precipitate is dissolved in chloroform and added dropwise to 500 ml ethanol. The precipitated polymer is filtered off and dried under high vacuum.

Yield: 0.724 g
$M_w$: 36000
UV/Vis absorption in $CHCl_3$: 527 nm
Fluorescence in $CHCl_3$: 647 nm Example 5

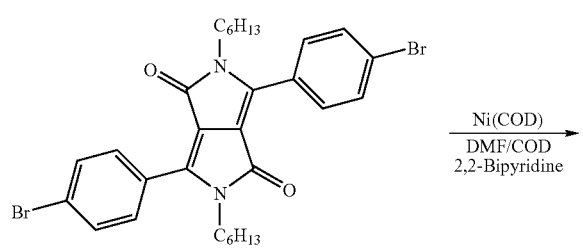 Ni(COD) / DMF/COD / 2,2-Bipyridine

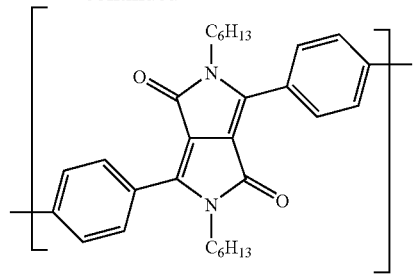

Under a nitrogen atmosphere 2.000 g (7.27 mmol) bis(1,5-cyclooctadiene)nickel(0), 1.136 g (7.27 mmol) 2,2-bipyridine and 0.7 ml (6.06 mmol) 1,5-cyclooctadiene are dissolved in 65 ml DMF. 3.722 g (6.06 mmol) 1,4-dioxo-2,5-di-n-hexyl-3,6-bis(bromphenyl)pyrrolo[3,4-c]pyrrol are added in portions to the solution within 90 minutes. The reaction mixture is stirred vigorously for 48 hours at 60° C. and is added to 500 ml methanol containing hydrochloric acid after cooling to room temperature. The formed precipitate is filtered off and washed with 500 ml methanol containing hydrochloric acid. Then the precipitate is washed with 500 ml methanol, 250 ml of an ethylenediaminetetraacetic acid (EDTA) solution (pH=3.8), 250 ml of an EDTA solution (pH=9), and 300 ml water. The obtained red-brown polymer is dried under high vacuum.

Yield: 2.714 g; $M_w$: 3100; UV/Vis absorption in $CHCl_3$: 530 nm; Fluorescence in $CHCl_3$: 631 nm Example 6

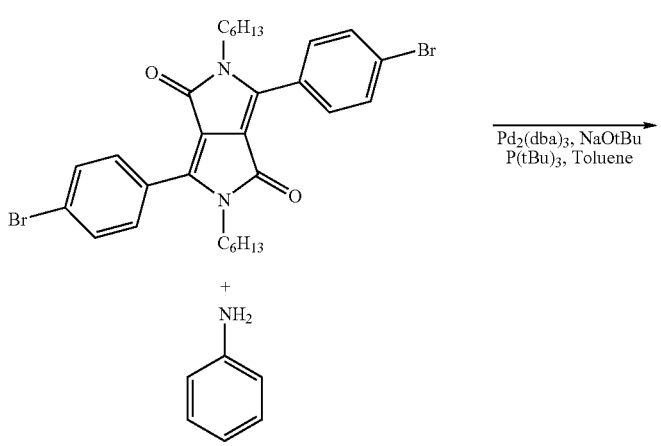 $Pd_2(dba)_3$, NaOtBu / $P(tBu)_3$, Toluene 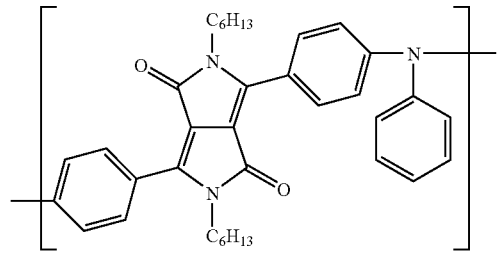

To a mixture of 0.200 g (0.32 mmol) 1,4-dioxo-2,5-dihexyl-3,6-bis(bromphenyl)pyrrolo[3,4-c]pyrrole and 0.030 g (0.32 mmol) aniline in toluene are added 0.094 g (0.97 mmol) sodium tert.-butoxide, 0.018 g (0.01 mmol) tris(dibenzylideneacetone)dipalladium(0) and 0.010 g (0.01 mmol) tri-tert-butylphosphine at room temperature. The reaction mixture is stirred at 100° C. for 48 h under a nitrogen atmosphere. After cooling to room temperature, the mixture is quenched by adding 50 ml of aqueous ammonia. Subsequently the product is extracted with chloroform and the organic fraction is concentrated. Reprecipitation from chloroform/petroleum ether (bp. 40-70° C.) afforded a dark purple powder which is filtered off and dried under vacuum.

Yield: 0.100 g; $M_w$: 2000; UV/Vis absorption in $CHCl_3$: 522 nm; Fluorescence in $CHCl_3$: 603 nm

Example 7

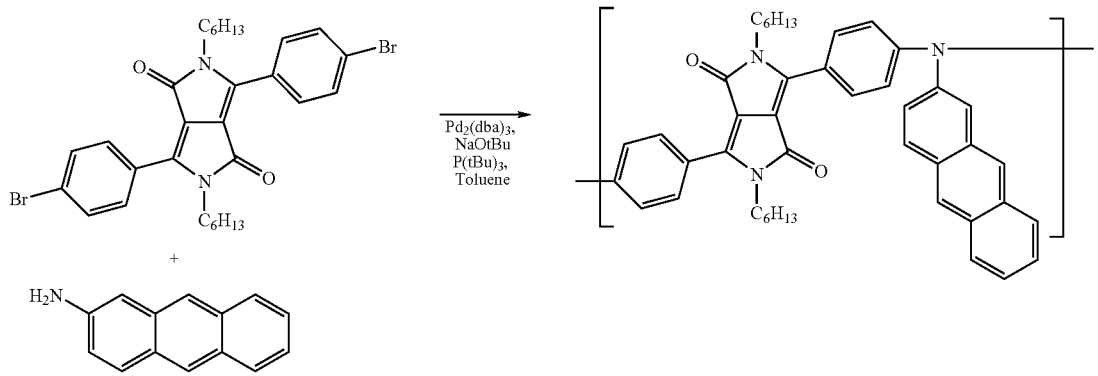

To a mixture of 0.200 g (0.32 mmol) 1,4-dioxo-2,5-dihexyl-3,6-bis(bromphenyl)pyrrolo[3,4-c]Pyrrole and 0.063 g (0.32 mmol) 2-aminoanthracene in toluene are added 0.094 g (0.97 mmol) sodium tert.butoxide, 0.060 g (0.032 mmol) tris(dibenzylideneacetone)dipalladium(0) and 0.020 g (0.01 mmol) tri-tert-butylphosphine at room temperature. The reaction mixture is stirred at 100° C. for 48 h under a nitrogen atmosphere. After cooling to room temperature, the mixture is quenched by adding 50 ml of aqueous ammonia. Subsequently the product is extracted with chloroform and the organic fraction is concentrated. Reprecipitation from chloroform/petroleum ether (bp. 40-70° C.) afforded a purple powder which is filtered off and dried under vacuum.

Yield: 0.143 g; $M_w$: 3700; UV/Vis absorption in $CHCl_3$: 543 nm; Fluorescence in $CHCl_3$: 627 nm

Example 8

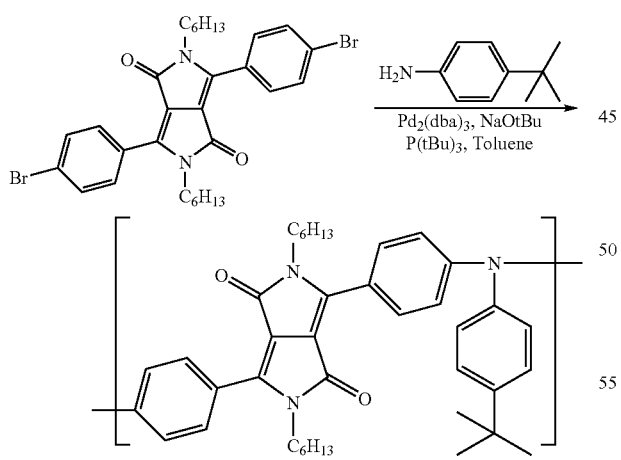

To a mixture of 0.150 g (0.25 mmol) 1,4-dioxo-2,5-dihexyl-3,6-bis(bromphenyl)pyrrolo[3,4-c]pyrrole and 0.037 g (0.25 mmol) tert.-butyl aniline in toluene are added 0.071 g (0.73 mmol) sodium tert.-butoxide, 0.045 g (0.02 mmol) tris (dibenzylideneacetone)dipalladium(0) and 0.020 g (0.10 mmol) tri-tert-butylphosphine at room temperature. The reaction mixture is stirred at 100° C. for 48 h under a nitrogen atmosphere. After cooling to room temperature, the mixture is quenched by adding 50 ml of aqueous ammonia. Subsequently the product is extracted with chloroform and the organic fraction is concentrated. Reprecipitation from chloroform/petroleum ether (bp. 40-70° C.) afforded a red powder which is filtered off and dried under vacuum.

Yield: 0.120 g; $M_w$: 2200; UV/Vis absorption in $CHCl_3$: 534 nm; Fluorescence in $CHCl_3$: 591 nm

Example 9

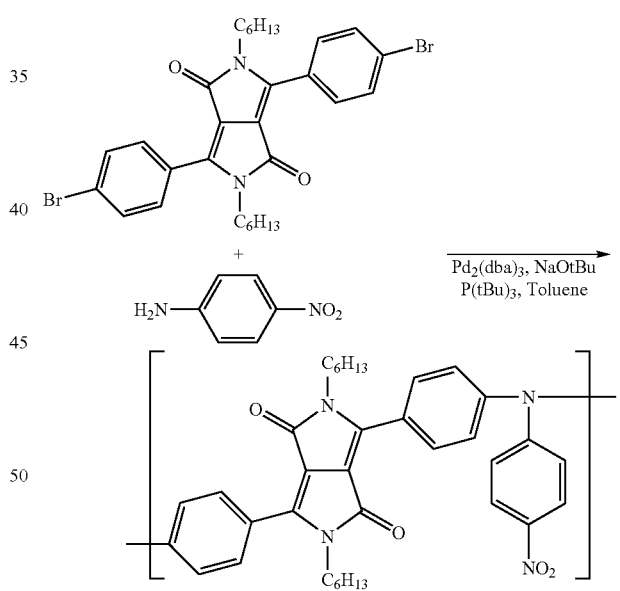

To a mixture of 0.100 g (0.16 mmol) 1,4-dioxo-2,5-dihexyl-3,6-bis(bromphenyl)pyrrolo[3,4-c]pyrrole and 0.023 g (0.16 mmol) 4-nitroaniline in toluene are added 0.047 g (0.49 mmol) sodium tert.-butoxide, 0.030 g (0.02 mmol) tris(dibenzylideneacetone)dipalladium(0) and 0.020 g (0.1 mmol) tri-tert-butylphosphine at room temperature. The reaction mixture is stirred at 100° C. for 48 h under a nitrogen atmosphere. After cooling to room temperature, the mixture is quenched by adding 50 ml of aqueous ammonia. Subsequently the product is extracted with chloroform and the organic fraction is concentrated. Reprecipitation from chloroform/petroleum ether (bp. 40-70° C.) afforded a dark purple powder which is filtered off and dried under vacuum.

Yield: 0.030 g
M$_w$: 2700
UV/Vis absorption in CHCl$_3$: 513 nm
Fluorescence in CHCl$_3$: 577 nm

Example 10

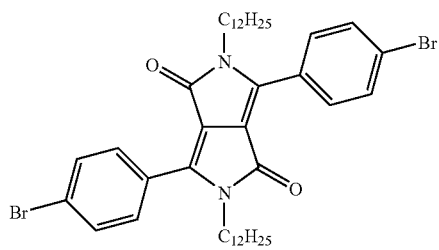

+

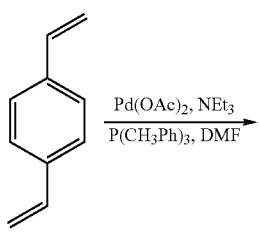

Pd(OAc)$_2$, NEt$_3$
P(CH$_3$Ph)$_3$, DMF
→

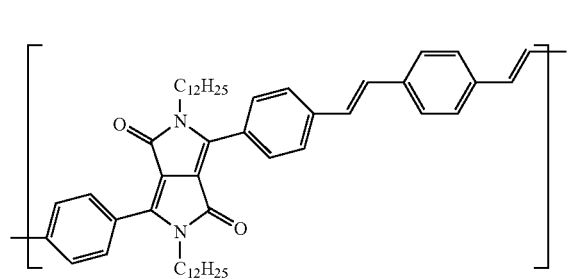

Into a microwave vial, 8.6 mg (0.038 mmol) Palladium(II) acetate, 46.7 mg (0.153 mmol) tris(o-tolyl)phosphine and 0.205 g (2.02 mmol) triethylamine in 15 ml dimethylformamide (DMF) are added to 0.100 g (0.77 mmol) 1,4-divinylbenzene and 0.601 g (1.10 mmol) 1,4-dioxo-2,5-di-n-dodecyl-3,6-bis(bromophenyl)pyrrolo[3,4-c]pyrrole under a nitrogen atmosphere. The reaction mixture is heated at 220° C. for 20 minutes in a microwave oven. The suspension is slurried in 300 ml methanol. The precipitate is filtered off and washed with methanol (100 ml). The solid was then dissolved in dichloromethane and treated with activated carbon and filtered over cellite to remove Palladium-residues. The polymer dissolved in dichloromethane precipitates by pouring the solution into 200 ml methanol, is then filtered off and dried under high vacuum.

Yield: 0.11 g
M$_w$: 36000

Example 11

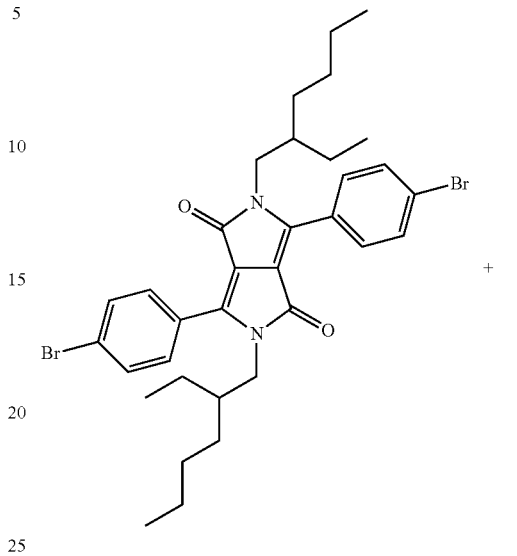

+

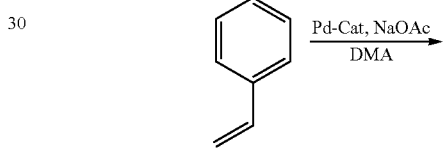

Pd-Cat, NaOAc
DMA
→

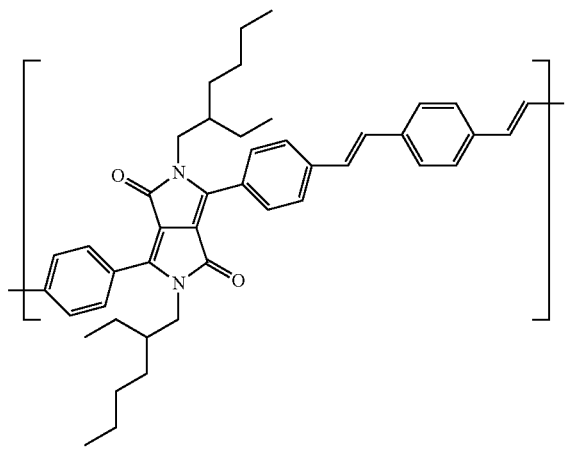

9.0 mg of the Palladium-catalyst (No. 1; described in Example 1 of WO03/13723) and 0.078 g sodium acetate in 15 ml N,N-dimethyl acetamide (DMA) are added to 0.050 g (0.38 mmol) 1,4-divinylbenzene and 0.258 g (0.38 mmol) 1,4-dioxo-2,5-di-2-ethylhexyl-3,6-bis(bromphenyl)pyrrolo[3,4-c]pyrrole under a nitrogen atmosphere and heated to 150° C. for 2.5 hours. The formed polymer is precipitated by adding 100 ml methanol, filtered and dried under high vacuum.

Yield: 0.17 g
M$_w$: 42000

Example 12

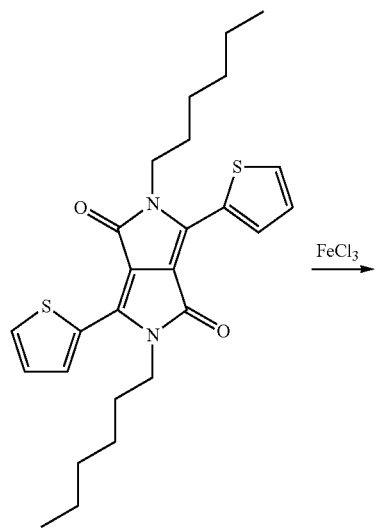

0.277 g anhydrous FeCl$_3$ are added to a solution of 1,4-dioxo-2,5-di-2-n-hexyl-3,6-bis(thiophenyl)pyrrolo[3,4-c]pyrrole in anhydrous toluene under a nitrogen atmosphere. The reaction mixture is heated 24 h at ambient temperature under a nitrogen atmosphere. The obtained deep blue solution is separated from the insoluble residue by decantation and washed with water. The organic phase is dried with magnesium sulphate. A part of the solvent is evaporated under reduced pressure and petroleum ether is added, whereby a dark blue precipitate is formed, which is filtered off and dried under high vacuum.

$M_w$: 1255
UV/Vis absorption in CHCl$_3$: 607 nm
Fluorescence in CHCl$_3$: 729 nm

The invention claimed is:

1. A polymer comprising a repeating unit of the formula (I)

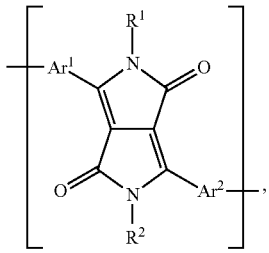

wherein
R$^1$ and R$^2$ are independently of each other a C$_1$-C$_{25}$alkyl group which can optionally be interrupted by one or more oxygen atoms, an allyl group which can optionally be substituted one to three times with C$_1$-C$_4$alkyl, a cycloalkyl group which can be optionally substituted one to three times with C$_1$-C$_8$alkyl or C$_1$-C$_8$alkoxy, a cycloalkyl group which can optionally be condensed one or two times by phenyl which phenyl can optionally be substituted one to three times with C$_1$-C$_4$-alkyl, halogen, nitro or cyano, an alkenyl group, a cycloalkenyl group, an alkynyl group; a C$_1$-C$_{25}$alkyl group, an alkenyl group or an alkynyl group substituted partially or wholly by halogen, an aldehyde group, an ester group, a carbamoyl group, a ketone group, a silyl group, a siloxanyl group, aryl, heteroaryl, a group —CR$^3$R$^4$—(CH$_2$)$_g$—aryl or a group —CR$^3$R$^4$—(CH$_2$)$_g$—heteroaryl,
wherein R$^3$ and R$^4$ independently from each other stand for hydrogen, fluorine, cyano or C$_1$-C$_4$alkyl which can be substituted by fluorine, chlorine or bromine, or phenyl which can be substituted one to three times with C$_1$-C$_4$alkyl,
and g stands for 0, 1, 2, 3 or 4,
Ar$^1$ and Ar$^2$ are independently of each other

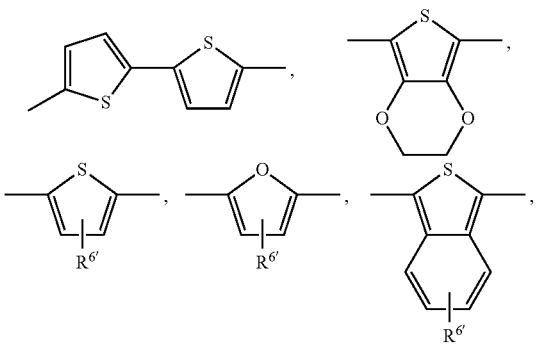

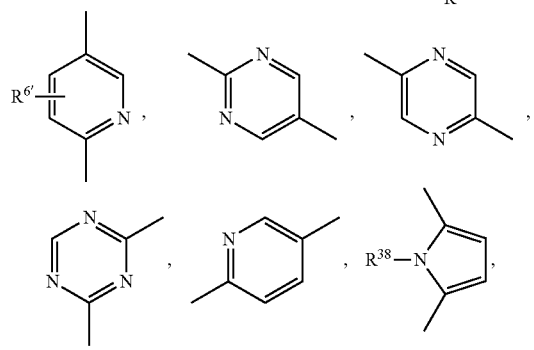

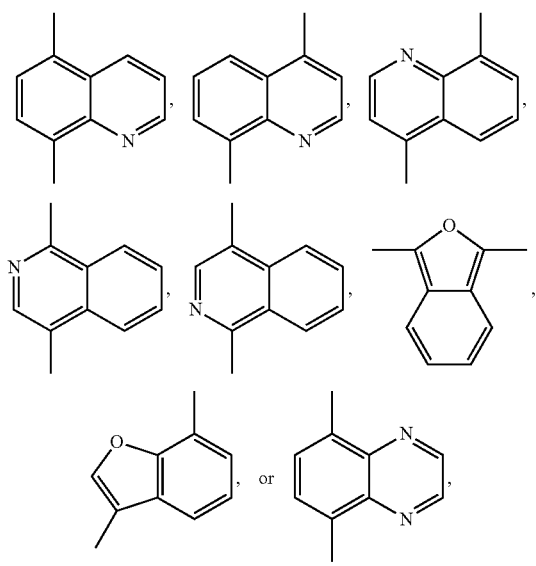

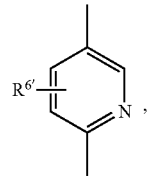

wherein R[6'] is hydrogen, $C_1$-$C_{18}$alkyl, or $C_1$-$C_{18}$alkoxy.

3. The polymer according to claim 1, wherein $R^1$ or $R^2$ as aryl is phenyl or 1- or 2-naphthyl which phenyl or 1- or 2-naphthyl can be substituted one to three times with $C_1$-$C_8$alkyl and/or $C_1$-$C_8$alkoxy, and $R^1$ or $R^2$ as a group —$CR^3R^4$—$(CH_2)_g$—aryl is group —$CR^3R^4$—$(CH_2)_g$—phenyl or a group-$CR^3R^4$—$(CH_2)_g$—1- or 2-naphthyl which phenyl or 1- or 2-naphthyl can be substituted one to three times with $C_1$-$C_8$alkyl and/or $C_1$-$C_8$alkoxy.

4. An electronic device or a component therefore, comprising the polymer comprising a repeating unit of the formula I according to claim 1.

5. An electronic device according to claim 4, wherein the device comprises an electroluminescent device.

6. An electronic device according to claim 5, wherein the electroluminescent device comprises
    (a) a charge injecting layer for injecting positive charge carriers,
    (b) a charge injecting layer for injecting negative charge carriers,
    (c) a light-emissive layer located between the layers (a) and (b) comprising the polymer comprising a repeating unit of the formula I.

7. PLEDs, organic integrated circuits (O-ICs), organic field effect transistors (OFETs), organic thin film transistors (OTFTs), organic solar cells (O-SCs), or organic laser diodes comprising one or more of the polymers according to claim 1.

8. A polymer comprising a repeating unit of formula

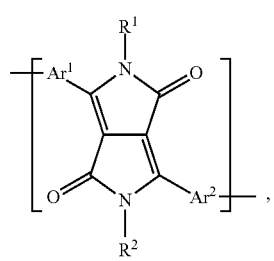

(I)

and one or more repeating unit(s) $Ar^3$, one or more repeating units -T-, or one or more repeating unit(s) $Ar^3$ and one or more repeating units -T-,
wherein
    $R^1$ and $R^2$ are independently of each other a $C_1$-$C_{25}$alkyl group which can optionally be interrupted by one or more oxygen atoms, an allyl group which can optionally be substituted one to three times with $C_1$-$C_4$alkyl, a cycloalkyl group which can be optionally substituted one to three times with $C_1$-$C_8$alkyl or $C_1$-$C_8$alkoxy, a cycloalkyl group which can optionally be condensed one or two times by phenyl which phenyl can optionally be substituted one to three times with $C_1$-$C_4$-alkyl, halogen, nitro or cyano, an alkenyl group, a cycloalkenyl group, an alkynyl group; a $C_1$-$C_{25}$alkyl group, an alkenyl group or an wherein R[6'] is hydrogen, $C_1$-$C_{18}$alkyl, or $C_1$-$C_{18}$alkoxy and $R^{38}$ stands for hydrogen, $C_6$-$C_{10}$aryl, $C_7$-$C_{12}$alkylaryl, $C_7$-$C_{12}$aralkyl, or $C_1$-$C_8$-alkyl.

2. The polymer according to claim 1, wherein the polymer is homopolymer comprising a repeating unit of formula

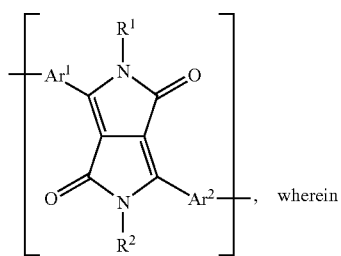

(I)

$R^1$ and $R^2$ are independently of each other a $C_1$-$C_{25}$alkyl group, which can be interrupted by one or more oxygen atoms, and
$Ar^1$ and $Ar^2$ are independently of each other a group of formula

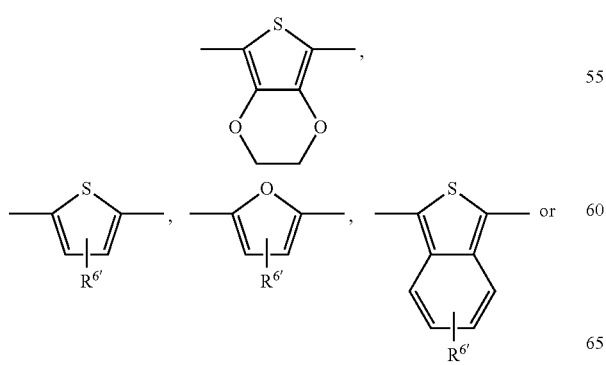

alkenyl group substituted partially or wholly by halogen, an aldehyde group, an ester group, a carbamoyl group, a ketone group, a silyl group, a siloxanyl group, aryl, heteroaryl, a group —$CR^3R^4$—$(CH_2)_g$—aryl or a group —$CR^3R^4$—$(CH_2)_g$—heteroaryl, wherein $R^3$ and $R^4$ independently from each other stand for hydrogen, fluorine, cyano or $C_1$-$C_4$alkyl which can be substituted by fluorine, chlorine or bromine, or phenyl which can be substituted one to three times with $C_1$-$C_4$alkyl, g stands for 0, 1, 2, 3 or 4, $Ar^1$ and $Ar^2$ are independently of each other

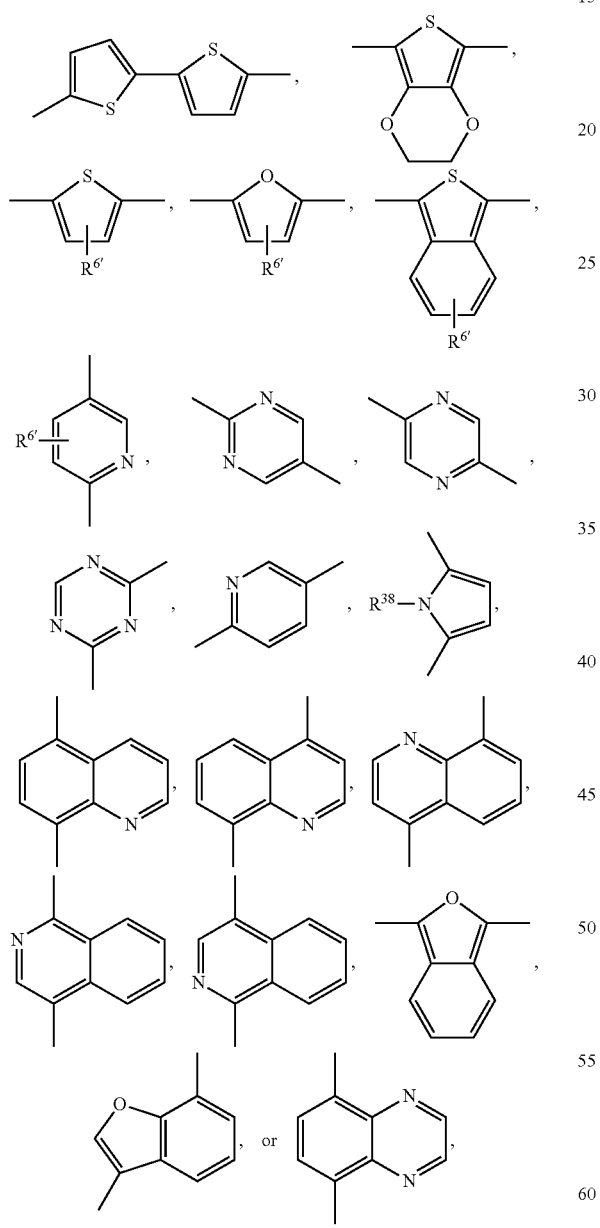

wherein $R^{6'}$ is hydrogen, $C_1$-$C_{18}$alkyl, or $C_1$-$C_{18}$alkoxy and $R^{38}$ stands for hydrogen, $C_6$-$C_{10}$aryl, $C_7$-$C_{12}$alkylaryl, $C_7$-$C_{12}$aralkyl, or $C_1$-$C_8$-alkyl which repeating unit(s)

$Ar^3$ is selected from the group consisting of

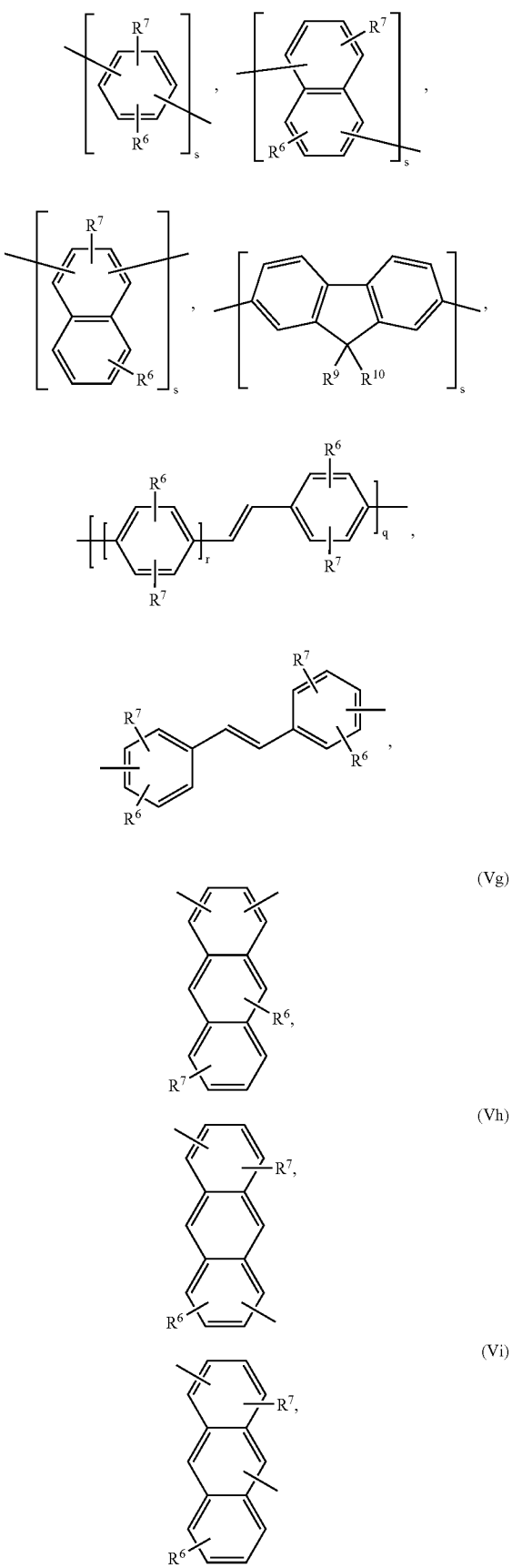

-continued

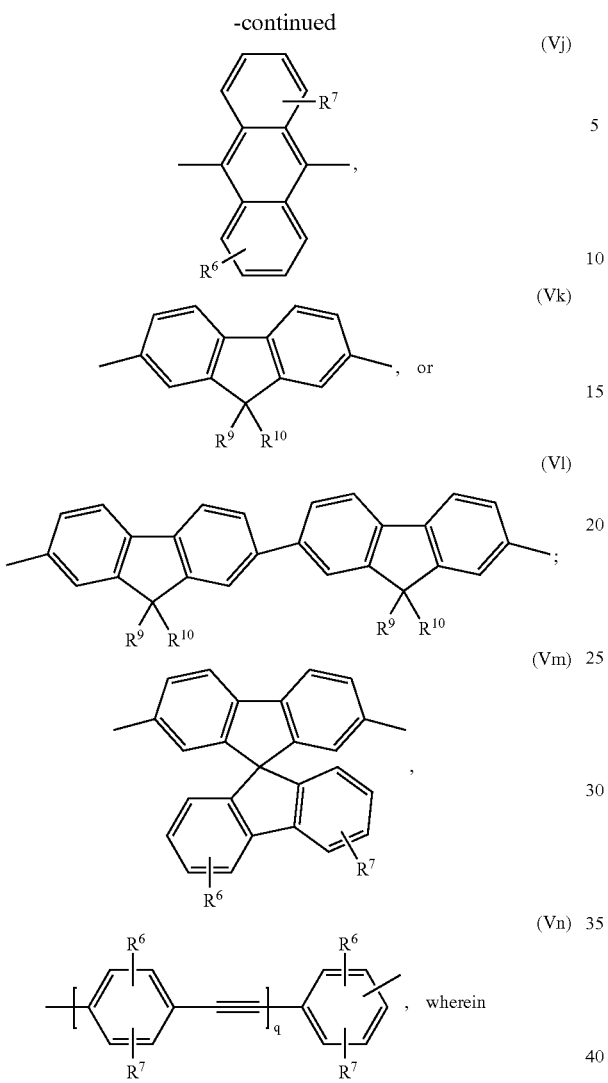

r is an integer from 1 to 10,
q is an integer from 1 to 10,
s is an integer from 1 to 10,
$R^6$ and $R^7$ are independently of each other H, halogen, —CN, $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, $C_7$-$C_{25}$aralkyl, —C(=O)—$R^{17}$, —C(=O)O$R^{17}$, or —C(=O)N$R^{17}R^{16}$,
$R^9$ and $R^{10}$ are independently of each other H, $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, or $C_7$-$C_{25}$aralkyl,
or $R^9$ and $R^{10}$ together form a group of formula =$CR^{100}R^{101}$, wherein $R^{100}$ and $R^{101}$ are independently of each other H, $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by G, or $C_2$-$C_{20}$heteroaryl, or $C_2$-$C_{20}$heteroaryl which is substituted by G, or $R^9$ and $R^{10}$ together form a five or six membered ring, which optionally can be substituted by $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, $C_7$-$C_{25}$aralkyl, or —C(=O)—$R^{17}$, and $R^{16}$ and $R^{17}$ are independently of each other H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—, D is —CO—, —COO—, —S—, —SO—, —$SO_2$—, —O—, —$NR^{65}$—, —$SiR^{70}R^{71}$—, —$POR^{72}$—, —$CR^{63}$=$CR^{64}$—, or —C≡C—, and E is —$OR^{69}$, —$SR^{69}$, —$NR^{65}R^{66}$, —$COR^{68}$, —$COOR^{67}$, —$CONR^{65}R^{66}$, —CN, —$OCOOR^{67}$, or halogen, G is E, $C_1$-$C_{18}$alkyl, $R^{63}$, $R^{64}R^{65}$ and $R^{66}$ are independently of each other H; $C_6$-$C_{18}$aryl; $C_6$-$C_{18}$aryl which is substituted by $C_1$-$C_{18}$alkyl, $C_1$-$C_{18}$alkoxy; $C_1$-$C_{18}$alkyl; or $C_1$-$C_{18}$alkyl which is interrupted by —O—; or $R^{65}$ and $R^{66}$ together form a five or six membered ring, $R^{67}$ and $R^{68}$ are independently of each other H; $C_6$-$C_{18}$aryl; $C_6$-$C_{18}$aryl which is substituted by $C_1$-$C_{18}$alkyl, or $C_1C_{18}$alkoxy; $C_1$-$C_{18}$alkyl; or $C_1$-$C_{18}$alkyl which is interrupted by —O—, $R^{69}$ is H; $C_6$-$C_{18}$aryl; $C_6$-$C_{18}$aryl, which is substituted by $C_1$-$C_{18}$alkyl, $C_1$-$C_{18}$alkoxy; $C_1$-$C_{18}$alkyl; or $C_1$-$C_{18}$alkyl which is interrupted by —O—, $R^{70}$ and $R^{71}$ are independently of each other $C_1$-$C_{18}$alkyl, $C_6$-$C_{18}$aryl, or $C_6$-$C_{18}$aryl, which is substituted by $C_1$-$C_{18}$alkyl, and $R^{72}$ is $C_1$-$C_{18}$alkyl, $C_6$-$C_{18}$aryl, or $C_6$-$C_{18}$aryl, which is substituted by $C_1$-$C_{18}$alkyl;

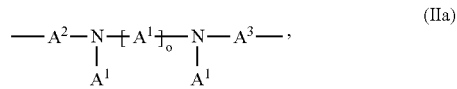

(IIa)

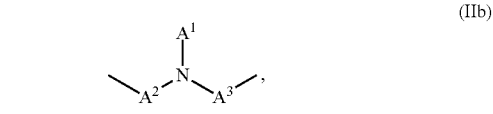

(IIb)

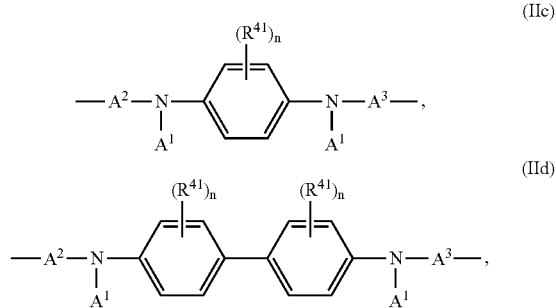

(IIc)

(IId)

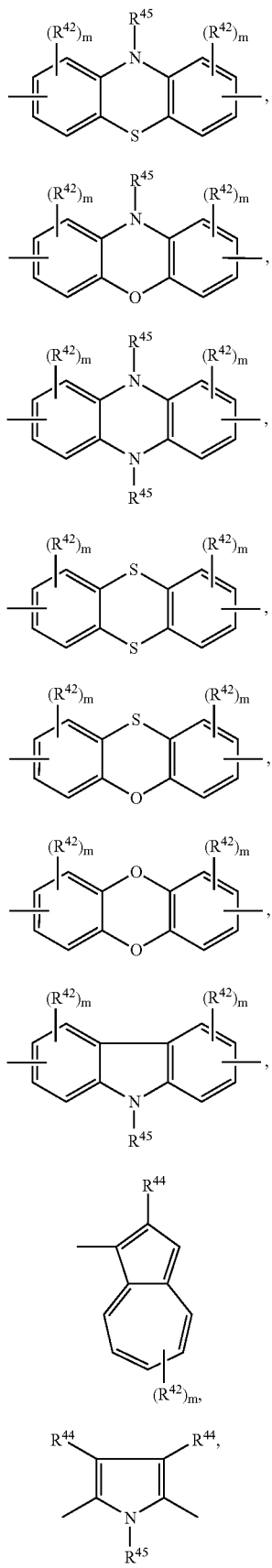

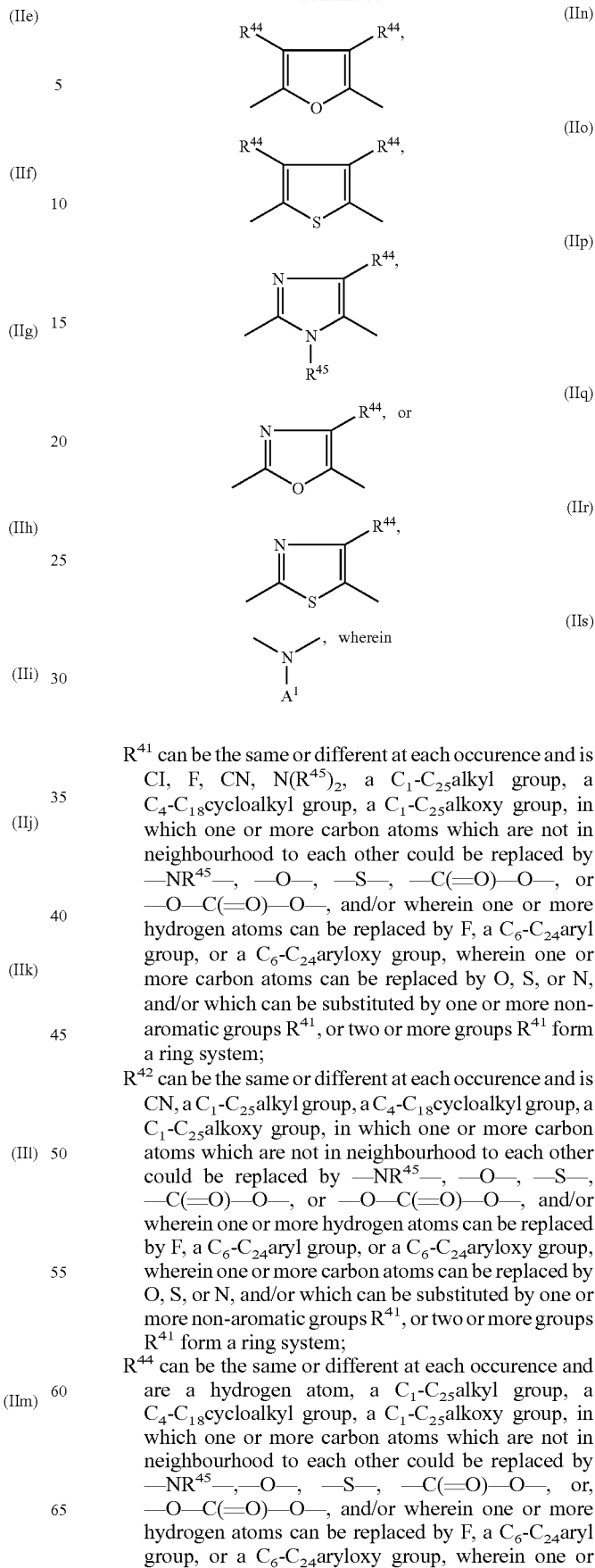

$R^{41}$ can be the same or different at each occurence and is Cl, F, CN, $N(R^{45})_2$, a $C_1$-$C_{25}$alkyl group, a $C_4$-$C_{18}$cycloalkyl group, a $C_1$-$C_{25}$alkoxy group, in which one or more carbon atoms which are not in neighbourhood to each other could be replaced by —$NR^{45}$—, —O—, —S—, —C(=O)—O—, or —O—C(=O)—O—, and/or wherein one or more hydrogen atoms can be replaced by F, a $C_6$-$C_{24}$aryl group, or a $C_6$-$C_{24}$aryloxy group, wherein one or more carbon atoms can be replaced by O, S, or N, and/or which can be substituted by one or more non-aromatic groups $R^{41}$, or two or more groups $R^{41}$ form a ring system;

$R^{42}$ can be the same or different at each occurence and is CN, a $C_1$-$C_{25}$alkyl group, a $C_4$-$C_{18}$cycloalkyl group, a $C_1$-$C_{25}$alkoxy group, in which one or more carbon atoms which are not in neighbourhood to each other could be replaced by —$NR^{45}$—, —O—, —S—, —C(=O)—O—, or —O—C(=O)—O—, and/or wherein one or more hydrogen atoms can be replaced by F, a $C_6$-$C_{24}$aryl group, or a $C_6$-$C_{24}$aryloxy group, wherein one or more carbon atoms can be replaced by O, S, or N, and/or which can be substituted by one or more non-aromatic groups $R^{41}$, or two or more groups $R^{41}$ form a ring system;

$R^{44}$ can be the same or different at each occurence and are a hydrogen atom, a $C_1$-$C_{25}$alkyl group, a $C_4$-$C_{18}$cycloalkyl group, a $C_1$-$C_{25}$alkoxy group, in which one or more carbon atoms which are not in neighbourhood to each other could be replaced by —$NR^{45}$—, —O—, —S—, —C(=O)—O—, or, —O—C(=O)—O—, and/or wherein one or more hydrogen atoms can be replaced by F, a $C_6$-$C_{24}$aryl group, or a $C_6$-$C_{24}$aryloxy group, wherein one or more carbon atoms can be replaced by O, S, or N, and/or which can be substituted by one or more non-aromatic groups $R^{41}$, or CN, or two or more groups $R^{44}$, which are in neighbourhood to each other, form a ring;

$R^{45}$ is H, a $C_1$-$C_{25}$alkyl group, a $C_4$-$C_{18}$cycloalkyl group, a $C_1$-$C_{25}$alkoxy group, in which one or more carbon atoms which are not in neighbourhood to each other could be replaced by —$NR^{45}$—, —O—, —S—, —C(=O)—O—, or, —O—C(=O)—O—, and/or wherein one or more hydrogen atoms can be replaced by F, a $C_6$-$C_{24}$aryl group, or a $C_6$-$C_{24}$aryloxy group, wherein one or more carbon atoms can be replaced by O, S, or N, and/or which can be substituted by one or more non-aromatic groups $R^{41}$;

m can be the same or different at each occurence and is 0, 1, 2, or 3, n can be the same or different at each occurence and is 0, 1, 2, or 3 o is 1, 2, or 3, and u is 1, 2, 3, or 4;

$A^1$ is a $C_6$-$C_{24}$aryl group, a $C_2$-$C_{30}$heteroaryl group, which can be substituted by one or more non-aromatic groups $R^{41}$, or $NO_2$, $A^2$ and $A^3$ are independently of each other

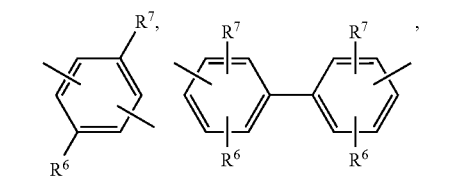

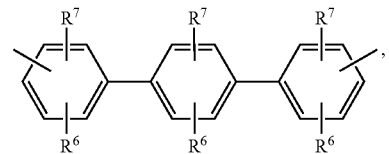

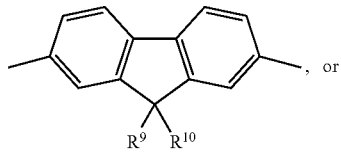

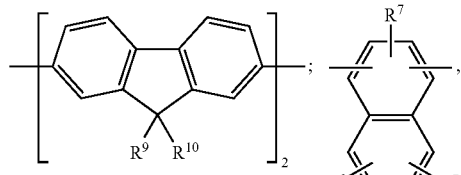

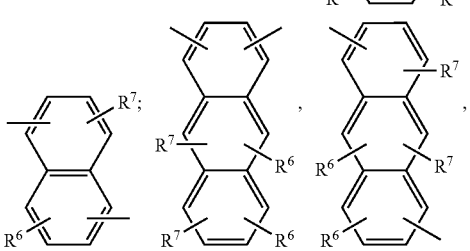

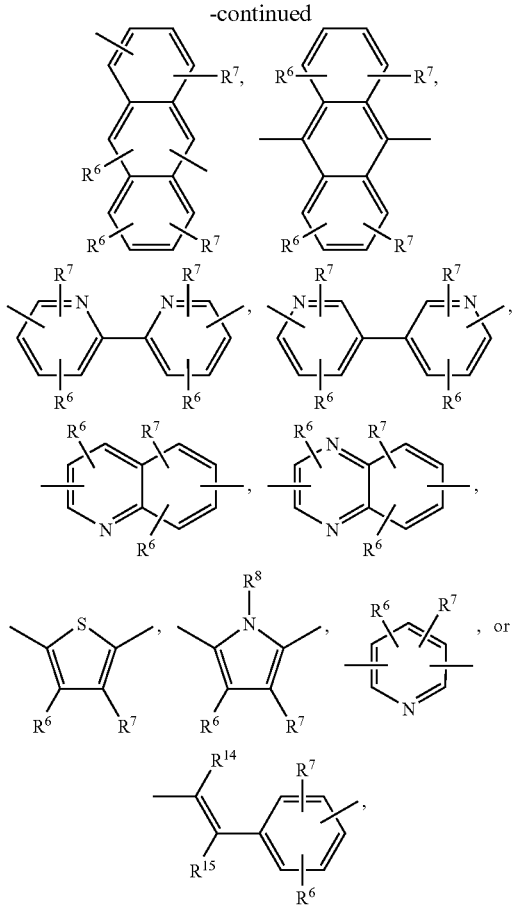

wherein $R^6$, $R^7$, $R^9$ and $R^{10}$ are as defined above, $R^8$ is H, $C_1$-$C_{18}$alkyl, $C_1$-$C_{18}$alkyl which is substituted by E and/or interrupted by D, $C_6$-$C_{24}$ aryl, or $C_7$-$C_{25}$aralkyl, $R^{14}$ and $R^{15}$ are independently of each other H, $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by E, or $C_2$-$C_{20}$heteroaryl, $C_2$-$C_{20}$heteroaryl which is substituted by E, wherein E and D are as defined above

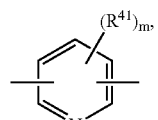 (IIIa)

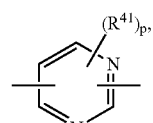 (IIIb)

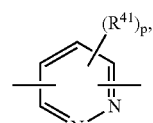 (IIIc)

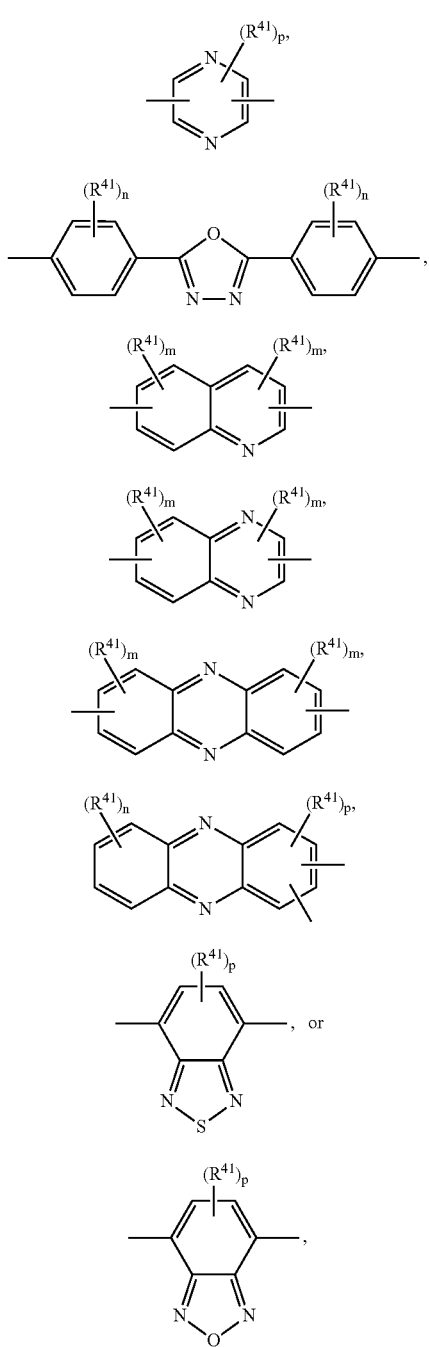
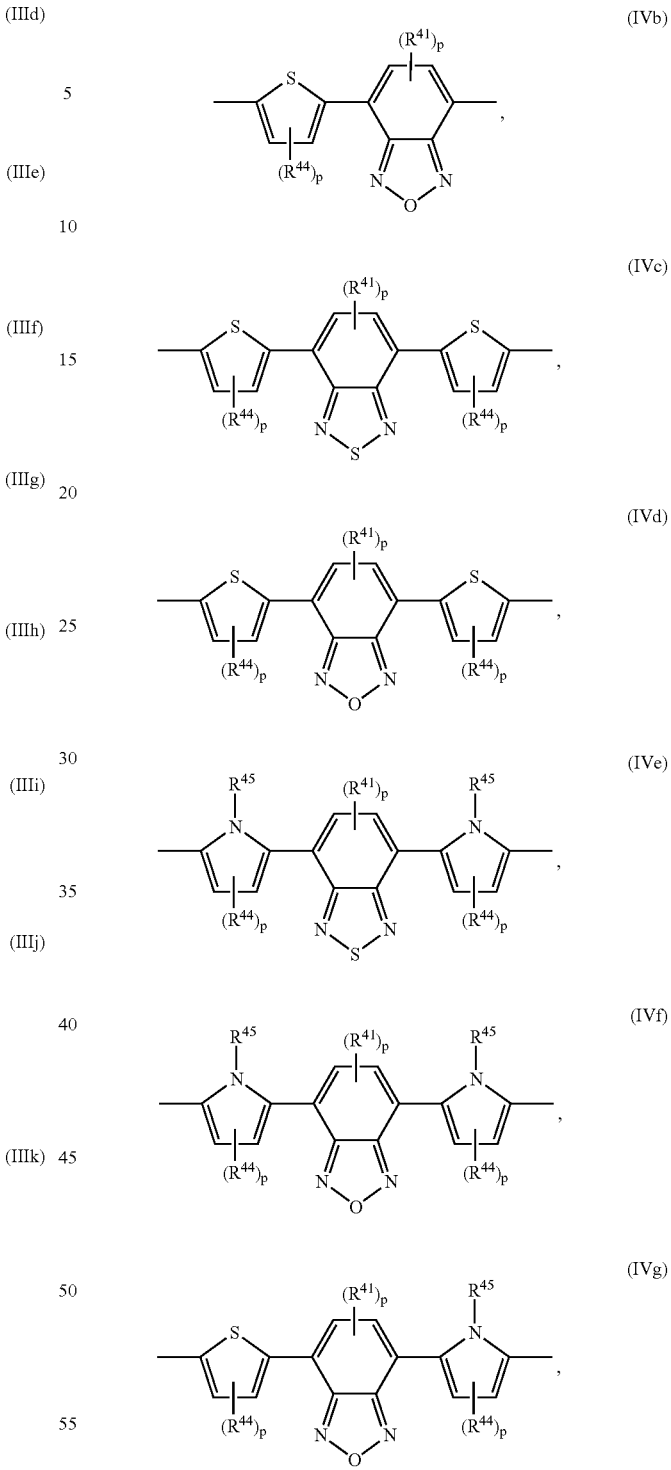
wherein $R^{41}$ and m and n are as defined above and p is 0, 1, or 2;
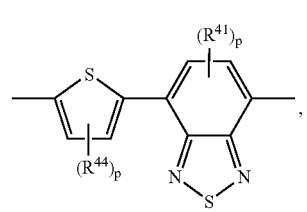
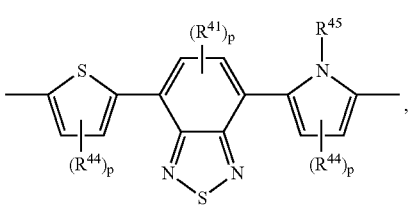

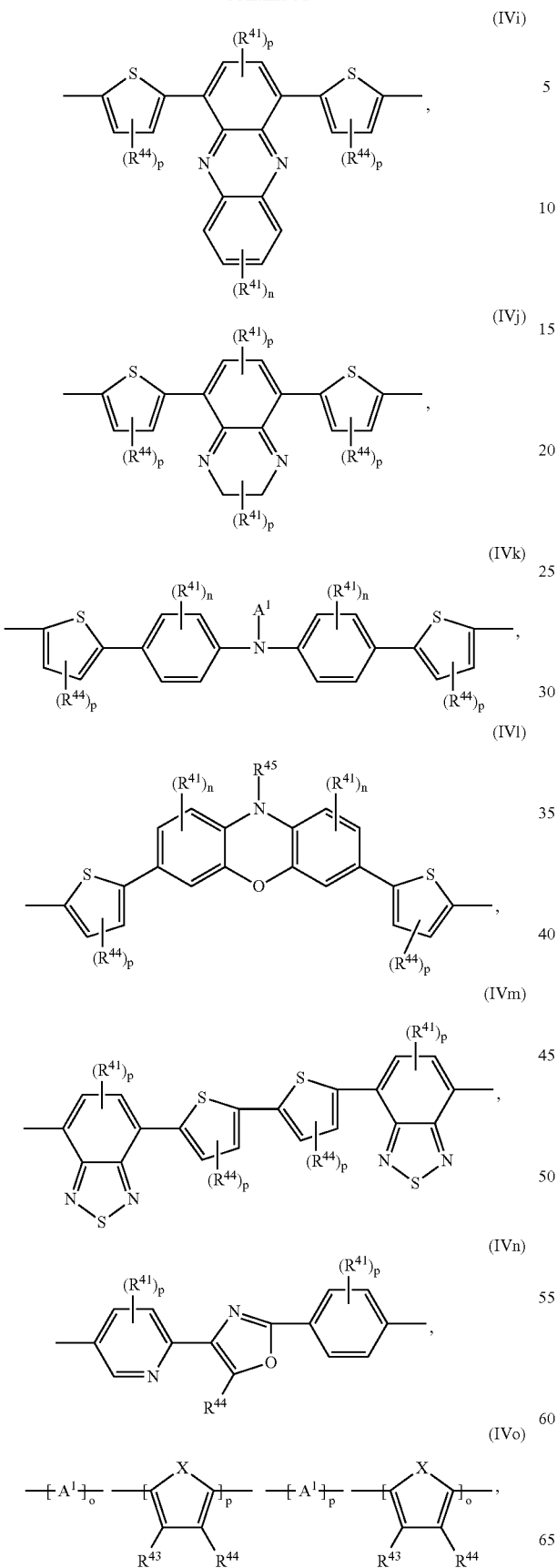

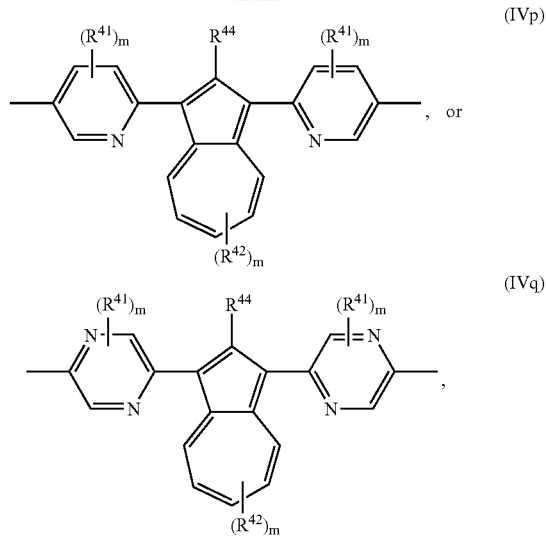

X is O, S, or NR$^{45}$,

R$^{43}$ is a hydrogen atom, a C$_1$-C$_{25}$alkyl group, a C$_4$-C$_{18}$cycloalkyl group, a C$_1$-C$_{25}$alkoxy group, in which one or more carbon atoms which are not in neighbourhood to each other could be replaced by —NR$^{45}$—, —O—, —S—, —C(=O)—O—, or, —O—C(=O)—O—, and/or wherein one or more hydrogen atoms can be replaced by F, a C$_6$-C$_{24}$aryl group, or a C$_6$-C$_{24}$aryloxy group, wherein one or more carbon atoms can be replaced by O, S, or N, and/or which can be substituted by one or more non-aromatic groups R$^{41}$, or CN, or two or more groups R$^{43}$ and/or R$^{44}$, which are in neighbourhood to each other, form a ring; and A$^1$, R$^{41}$, R$^{42}$, R$^{44}$, R$^{45}$, m, n, o and p are as defined above;

and which repeating unit(s) -T- is selected from the group consisting of

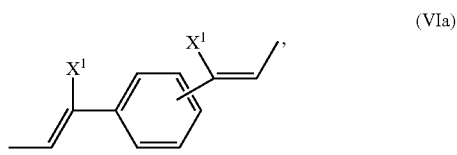

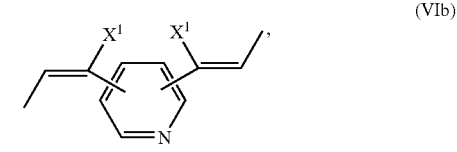

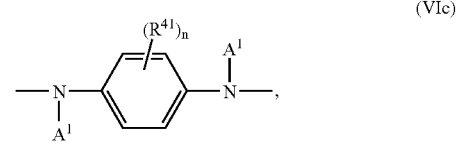

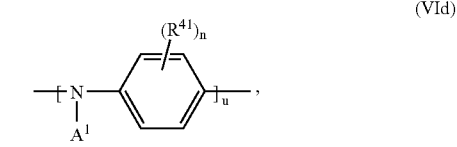

-continued

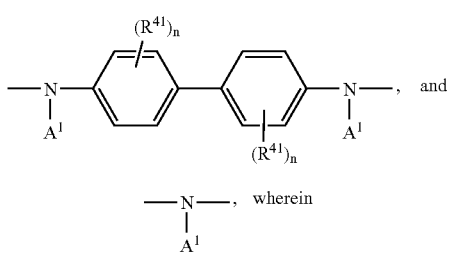

$X^1$ is a hydrogen atom, or a cyano group, $R^{41}$ can be the same or different at each occurence and is Cl, F, CN, $N(R^{45})_2$, a $C_1$-$C_{25}$alkyl group, a $C_4$-$C_{18}$cycloalkyl group, a $C_1$-$C_{25}$alkoxy group, in which one or more carbon atoms which are not in neighborhood to each other could be replaced by —$NR^{45}$—, —O—, —S—, —C(=O)—O—, or —O—C(=O)—O—, and/or wherein one or more hydrogen atoms can be replaced by F, a $C_6$-$C_{24}$aryl group, or a $C_6$-$C_{24}$aryloxy group, wherein one or more carbon atoms can be replaced by O, S, or N, and/or which can be substituted by one or more non-aromatic groups $R^{41}$, or two or more groups $R^{41}$ form a ring system;

n can be the same or different at each occurence and is 0, 1, 2, or 3 and u is 1, 2, 3, or 4;

$A^l$ is a $C_6$-$C_{24}$aryl group, a $C_2$-$C_{30}$heteroaryl group, which can be substituted by one or more non-aromatic groups $R^{41}$.

9. The polymer according to claim 8, wherein the polymer comprises a repeating unit of formula

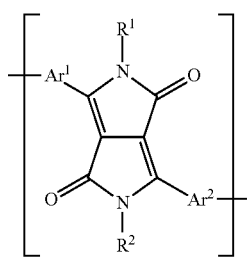

and a repeating unit

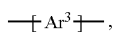

wherein
$R^1$ and $R^2$ are independently of each other a $C_1$-$C_{25}$alkyl group, which can be interrupted by one or more oxygen atoms, and $Ar^1$ and $Ar^2$ are independently of each other a group of formula

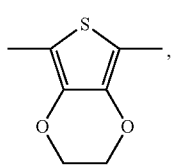

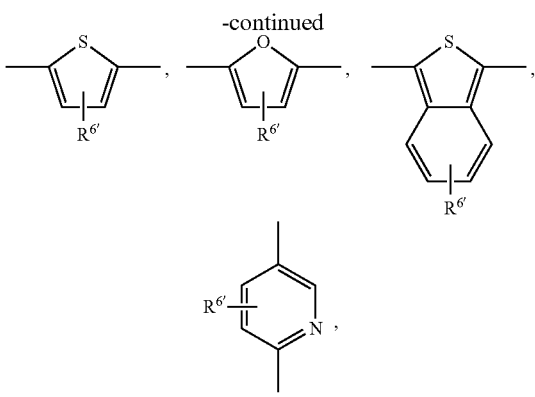

wherein $R^{6'}$ is hydrogen, $C_1$-$C_{18}$alkoxy and
wherein —$Ar^3$— is a group of formula

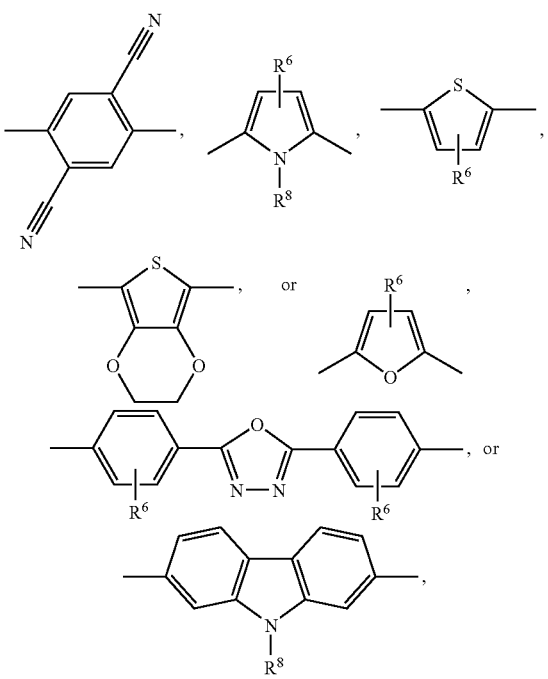

wherein
$R^6$ is hydrogen, $C_1$-$C_{18}$alkyl, or $C_1$-$C_{18}$alkoxy, and $R^{32}$ is methyl, Cl, or OMe, and
$R^8$ is H, $C_1$-$C_{18}$alkyl, or $C_1$-$C_{18}$alkyl which is substituted by E and/or interrupted by D, especially $C_1$-$C_{18}$alkyl which is interrupted by —O—,
wherein
D is —CO—, —COO—, —S—, —SO—, —SO$_2$—, —O—, —$NR^{65}$—, —$SiR^{70}R^{71}$—, —$POR^{72}$—, —$CR^{63}$=$CR^{64}$—, or —C≡C—, and
E is —$OR^{69}$, —$SR^{69}$, —$NR^{65}R^{66}$, —$COR^{68}$, —$COOR^{67}$, —$CONR^{65}R^{66}$, —CN, —$OCOOR^{67}$, or halogen,
$R^{63}$, $R^{64}$, $R^{65}$ and $R^{66}$ are independently of each other H; $C_6$-$C_{18}$aryl; $C_6$-$C_{18}$aryl which is substituted by $C_1$-$C_{18}$alkyl, $C_1$-$C_{18}$alkoxy; $C_1$-$C_{18}$alkyl; or $C_1$-$C_{18}$alkyl which is interrupted by —O—; or
$R^{65}$ and $R^{66}$ together form a five or six membered ring,
$R^{67}$ and $R^{68}$ are independently of each other H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—, $R^{69}$ is H; $C_6$-$C_{18}$aryl; $C_6$-$C_{18}$aryl, which is substituted by $C_1$-$C_{18}$alkyl, $C_1$-$C_{18}$alkoxy; $C_1$-$C_{18}$alkyl; or $C_1$-$C_{18}$alkyl which is interrupted by —O—, $R^{70}$ and $R^{71}$ are independently of each other $C_1$-$C_{18}$alkyl, $C_6$-$C_{18}$aryl, or $C_6$-$C_{18}$aryl, which is substituted by $C_1$-$C_{18}$alkyl, and $R^{72}$ is $C_1$-$C_{18}$alkyl, $C_6$-$C_{18}$aryl, or $C_6$-$C_{18}$aryl, which is substituted by $C_1$-$C_{18}$alkyl.

10. The polymer according to claim 8, wherein the polymer is a polymer of formula

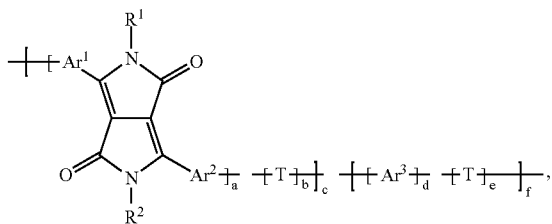
(VII)

T is selected from the group consisting of

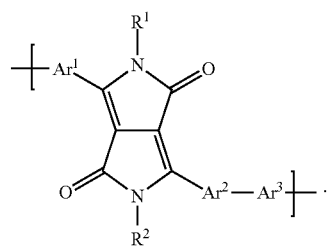
(VIa)

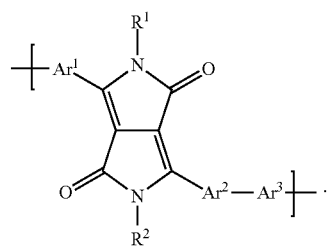
(VIb)

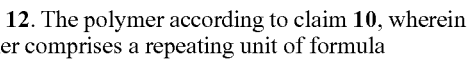
(VIc)

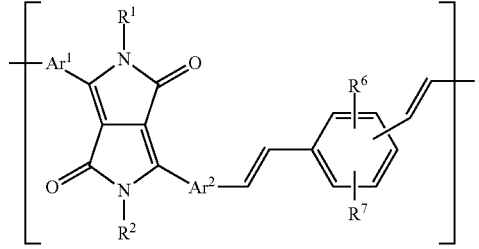
(VId)

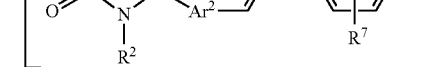
(VIe)

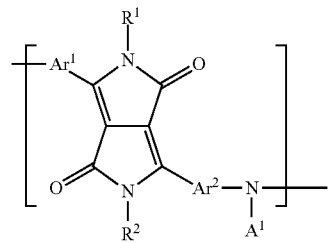
(VIf)

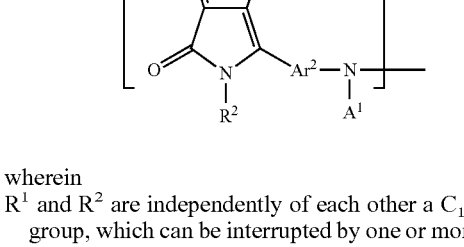

$X^1$ is a hydrogen atom, or a cyano group, $R^{41}$ can be the same or different at each occurence and is Cl, F, CN, $N(R^{45})_2$, a $C_1$-$C_{25}$alkyl group, a $C_4$-$C_{18}$cycloalkyl group, a $C_1$-$C_{25}$alkoxy group, in which one or more carbon atoms which are not in neighborhood to each other could be replaced by —$NR^{45}$—, —O—, —S—, —C(=O)—O—, or —O—C(=O)—O—, and/or wherein one or more hydrogen atoms can be replaced by F, a $C_6$-$C_{24}$aryl group, or a $C_6$-$C_{24}$aryloxy group, wherein one or more carbon atoms can be replaced by O, S, or N, and/or which can be substituted by one or more non-aromatic groups $R^{41}$, or two or more groups $R^{41}$ form a ring system;

n can be the same or different at each occurence and is 0, 1, 2, or 3 and u is 1, 2, 3, or 4;

$A^1$ is a $C_6$-$C_{24}$aryl group, a $C_2$-$C_{30}$heteroaryl group, which can be substituted by one or more non-aromatic groups $R^{41}$, a is 1,
b is 0, or 1,
c is 0.005 to 1,
d is 0, or 1,
e is 0, or 1, wherein e is not 1, if d is 0,
f is 0.995 to 0, wherein the sum of c and f is 1.

11. The polymer according to claim 10, wherein the polymer is a homopolymer comprising a repeating unit of formula

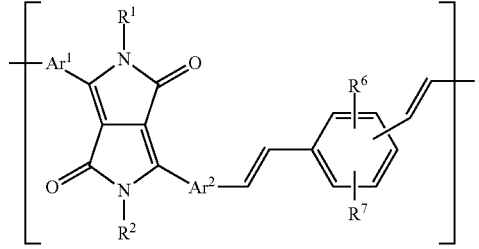

12. The polymer according to claim 10, wherein the polymer comprises a repeating unit of formula

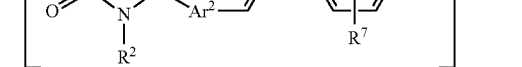

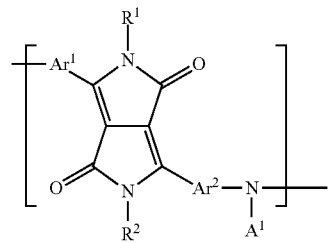

wherein
$R^1$ and $R^2$ are independently of each other a $C_1$-$C_{25}$alkyl group, which can be interrupted by one or more oxygen atoms, $R^6$ and $R^7$ are H, halogen, CN, $C_1$-$C_{12}$alkyl, $C_1$-$C_{12}$alkoxy, or $C_6$-$C_{14}$aryl, $A^1$ is a $C_6$-$C_{24}$aryl group, a $C_2$-$C_{30}$heteroaryl group, which can be substituted by one or more non-aromatic groups $R^{41}$, or $NO_2$, and Ar¹ and Ar² are independently of each other a group of formula,

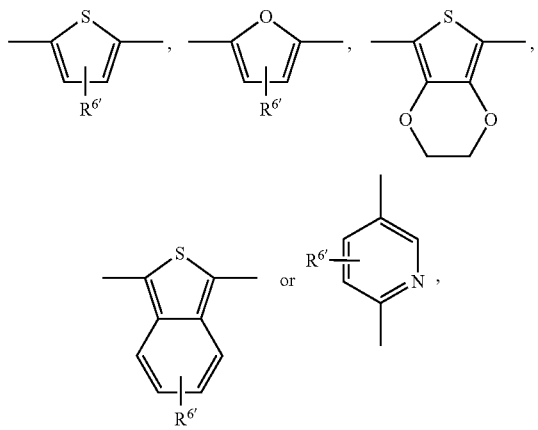

wherein R⁶' is hydrogen, $C_1$-$C_{18}$alkyl, or $C_1C_{18}$alkoxy.

13. The polymer according to claim 8, wherein the polymer comprises a repeating unit of formula

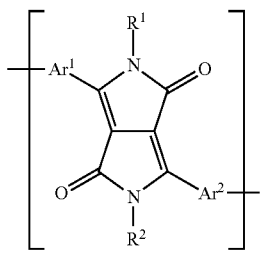

and a repeating unit -T-.

14. A terpolymer comprising a repeating unit of formula

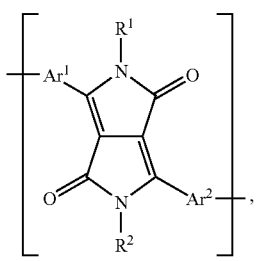 (I)

a repeating unit of formula

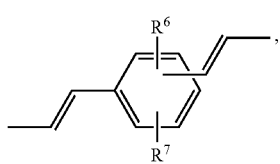, and a repeating unit of formula

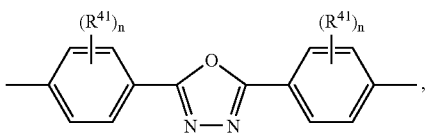, wherein
R¹ and R² are independently of each other a $C_1$-$C_{25}$alkyl group, which can be interrupted by one or more oxygen atoms, and Ar¹ and Ar² are independently of each other a group of formula

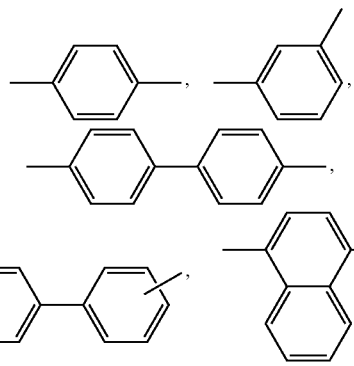

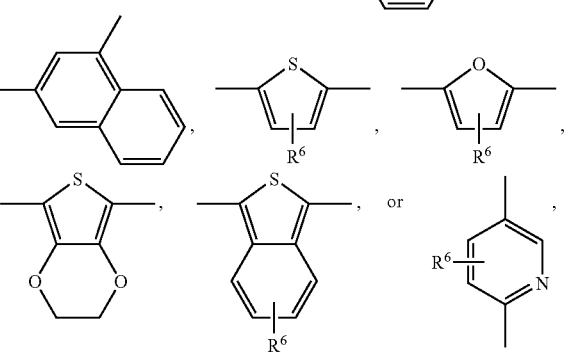

$R^6$ and $R^7$ are independently of each other H, halogen, CN, $C_1$-$C_{12}$alkyl, $C_1$-$C_{12}$alkoxy, or $C_6$-$C_{14}$aryl,
$R^{41}$ is Cl, F, CN, $N(R^{45})_2$, $C_1$-$C_{18}$alkyl, $C_1$-$C_{18}$alkoxy, or $C_6$-$C_{14}$aryl, wherein
$R^{45}$ is H, a $C_1$-$C_{25}$alkyl group, or a $C_1$-$C_{25}$alkoxy group, and
n is 0, 1, or 2.

15. An electronic device or a component therefore comprising the polymer according to claim 14.

16. A polymer comprising a repeating unit of the formula

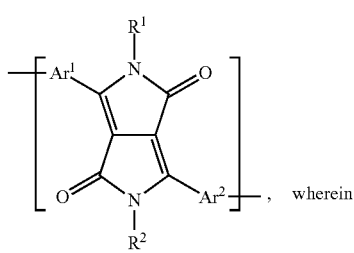, wherein (I)

$Ar^1$ and $Ar^2$ are independently of each other

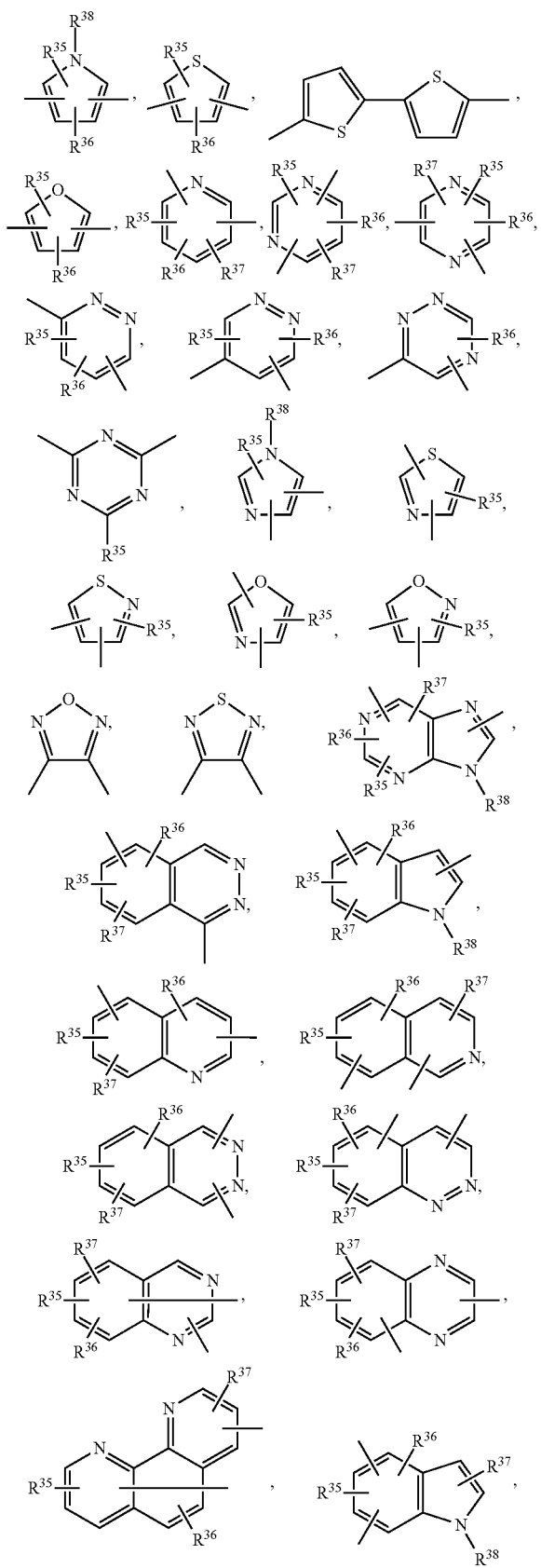

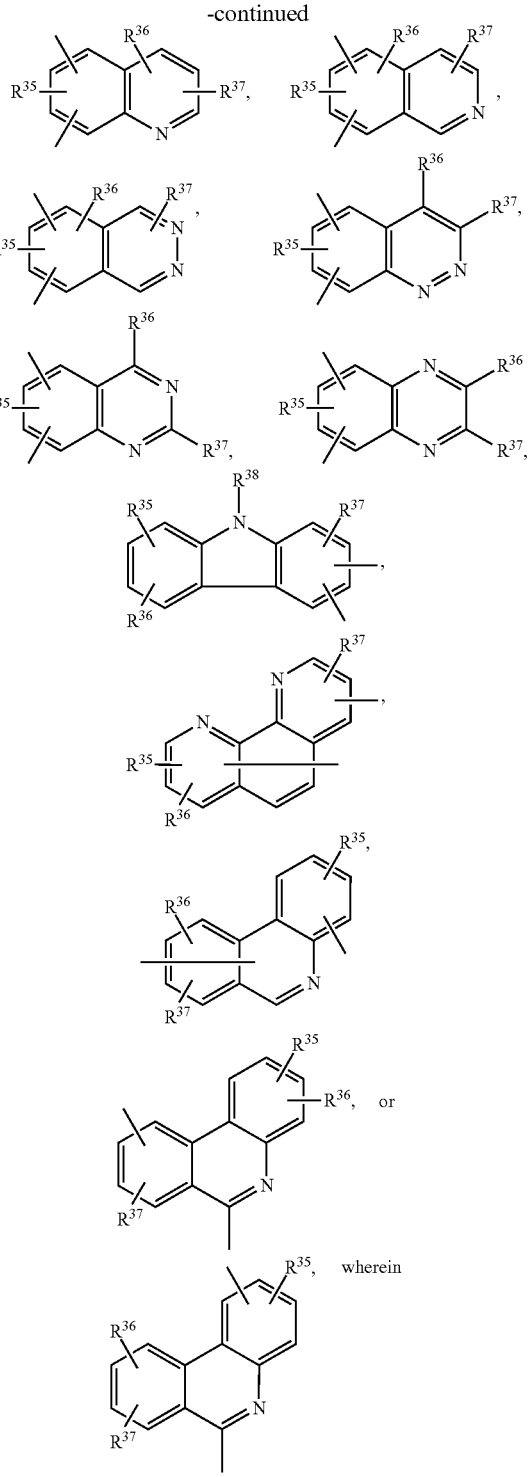

$R^{35}$, $R^{36}$, and $R^{37}$ may be the same or different and are selected from a hydrogen atom, a $C_1$-$C_{25}$alkyl group which may optionally be interrupted by one or more oxygen atoms, a cycloalkyl group, an aralkyl group, an alkenyl group, a cycloalkenyl group, an alkynyl group, a hydroxyl group, a mercapto group, an alkoxy group, an alkylthio group, an aryl ether group, an aryl thioether group, an aryl group, a heterocyclic group, a halogen atom, a haloalkyl group, a haloalkenyl group, a haloalkynyl group, a cyano group, an aldehyde group, a carboxyl group, an ester group, a carbamoyl group, an amino group, a nitro group, a silyl group, a siloxanyl group, a substituted or unsubstituted vinyl group, an alkylamino group, an dialkylamino group, an alkylarylamino group, an arylamino group and a diarylamino group, or at least two adjacent substituents $R^5$ to $R^7$ form an aromatic or aliphatic fused ring system, $R^{38}$ is a hydrogen atom, a $C_1$-$C_{25}$alkyl group, a cycloalkyl group, an aralkyl group, an aryl group, or a heterocyclic group, $R^1$ and $R^2$ are independently of each other a $C_1$-$C_{25}$alkyl group which can optionally be interrupted by one or more oxygen atoms, an allyl group which can optionally be substituted one to three times with $C_1$-$C_4$alkyl, a cycloalkyl group which can be optionally substituted one to three times with $C_1$-$C_8$alkyl or $C_1$-$C_8$alkoxy, a cycloalkyl group which can optionally be condensed one or two times by phenyl which phenyl can optionally be substituted one to three times with $C_1$-$C_4$-alkyl, halogen, nitro or cyano, an alkenyl group, a cycloalkenyl group, an alkynyl group; a $C_1$-$C_{25}$alkyl group, an alkenyl group or an alkynyl group substituted partially or wholly by halogen, an aldehyde group, an ester group, a carbamoyl group, a ketone group, a silyl group, a siloxanyl group, aryl, heteroaryl, a group —$CR^3R^4$—$(CH_2)_g$— aryl or a group —$CR^3R^4$—$(CH_2)_g$— heteroaryl, wherein $R^3$ and $R^4$ independently from each other stand for hydrogen, fluorine, cyano or $C_1$-$C_4$alkyl which can be substituted by fluorine, chlorine or bromine, or phenyl which can be substituted one to three times with $C_1$-$C_4$alkyl, and g stands for 0, 1, 2, 3 or 4.

17. An electronic device or a component therefore comprising the polymer according to claim 16.

* * * * *